(12) United States Patent
Levon et al.

(10) Patent No.: US 8,840,771 B2
(45) Date of Patent: Sep. 23, 2014

(54) ELECTROCHEMICAL METHOD FOR DEPOSITING NANOFIBRILAR POLY(3,4-ETHYLENEDIOXYTHIOPHENE) (PEDOT) HOLE EXTRACTION LAYER IN ORGANIC SOLAR CELLS

(75) Inventors: Kalle Levon, Brooklyn, NY (US); Eduard Nasybulin, Staten Island, NY (US); Shu Wei, Brooklyn, NY (US); Ian Albuquerque, Brooklyn, NY (US)

(73) Assignee: New York University, Brooklyn, NY (US)

( * ) Notice: Subject to any disclaimer, the term of this patent is extended or adjusted under 35 U.S.C. 154(b) by 409 days.

(21) Appl. No.: 13/097,990

(22) Filed: Apr. 29, 2011

(65) Prior Publication Data

US 2011/0290315 A1   Dec. 1, 2011

Related U.S. Application Data

(60) Provisional application No. 61/329,585, filed on Apr. 30, 2010.

(51) Int. Cl.
| | | |
|---|---|---|
| *C25D 9/02* | (2006.01) | |
| *B82Y 10/00* | (2011.01) | |
| *H01L 51/00* | (2006.01) | |
| *H01L 51/42* | (2006.01) | |

(52) U.S. Cl.
CPC ......... *H01L 51/0037* (2013.01); *H01L 51/0047* (2013.01); *C25D 9/02* (2013.01); *H01L 51/4253* (2013.01); *Y02E 10/549* (2013.01); *B82Y 10/00* (2013.01)
USPC .......................................... 205/317; 205/419

(58) Field of Classification Search
USPC .......................................... 205/317, 414, 419
See application file for complete search history.

(56) References Cited

U.S. PATENT DOCUMENTS

| | | | | |
|---|---|---|---|---|
| 6,680,215 | B2 * | 1/2004 | Stupp et al. | 438/30 |
| 2006/0216610 | A1 * | 9/2006 | Galvin et al. | 429/315 |

OTHER PUBLICATIONS

Sarah A. Spanninga et al, Effect of Anionic Hydration on Counterion Incorporation in Poly(3,4-ethylenedioxythiophene): An X-ray Photoelectron Spectroscopy Study, J. Phys. Chem. C, 2010, 114, pp. 14998-15004.*

Elena Poverenov et al, Major Effect of Electropolymerization Solvent on Morphology and Electrochromic Properties of PEDOT Films, Chem. Mater., 2010, 22, pp. 4019-4025.*

E. Tamburri et al, "Growth mechanisms, morphology, and electroactivity of PEDOT layers produced by electrochemical routes in aqueous medium", Synthetic Metals 159 (2009) pp. 406-414.*

Y. Wen et al, "Electrochemical polymerization of 3,4-ethylenedioxythiophene in aqueous micellar solution containing biocompatible amino acid-based surfactant", Journal of Electroanalytical Chemistry 634 (2009) pp. 49-58.*

* cited by examiner

*Primary Examiner* — James Lin
*Assistant Examiner* — William Leader
(74) *Attorney, Agent, or Firm* — Laurence P. Colton; Smith Risley Tempel Santos LLC

(57) ABSTRACT

An electrochemical method for producing a hole extraction layer in a solar cell based on organic semiconductor materials. Conjugated polymers are used to build a hole extraction layer and a photoactive layer. Poly(3,4-ethylenedioxythiophene) (PEDOT) is used as a hole extraction layer and is deposited electrochemically from an aqueous solution on an indium tin oxide (ITO) electrode. A nanofibrilar or nanogranular morphology of the PEDOT is achieved by carrying out the polymerization in the presence of a surfactant. A photoactive layer of poly(3-hexylthiophene)/[6,6]-phenyl-$C_{61}$-butyric acid methyl ester (P3HT/PCBM) can be deposited by spin-coating technique on top of the PEDOT layer.

12 Claims, 62 Drawing Sheets

US 8,840,771 B2

ELECTROCHEMICAL METHOD FOR DEPOSITING NANOFIBRILAR POLY(3,4-ETHYLENEDIOXYTHIOPHENE) (PEDOT) HOLE EXTRACTION LAYER IN ORGANIC SOLAR CELLS

STATEMENT OF RELATED APPLICATIONS

This application claims the benefit of U.S. Provisional Patent Application No. 61/329,585 filed on 30 Apr. 2010, which is incorporated herein in its entirety by this reference.

BACKGROUND OF THE INVENTION

1. Field of the Invention

The invention is generally related to the field of the production of an organic photovoltaic device (OPVd), a solar cell based on conjugated semiconducting polymers, and more specifically to the field of electrochemical methods for the deposition of hole extraction layers and the usage of the layers in the construction of solar cells.

2. Prior Art

Solar cells convert the energy of sunlight directly into electricity by the photovoltaic effect. Solar cells are made from semiconductor materials that can be either inorganic or organic compounds. The first generation of solar cells is based on crystalline silicon. Silicon is doped by introducing other chemical elements to form n- and p-conducting layers. As a result of light absorption charge separation happens on the interphase. Electrons travel through the n-conducting layer and positively charged holes through the p-conducting layer creating current in an external circuit. Crystalline silicon is produced by energy and time consuming melting techniques such as the Czochralski method, which is the main reason for the high price of crystalline silicon solar cells.

The second generation of solar cells is thin-film solar cells. The semiconducting materials used to fabricate thin-film solar cells are low-cost amorphous silicon, cadmium telluride, copper indium gallium diselenide, and other inorganic semiconductors. Thin photoactive layers are deposited either by vapor deposition or printing methods. This decreases coast of manufacturing from about US$5.00 per watt down to about US$2.00 per watt, and also brings lightness and some flexibility. However, the efficiency drops greatly, especially for amorphous silicon, and usually does not exceed 10%.

The third generation of solar cells is based on organic semiconducting materials. Organic semiconductors, both low molecular weight compounds and conjugated polymers, are used to make extremely thin and even semitransparent solar cells with the thickness of photoactive layers as low as 300 nm. Organic photovoltaic devices (OPVd) are by far lighter, more flexible and cheaper than any other solar cells. Hole extraction and photoactive layers in OPVd are currently deposited either by solution processing techniques, like spin-coating and doctor blade, or by inkjet printing.

Poly(3,4-ethylenedioxythiophene) (PEDOT) has been studied intensively for the past two decades due to high conductivity and excellent stability. PEDOT has found many applications in antistatic coatings, sensors, organic light-emitting diodes, electrochromic windows, etc. In the doped state PEDOT has good transparency in the UV-vis region, helping its adoption as the most widely used hole-extracting material in organic photovoltaics (OPV).

PEDOT was first synthesized by scientists from Bayer AG Laboratories in the late 1980s. Chemical polymerization of 3,4-ethylenedioxythiophene (EDOT) was done by Jonas et al., and the commercial name Baytron was given to PEDOT. PEDOT layers showed exceptional stability and transparency in doped oxidized state as well as high conductivity up to 300 S/cm. In 1991, the solubility problem was overcome by polymerizing EDOT in the presence of polystyrenesulfonate (PSS). Polymerization was done in an aqueous solution resulting in the water-soluble PEDOT:PSS complex (Baytron P, where P stands for polymer). This stimulated tremendous research activity and a wide variety of PEDOT applications in organic electronics.

The electrochemical polymerization of PEDOT was first performed by Dietrich and Heinze4 and has been attracting research interest as an alternative method to solution casting techniques. The mesomeric effect (+M) of oxygen atoms stabilizes cations during polymerization and thus decreases oxidative potential down to 1.25 V vs SHE from 1.95 V for unsubstituted thiophene. This allows electrochemical deposition from aqueous solution. EDOT itself has low solubility in water but can be solubilized and polymerized in the presence of amphiphilic molecules such as sodium dodecyl sulfate, PSS, dodecylbenzenesulfonic acid, cyclodextrin, and others. However, in this case an electrodeposited layer is contaminated with surfactants reducing conductivity and limiting applications where high hole mobility is desired. Polymerization in organic solvents eliminates the problem. Polymerization is typically done in acetonitrile using LiClO4 as electrolyte resulting in sky-blue doped PEDOT layer containing $ClO_4^-$ as counterions. Xia et al. deposited thin layers of PEDOT and performed simultaneous electrochemical surface plasmon spectroscopy. Dielectric constant and thickness of the layers could be measured accurately by this technique as well as electrochromic switching between different redox states. Nucleation stage and early growth was investigated by Randriamahazaka et al. The combined mechanism of progressive diffusion-controlled 3D nucleation and instantaneous 3D charge transfer as a limiting factor was proposed. Su-Moon Park et al. conducted morphological studies of growing PEDOT films. By using current-sensing atomic force microscopy, they were able to measure conductivities of the layers at the same time. It was shown that the current value fluctuates drastically from one point to another; morphology and electrical properties of the film were found to be sensitive to deposition conditions. Later, the electrochemical characteristics of electrodeposited PEDOT layers were found to be much better compared to spin-coated PEDOT-PSS. It can be concluded that electrochemistry is a powerful technique to control thickness, morphology, and redox state of the in situ deposited PEDOT layer. Despite these detailed investigations of electrochemically deposited PEDOT films, their application in organic electronics and particularly as a hole extraction layer in OPV is narrow. Electrodeposited PEDOT was successfully incorporated into ZnS/ZnO dye-synthesized and hybrid ZnO/poly[2-methoxy-5-(30,70-dimethyloctyloxy)-1,4-phenylenevinylene] (ZnO/MDVO-PPV) solar cells. Kuo-Chuan Ho et al. electrochemically polymerized EDOT and its derivatives on ITO from a boron tri$uoride-ethyl ether solution. Porous layers were obtained and porosity was observed to be higher for derivatives with bulkier groups as a result of π-stacking distortion. An active layer of regioregular poly(3-hexylthiophene-2,5-diyl) and phenyl-C61-butyric acid methyl ester (rrP3HT-PCBM) was deposited on top by spin-coating and the prepared OPVd were characterized. Efficiency as a function of porosity was calculated and found to be 3.57% for moderate porosity.

Since the first heterojunction organic solar cell with 1% efficiency was reported by Tang in 1986, tremendous amount of research has been conducted in this field. In 1993, Sariciftci applied fullerene as an electron acceptor material in the solar cell where a semiconducting polymer was used as a donor. Enhanced photoelectron charge transfer was observed due to high electron affinity of fullerene. In addition, fullerene has good transparency and conductivity which made it the most widely used acceptor in OPVd. A bulk heterojunction concept was introduced in 1994 by Yu and Heeger and was later shown to improve exciton dissociation. However, efficiency of the organic solar cells remained low until it was realized that morphology of the photoactive layer is a key factor. Nanodomains of the donor component should be of the same size as the exciton diffusion length, which is about 10 nm for most of the organic semiconductors. For better charge transport the donor and the acceptor should form bicontinuous network. An ideal structure is an array of nanorods aligned perpendicular to the surface of electrodes. Upon the selection of proper concentration, solvent, evaporation rate and annealing technique, the morphology can be improved in and the efficiency up to 5% has been reached. Instinctively, the nanofibrillar structure of a semiconducting polymer should provide high hole mobility. Thin nanofibers of poly(3-alkylthiophenes) with diameter down to 10 nm have been successfully prepared either by precipitation from a mixed solvent or by slow cooling of dichlorobenzene solution. With the high crystallinity and the long length of the fibers, the efficiency has been shown to be on the level of 3%. The reason is the improper alignment of the nanofibers deposited from the solution. As a result of the solvent evaporation they oriented in parallel to the surface instead of preferable perpendicular direction.

Most of the semiconducting polymers can be polymerized electrochemically. In this case polymerization is coupled with the layer deposition. One important advantage is that monomers without side alkyl groups can be used since no solution processing of the polymer is needed. Potentially, by using low-cost starting materials and simple equipment setup, the electrochemical method may potentially decreases the cost of the OPVd fabrication. Electrochemistry is a powerful technique to control not only thickness of the deposited layer but also its morphology. The layer grows bottom-up, giving the possibility to obtain brush-like structures preferred for the OPV application. Besides that, it has been shown that the electrical contact between electrode and the electrochemically deposited layer is stronger than for the solution casted one. All these advantages make electrochemical method a promising alternative for the OPVd preparation. Despite that, application of the method is barely described in literature. Electrochemically polymerized PEDOT was successfully used as a hole extraction layer. Electrodeposition typically was shown to results in rough films with large surface area improving contact with a photoactive layer. For the same reason open circuit voltage ($V_{oc}$) is lower than for the smooth spin coated PEDOT-PSS. Efficiency of up to 3.57% was measured for the cells where spin coated P3HT-PCBM was used as photoactive layer. Optoelectronic properties of the electrodeposited polythiophene and its derivatives were studied in single layer photovoltaic cells. In the absence of the strong electron acceptor, low efficiency of about 0.01% was measured. Ratcliff et al made two-layer OPVd by vacuum deposition of fullerene on electrochemically polymerized P3HT. $C_{60}$ penetrated into thin textured P3HT layer increasing the donor-acceptor interfacial area. Even though electropolymerization leads to the regiorandom P3HT relatively high $I_{sc}$ of 3 mA/cm$^2$ and 1% overall energy conversion efficiency were measured. By linking fullerene covalently to the thiophene monomer it can be codeposited electrochemically resulting in so-called double-cable polymers which have been studied intensively for over a decade. However, photoresponse of this type of polymers is limited by fast exciton recombination process. Fan et al codeposited fullerene and unsubstituted polythiophene electrochemically from 1-chloronaphthalene/BFEE solution. The technique was not effective for the fullerene deposition and the performance of the fabricated device was poor because of the low fullerene content. Balch studied electrodeposition of fullerene in detail. It was shown that fullerene molecules undergo radical polymerization at negative reductive potential in the presence of small amounts of fullerene epoxide or oxygen catalyzing the process. As a result yellowish films of polyfullerene were obtained.

Polymer solar cells have been widely investigated in the last two decades due to potentially low cost, flexibility and light weight. However, lack of the efficiency and stability limits their vast industrial expansion. Generation of photocurrent in an organic photovoltaic device (OPVd) is a complex presses consisting of photon harvesting, exciton generation and migration, charge separation and transport. Morphology has a critical effect on the performance of the polymer solar cells. Due to the limited exciton diffusion length donor and acceptor components should form a fine mixture on nanolevel. Besides that, a bicontinuous network is desired for improved charge transport. Traditional ways to fabricate such a polymer solar cell are based on solution processing techniques or printing methods.

It is well-known that conjugated polymers can be synthesized electrochemically. The electropolymerized layer is usually rough and grows upwards from the working electrode surface. So, by filling openings with an acceptor component, the bicontinuous brush-like architecture might be achieved. The polymerization and the layer deposition are combined in one process, hence there is no need for the polymer processing. For the same reason simple monomers can be used as the solubility of the polymer is not an issue. In addition, electrochemistry gives control over thickness of the deposited layer and oxidation state of the polymer.

There are number of publications where electropolymerized PEDOT was applied as a hole transporting layer to build OPVd, hybrid or dye-sensitized solar cells. Recently, we studied PEDOT layers deposited electrochemically from mixed toluene/acetonitrile solvent. The layers had fibrillar brush-like morphology. For the thin to moderate thicknesses the diameter of the fibers was as small as 20 nm resulting in the high surface area. The layers were incorporated into OPVd and 30% improvement in the fill factor compared to spin-coated PEDOT-PSS layer was observed. Electrodeposited conjugated polymers were successfully used in hybrid organic-inorganic solar cells. Gong et al developed electropolymerization of doped poly(3-methylthiophene) (P3MT) layer on CdS to form a Schottky junction and efficiency up to 4% was measured. Other examples include P3MT on CdSe, P3MT on $CuInSe_2$, P3MT on $TiO_2$ and polypyrrole on $CuInSe_2$. A conjugated polymer in its neutral undoped state together with an acceptor (e.g. fullerene) are essential components of the polymer solar cell. Even with all the advantages already discussed, electrochemistry has been barely used to fabricate a polymer solar cell. One method is based on electropolymerization of fullerene-derived thiophene monomer leading to so-called double-cable polymers. Another example is evaporation of fullerene on top of the electropolymerized textured poly(3-hexylthiophene) (P3HT) film. Despite the regiorandom structure of P3HT relatively high $J_{sc}$ of 3 mA/cm$^2$ and efficiency of 1% were measured. Fan et al performed electrochemical co-deposition of polythiophene and fullerene from thiophene/fullerene solution. However, polythiophene had poor conjugation length and amount of deposited fullerene was insignificant. Balch et al developed an effective way for the electrochemical deposition of fullerene. Addition of small amounts of fullerene epoxide was shown to promote electrochemical reductive polymerization of fullerene resulting in uniform layer on a working electrode surface.

BRIEF SUMMARY OF THE INVENTION

Briefly, the present invention discloses an electrochemical method for the deposition of a hole extraction layer and the usage of the layer in construction of a solar cell. The invention is based on knowledge that hole extraction and transport plays an important role in the efficiency of an organic photovoltaic device (OPVd). That is why the morphology of hole extraction layers play a critical role in the performance of solar cells.

An object of the present invention is to create nanofibrilar morphology of poly(3,4-ethylenedioxythiophene) (PEDOT), a semiconducting conjugated polymer, which is used as a hole extraction layer. Nanofibers of PEDOT behave like pathways for positive charge to travel to electrode increasing rate of transport and thus performance of OPVd.

A first preferred embodiment of the invention is an electrochemical approach for fabricating a polymer solar cell that involves depositing poly(3,4-ethylenedioxythiophene) (PEDOT) on ITO surface by cyclic voltammetry from mixed toluene/acetonitrile solvent for fabricating a solar cell. Thickness and oxidation state of the layer were monitored by UV-vis-NIR spectroscopy and grazing angle FTIR (GA-FTIR) spectroscopy. Morphology had fibrillar character with roughness and porosity dependent on the thickness of the layer. PEDOT was incorporated into organic photovoltaic cell as a hole extraction layer with spin-coated P3HT-PCBM intrinsic layer without further annealing. Performance of the cell was found to be effected by the morphology of the PEDOT layer. A fully doped PEDOT layer of moderate thickness was found to have the highest efficiency demonstrating an open-circuit voltage (Voc) of 0.48 V, short-circuit current (Isc) of 5.1 mA/cm2, fill factor (FF) of 0.46, and overall efficiency (∈) of 1.1%. Electrochemically deposited PEDOT was compared to traditional spin-coated PEDOT-PSS of the same thickness. Although Voc and Isc were the same, a 30% improvement in the fill factor was observed for electrochemically deposited PEDOT. The phenomenon was attributed to lower series resistance of the cell due to higher hole mobility of pure PEDOT and better electrical contacts with both the ITO electrode and intrinsic layers.

A second preferred embodiment of the invention is an electrochemical approach for fabricating a polymer solar cell that involves codepositing poly(thieno[3,2-b]thiophene) and fullerene by cyclic voltammetry from the solution containing corresponding monomers. The composition could be altered by changing potential range and was monitored by UV-Vis-NIR spectroscopy. Morphology and phase separation were studied by AFM revealing formation of the bulk heterojuctions and interpenetrating network of the components. For the device fabrication the codeposition onto electropolymerized PEDOT layer was done without any destructive interference. $V_{oc}$ of 0.3 V and $I_{sc}$ of 35 µA/cm$^2$ were measured under standard AM 1.5 conditions.

A third preferred embodiment of the invention is an electrochemical approach for fabricating a polymer solar cell that involves electropolymerization of 2,2'-bithiophene on top of an electrodeposited p-doped PEDOT layer. Fullerene was deposited as a third layer after initiating n-doping of the polymers. Composition and oxidation states of the polymers were monitored by UV-Vis-NIR spectroscopy. Morphological changes were followed with Atomic Force Microscopy (AFM) revealing rough nanostructures of the layers. The composition and performance of the solar cells were compared to the cells fabricated by using conventional spin-coating technique. Relatively low photoresponse with maximum $V_{oc}$ of 0.47 V and highest $J_{sc}$ of 0.55 mA/cm$^2$ was measured.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF PREFERRED EMBODIMENTS

Figure 1:
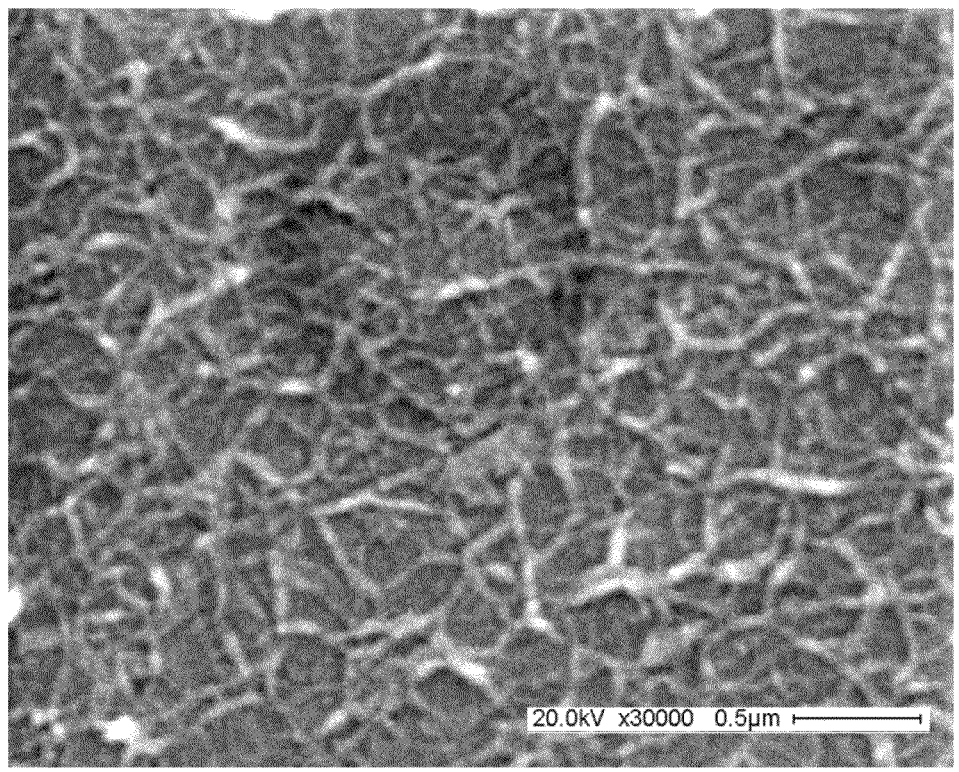
FIG. 1 is an SEM image of PEDOT nanofibers.
Figure 2:
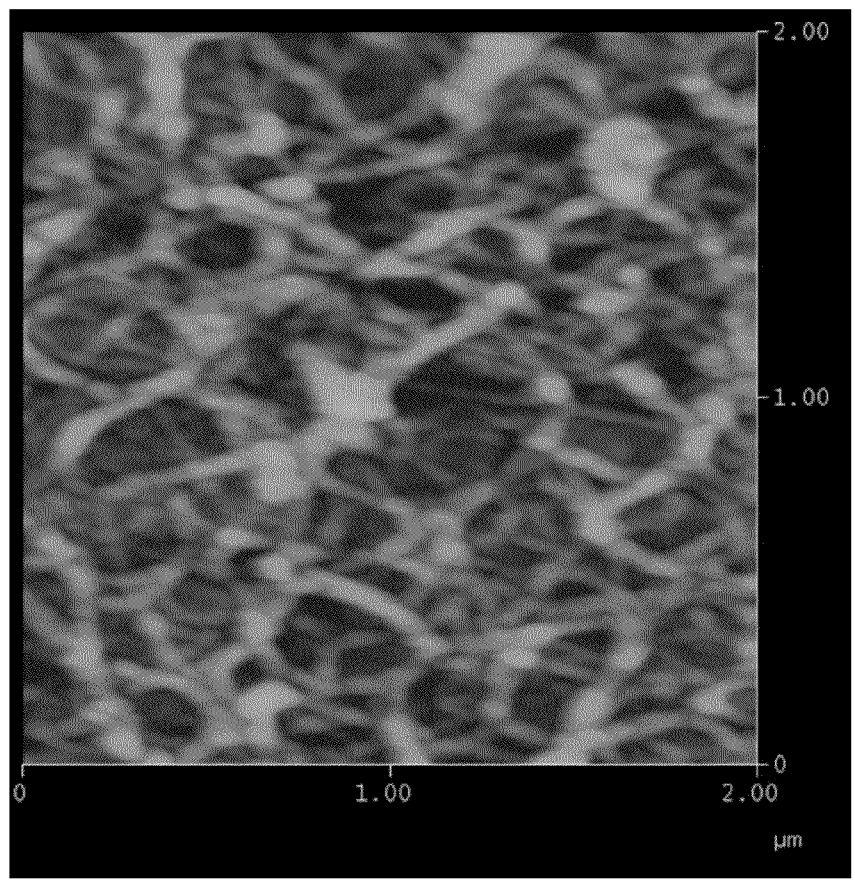
FIG. 2 is an AFM image of PEDOT nanofibers.
Figure 3:
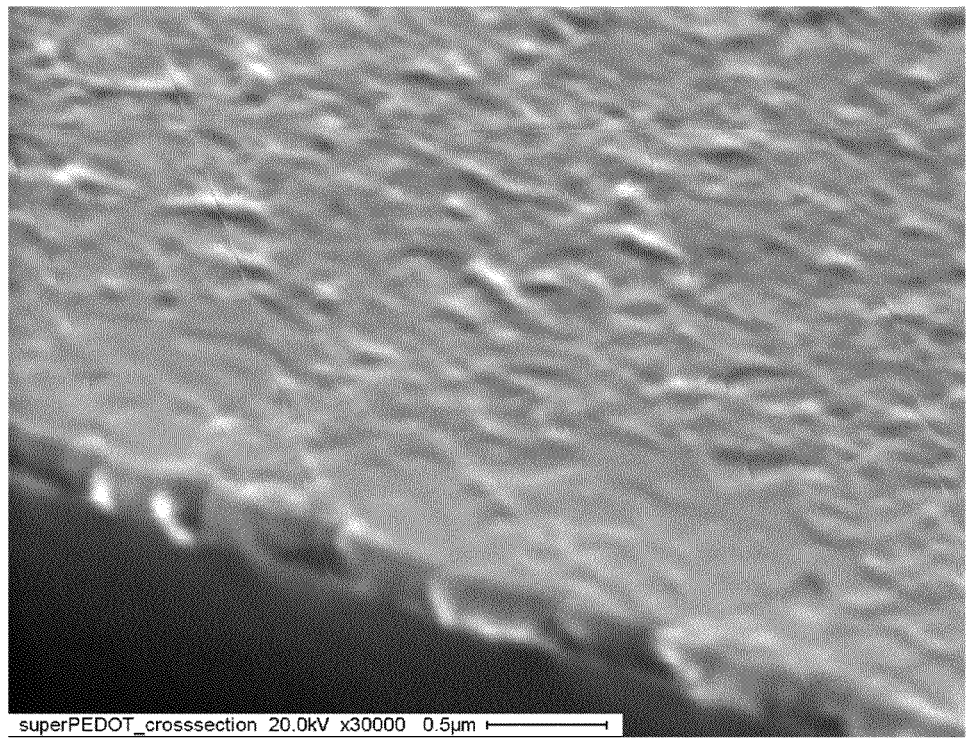
FIG. 3 is an SEM image of cross-section of nanofibrilar PEDOT layer.
Figure 4:
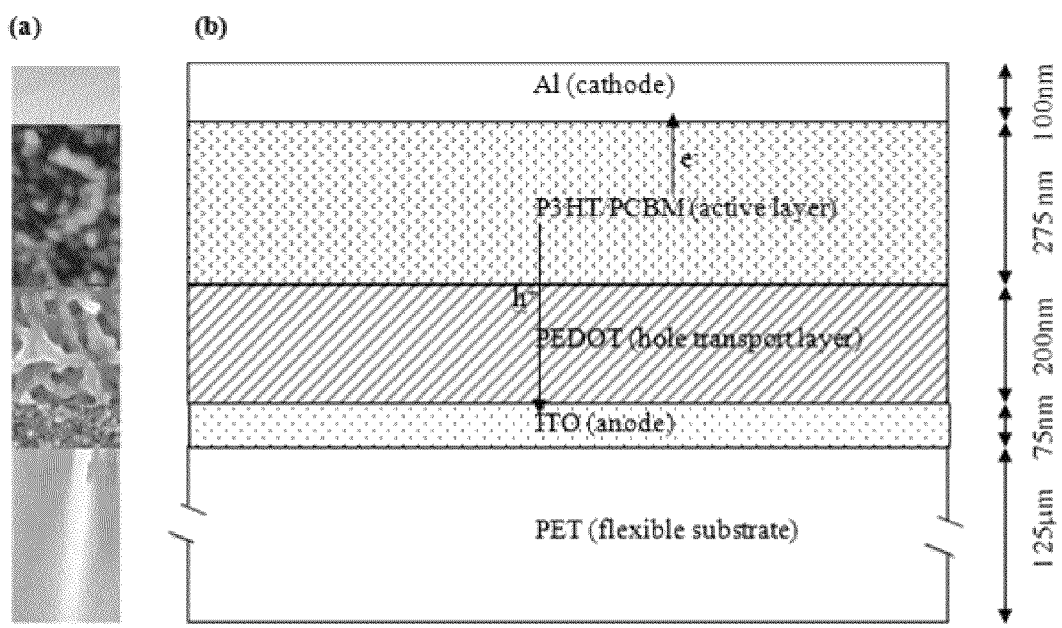
FIG. 4 is a schematic view of the fabricated OPVd.
Figure 5:
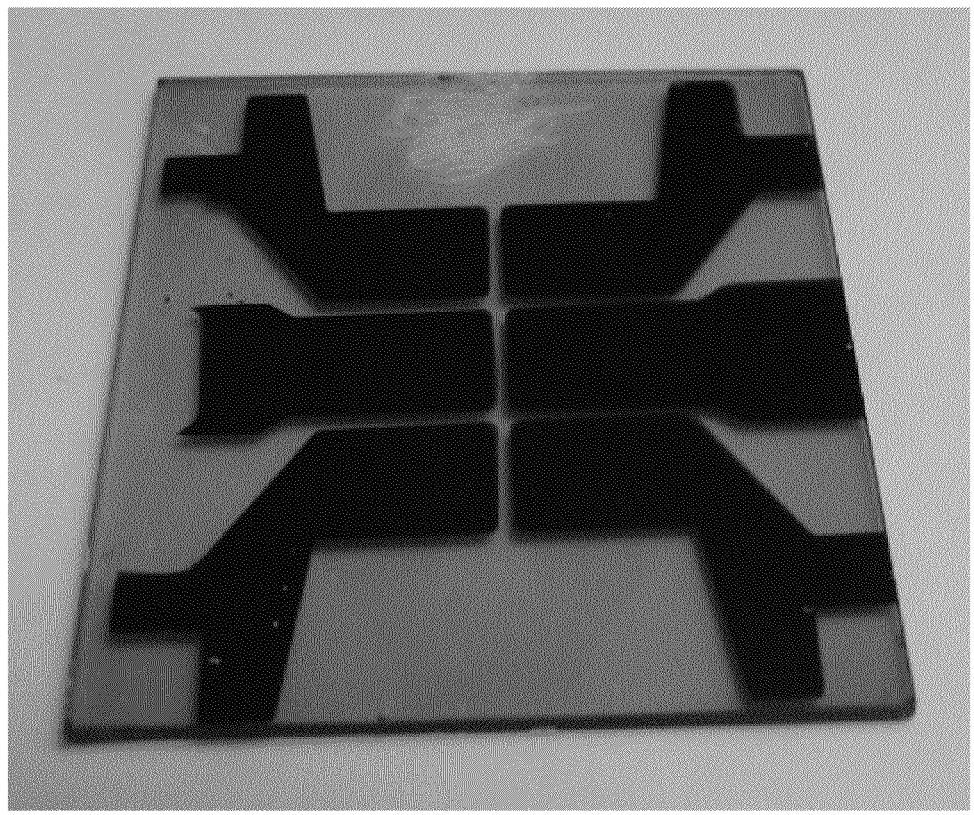
FIG. 5 is a photographic image of the fabricated OPVd.
Figure 6:
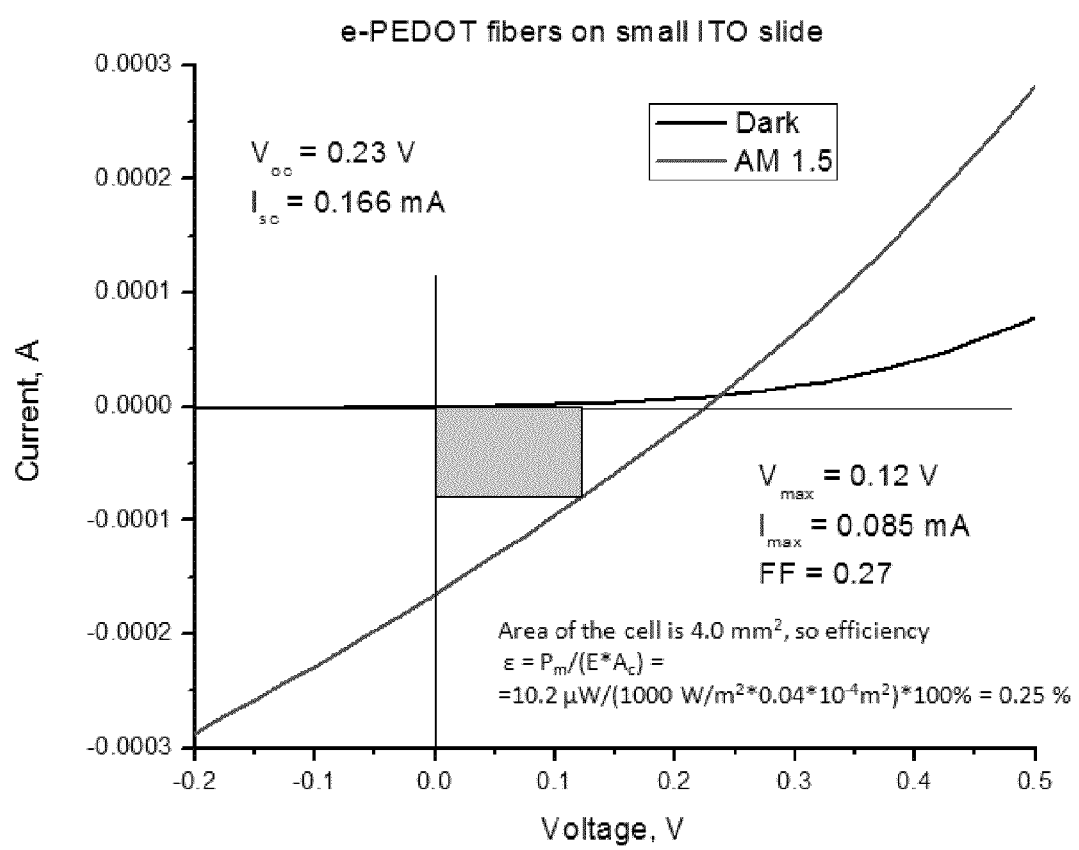
FIG. 6 is a graph of the performance of the fabricated OPVd.

Illustrative Embodiment A—Electrochemical deposition of poly(3,4-ethylenedioxythiophene) hole extraction layer for organic photovoltaic device Fabrication.

The present invention discloses an electrochemical method for the deposition of a hole extraction layer and the usage of the layer in construction of a solar cell, based on knowledge that hole extraction and transport plays an important role in the efficiency of an organic photovoltaic device (OPVd).

To produce the OPVd of the present invention, a nanofibrilar morphology of poly(3,4-ethylenedioxythiophene) (PEDOT), a semiconducting conjugated polymer, is created for use as a hole extraction layer. Nanofibers of PEDOT behave like pathways for positive charges to travel to the electrode, thus increasing the rate of transport and thus performance of OPVd. To create the desired morphology, a nanofibrilar layer of PEDOT is deposited electrochemically on an indium tin oxide (ITO) surface.

The ability of surfactants to aggregate in an aqueous solution and form micelles of different shapes is employed in the present invention. For example, surfactants form cylindrical micelles in water under certain conditions. The monomer, 3,4-ethylenedioxythiophene (EDOT), is solubilized inside such cylindrical micelles. An electrochemically inert salt is added to the solution as an electrolyte. This solution is used to polymerize PEDOT on the surface of ITO by applying negative oxidative current. Micelles of the surfactant serve as templates and predetermine the structure of the final PEDOT layer.

The morphology of the deposited layer depends on nature of the surfactant used, the salt, the concentration of all the components, and the electrochemical technique. For example, by changing the composition of the electrolyte solution and the rate of polymerization, morphology is controlled and can be either granular or fibrilar. The thickness of the deposited layer is a function of the polymerization time. As an example, successful fibrilar morphology has been obtained for 30 mM cetyltrimethylammonium bromide (CTAB), 7 mM EDOT, 0.5 M $NaNO_3$ solution. Polymerization at moderate rate, under 1.1 $\mu A/cm^2$ anodic current, for 15 seconds revealed porous layer of PEDOT fibers. A representative diameter of the fibers obtained is 50 nm and a representative thickness of the layer obtained is 200 nm.

The invention provides superior morphology of the hole extraction layer and better efficiency of the OPVd. The technique used to deposit the layer also is advantageous in producing the superior and novel OPVd of this invention. Electrochemical polymerization of the PEDOT layer is technologically easier and faster than spin-coating or doctor blade techniques. Deposition happens within approximately 15 seconds and requires an electrochemical bath and a simple current source. Further, the inventive technique eliminates the problem of wastes as the electrolyte solution can be used over and over again as long as the concentration of the components is under control. The doping level and hence the conductivity of the electrochemically deposited PEDOT can be altered by subjecting it to certain potential. This makes electrochemical deposition not only a powerful instrument to manipulate the structure and thickness of the PEDOT layer, but also to manipulate the chemical nature of the resulting polymer.

More specifically, a representative method for producing the OPVd of the present invention comprises the steps of:
a. cleaning an ITO coated glass slide consecutively with chloroform, isopropanol and deionized water, b. preparing an aqueous solution of a surfactant in 0.5 M NaNO$_3$ electrolyte,
c. solubilizing 3,4-ethylenedioxythiophene (EDOT) in the surfactant/NaNO$_3$ solution,
d. polymerizing the EDOT from the prepared solution on the surface of the ITO electrode by applying an anodic oxidative current, and
e. washing the deposited PEDOT layer with deionized water and drying the PEDOT layer at 60° C.

The surfactant can be of anionic, cationic, zwitterionic or nonionic nature.

In one embodiment of the process, the surfactant forms cylindrical micelles, interconnected worm-like micelles, or bilayers. The polymerized PEDOT layer in this case has nanofibrilar morphology. In another embodiment of the process, the surfactant forms spherical micelles. The polymerized PEDOT layer in this case has granular morphology.

By changing ionic strength of the solution, using salt as an electrolyte effects the shape and size of surfactant micelles and hence the final morphology of the PEDOT layer. In one embodiment of the process, the rate of the EDOT polymerization and hence the final morphology of the PEDOT layer are adjusted by changing the current density passing through the solution. In another embodiment of the process, the rate of the EDOT polymerization and hence the final morphology of PEDOT layer are adjusted by changing the oxidative potential of the ITO electrode. In yet another embodiment of the process, the concentration of the monomer effects the size and shape of the surfactant micelles and hence the final morphology of the PEDOT layer.

A representative organic photovoltaic device (OPVd) of the present invention is comprised of following layers:
a. a transparent conductive ITO layer on a substrate,
b. a nanofibrilar or nanogranular layer of PEDOT deposited electrochemically on the ITO,
c. a photoactive layer of poly(3-hexylthiophene)/[6,6]-phenyl-$C_{61}$-butyric acid methyl ester (P3HT/PCBM) deposited by spin-coating technique on top of the PEDOT layer, and
d. an aluminum layer deposited on top of the photoactive layer.

Electrical contacts can be connected to the ITO and to aluminum electrodes.

The substrate can be transparent glass or a flexible polymer film.

The aluminum layer can be deposited by thermal vacuum deposition, e-beam deposition, or sputtering methods.

A nanofibrilar PEDOT layer is deposited on an ITO from 30 mM CTAB, 7 mM EDOT, 0.5 M NaNO$_3$ aqueous solution. The EDOT is polymerized under 1.1 mA/cm$^2$ anodic current. The deposition time is 15 seconds.

In this embodiment, PEDOT layers If different thicknesses were grown electrochemically on ITO surfaces. The thickness was correlated with nanostructure of the layer and was monitored by UV-vis-NIR spectroscopy. The layers were incorporated into ITO/PEDOT/rrP3HT-PCBM/Al OPVd. Performance of the devices was measured as a function of growing PEDOT thickness and was compared to flat spin-coated PEDOT-PSS layers. Electrochemical and thermal post-treatment was found to have effect on OPVd efficiency.

Materials. Custom-made indium tin oxide (ITO) glass slides, Rs=15 ohms, 25×25×0.7 mm, were purchased from Luminescence Technology Corp. 3,4-Ethylenedioxythiophene (EDOT), tertabutylammonium perchlorate (TBAP), ethanolamine, anhydrous toluene, anhydrous acetonitrile, and anhydrous 1,2-dichlorobenzene were purchased from Sigma-Aldrich and used as received. Phenyl-C61-butyric acid methyl ester (PCBM) was ordered from Luminescence Technology Corp. Electronic grade regioregular poly (3-hexylthiophene-2,5-diyl) (P3HT) for photoactive layer deposition was ordered from Sigma-Aldrich. Regioregularity of P3HT was confirmed by $^1$H NMR with the single peak at 6.977 ppm for head-to-tail regioregularity. Mn=29000 and PDI=2.2 were measured by GPC using polystyrene standards in chloroform. Tungsten boats and aluminum pellets for cathode evaporation were ordered from Ted Pella, Inc. Millipore deionized (DI) water was used.

Instruments. Electrochemical polymerization was done using a model 660D workstation (CH Instruments, Inc., Bee Cave, Tex.). Morphological studies were performed by a Nanoscope IIIa atomic force microscope (AFM) (Veeco, Inc., Fremont, Calif.). UV-vis-NIR spectra were recorded with a UV-3101PC spectrophotometer (Shimadzu Scientific Instruments, Inc., Columbia, Md.). Current-voltage (I-V) curves were run using a Keithley 2400 source meter (Keithley Instruments, Inc., Cleveland, Ohio) and a standard AM 1.5 solar simulator, 100 mW/cm2 (Newport, Inc., Irvine, Calif.). Grazing angle FTIR (FTIR-GA) spectra were recorded with Spectrum 100 FTIR spectrometer (PerkinElmer, Inc., Waltham, Mass.). Aluminum cathodes were evaporated in an Angstrom Engineering vacuum deposition system at pressure below 2×10$^{-6}$ Torr.

Electrodeposition of PEDOT Films. ITO slides were cleaned by sonication in 20% aqueous ethanolamine solution for 30 min at room temperature, followed by intensive rinsing with DI water. The slides were dried in a nitrogen gas stream and used as working electrodes for PEDOT layer deposition. Ag wire in 0.01 M AgNO3-acetonitrile solution was used as reference electrode (E=0.47 V) and 25" 50 mm platinum foil as counter electrode. Working and counter electrodes were placed 1.0 cm apart in 5.0 mM EDOT solution in a toluene/acetonitrile mixture (4/1 by volume). 0.1 M TBAP was used as a supporting electrolyte. The layers were deposited by cycling potential between 0.0 and 1.1 V at 100 mV/s sweeping rate. Electrodeposited sky-blue PEDOT layers were intensively washed in gas stream samples were stored in Petri dishes for further characterization and device fabrication. Reduced PEDOT layers were stored under argon no longer than 24 h to prevent from oxidation.

Fabrication of OPVd. Electrodeposited PEDOT was applied as a hole extraction layer in photovoltaic device. The P3HT-PCBM mixture was used as the photoactive layer. P3HT and PCBM were dissolved in 1,2-dichlorobenzene by mixing at 80 !C for 30 min. Concentration of each component was 20.0 mg/mL. The solution was cooled down to room temperature and filtered through 0.45 μm Teflon syringe filter right onto a PEDOT-coated ITO glass slide. The slides were spun at 300 rpm for an initial 30 s, and then the speed was increased to 500 rpm for the next 3 min and finally to 2000 rpm for another 3 min to dry completely. Uniform reddish layers were obtained. Spin-coating was done in a clean glovebox environment to avoid any negative effect of dust. 60 nm thick aluminum cathode was thermally evaporated through the mask at 1 Å/s. For better accuracy of testing six individual cells were fabricated on each slide. Photoactive area was 0.15 cm$^2$.

Figure 7A:
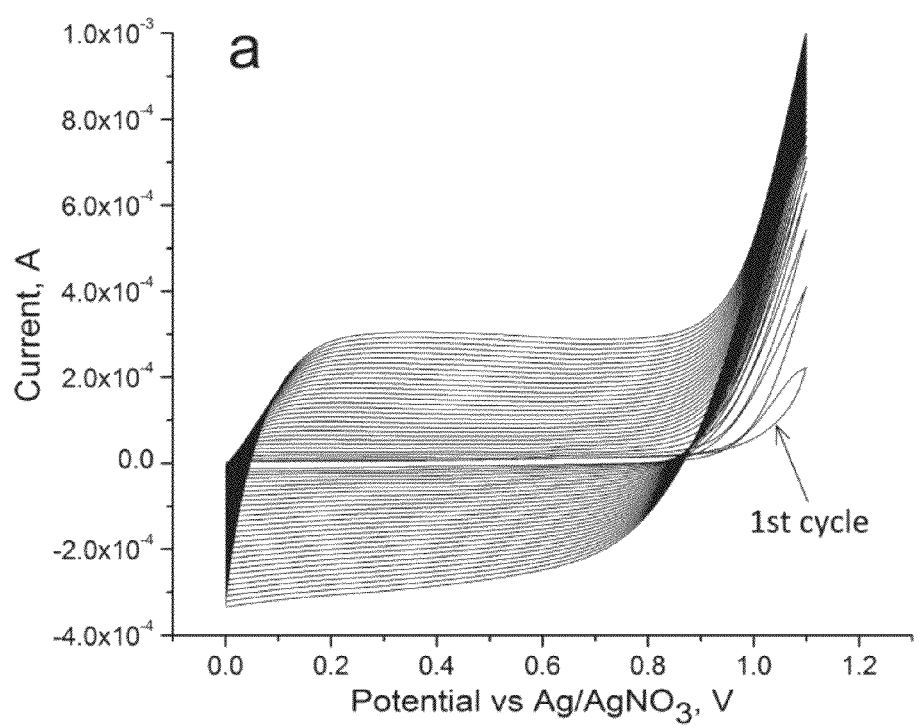
FIG. 7 shows (a) electrodeposition of PEDOT layer by CV from 5.0 mM EDOT solution in 0.1 M TBAP, thirty cycles at 100 mV/s sweeping rate, and (b) CV of the PEDOT layer deposited by 30 cycles, electrolyte 0.1 M TBAP in toluene/acetonitrile mixture; sweeping rate 100 mV/s.
Figure 7B:
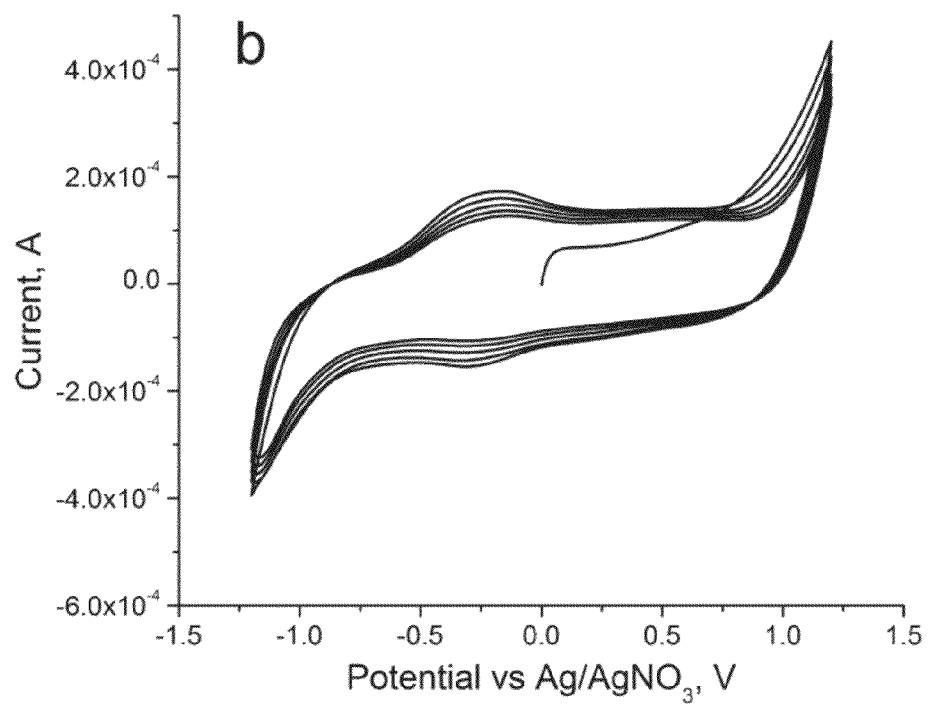

Results. PEDOT layers were polymerized by cyclic voltammetry scanning from 0.0 to 1.1 V, setting 1.1 V as a final potential. Oxygen atoms in the EDOT monomer structure stabilize positive charge on the oxidized monomer unit and on the growing macromolecular chain during polymerization due to the +M effect. It decreases polymerization potential of EDOT. For the first cycle anodic current appeared at potential above 0.85 V, which is 1.32 V vs SHE (see FIG. 7a). The standard polymerization potential of nonsubstituted thiophene is 1.95 V vs SHE. The phenomenon is common for thiophene derivatives with electron-donating groups and is one of the reasons for extensive PEDOT investigation and wide application. The deposition happens at potentials above 0.85 V. With increasing thickness of the layer the background current goes higher which is a common behavior for electrochemically active layers. The oxidative current goes up to 1.0 mA showing nearly linear growth above 0.9 V. CV of the layer deposited by 30 cycles was run in the −1.2 to 1.2 V range (see FIG. 7b). Two peaks were observed: oxidation at −0.15 V and reduction at −0.25 V and are attributed to reversible doping of PEDOT. With increasing number of cycles both peaks shifted to −0.20 and −0.30 V, respectively. Deposition was stopped at 1.1 V, so that originally obtained layers were doped.

The as-deposited PEDOT films had a light blue color and good transparency and, importantly, were uniform with no visible defects. Also, they had good adhesion to the ITO surface: even after 30 min of intensive sonication no change in UV-vis spectra of the !lm was observed, showing a strong electrical contact between ITO and electrochemically deposited PEDOT which is significant for photovoltaic applications.

According to the CV, PEDOT films can be undoped at potential lower than −0.30 V. The layers were subjected to various potentials in 0.1 M TBAP solution to study electrochromic effect. A range of −1.0 to 1.0 V was applied. A significant reductive current was observed at potentials lower that −0.5 V, but on the other hand, oxidative current was observed above 0.5 V. Reduction changed color from original sky-blue to dark-blue, and oxidation had no effect. The layers used for the electrochromic study were obtained by running only 15 cycles. As a result of the reduced thickness, the transition between different redox states happened fast. The current dropped to zero within the first 20 s regardless of the potential applied.

Figure 8A:
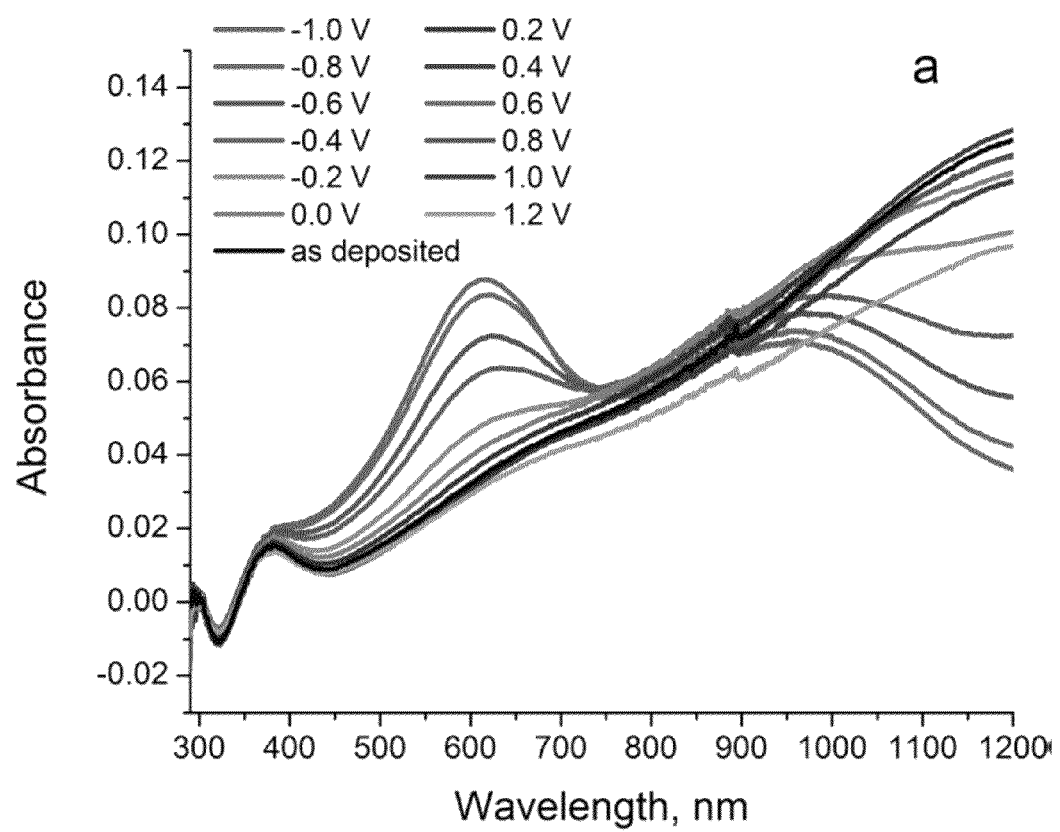
FIG. 8 shows (a) UV-vis-NIR and (b) FTIR-GA spectra of the electrodeposited PEDOT layer subjected to various potentials.

Transitions were monitored by UV-vis-NIR spectroscopy (see FIG. 8a). The as-deposited layer showed maximum absorbance at about 380 nm, a shoulder above 550 nm, and broad absorbance in the NIR region. As a result of the reduction, a peak at 580 nm ascribed to $\pi$-$\pi$* transition of undoped PEDOT appeared. The optical band gap edge can be calculated as 1.55 eV. In addition, an absorbance maximum around 950 nm was seen. This absorbance corresponds to excitation of polaron structure. The peak is merged with broad NIR absorbance and cannot be revealed in pristine PEDOT. Appearance of the high NIR absorbance corresponds to a metallic state transition. Oxidation of as-deposited layer at potentials above 0.8 V did not change character of the spectrum but diminished absorbance in the whole vis-NIR region. The problem is that the polymerization potential for polythiophenes is closed to a degradation potential. Apparently, part of the PEDOT was dissolved as a result of the polymer backbone cleavage and absorbance in the whole vis-NIR region slightly decreased. Fortunately, as the shape of the spectrum stays the same, the oxidation at potential up to 1.2 V does not cause irreversible destruction of the whole layer. Also, it can be concluded that the as-polymerized layer is in a fully doped state with maximum transparency in UV-vis region which is desired for photovoltaic application.

Figure 8B:
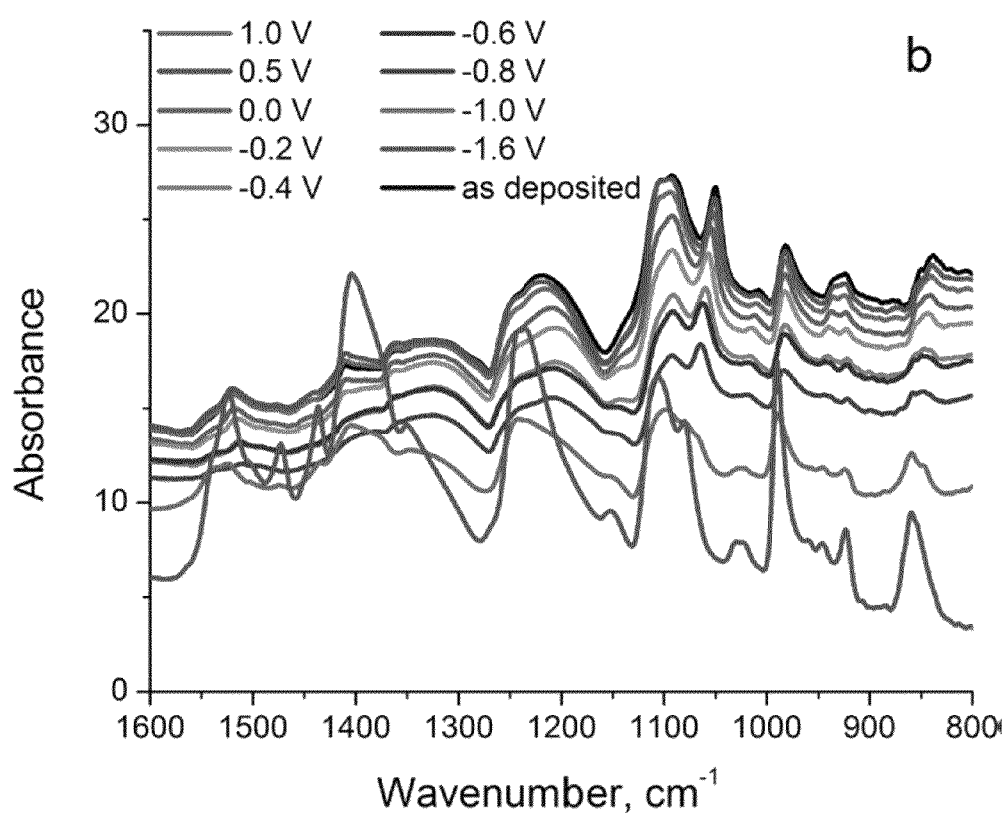
Figure 9:
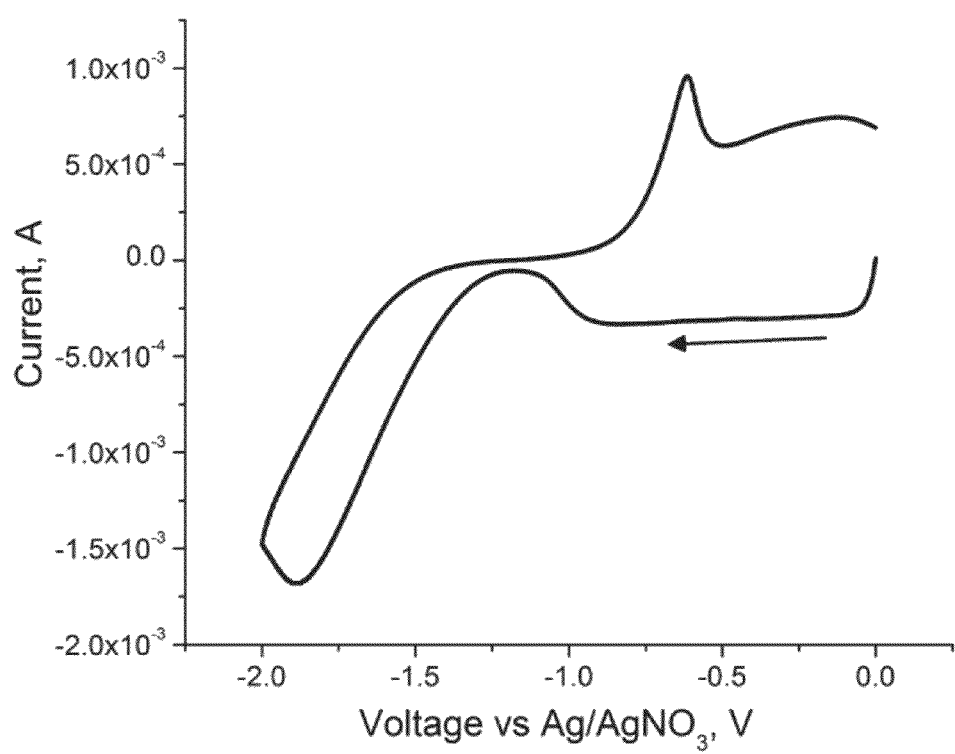
FIG. 9 shows CV of PEDOT layer at negative potential, first cycle (n-doping), electrolyte 0.1 M TBAP in toluene/acetonitrile mixture; sweeping rate 100 mV/s.

Dedoping of the PEDOT layer was also monitored by grazing angle FTIR. PEDOT layers absorbed mostly below 1600 cm$^{-1}$ regardless of the oxidation state of PEDOT. The as-deposited PEDOT showed characteristic peaks at 1518, 1405, 1323, 1218, 1195, 1050, 980, 927, and 839 cm$^{-1}$ (see FIG. 8b). As a result of dedoping, the intensity of all the peaks started to decrease below −0.2 V. A minimum absorbance was observed for the layer subjected to −1.0 V, which is attributed to fully reduced PEDOT. Some of the bands shifted with dedoping: 1218 to 1208, 1195 to 1190, 1050 to 1064, and 839 to 852 cm$^{-1}$. At the more negative potential of −1.6 V several of the peaks were restored, and several new peaks appeared. High-intensity absorbance at 1523, 1403, 1238, 1105, 1078, and 990 cm$^{-1}$ was seen. In addition, low-intensity peaks at 1472, 1437, 1150, 1023, 920, and 860 cm$^{-1}$ were revealed. The phenomenon corresponds to n-doping. The spectra for p- and n-doped PEDOT were quite different which is essential as the nature of charge carriers is different. Basically, p-doped PEDOT had higher absorbance predominantly at lower energies which can be ascribed to lower localization of charge carries and longer effective conjugation. CV of the PEDOT layer at negative potential range is shown in FIG. 9. n-Doping happened below −1.3 V with the peak potential at −1.8 V. n-Doping is a reversible process and sharp peak at −0.65 V corresponding to the oxidation of n-doped PEDOT was observed. Because of overlapping, the p-doping peak was not seen clearly. In the present work electrodeposited PEDOT was used as a hole extraction layer with various levels of p-doping applied while n-doped PEDOT had no practical use.

Both UV-vis-NIR and FTIT-GA spectroscopies were in good agreement with CV data and confirm that dedoping happens in the potential range of −0.2 to −1.0 V.

Figure 10:
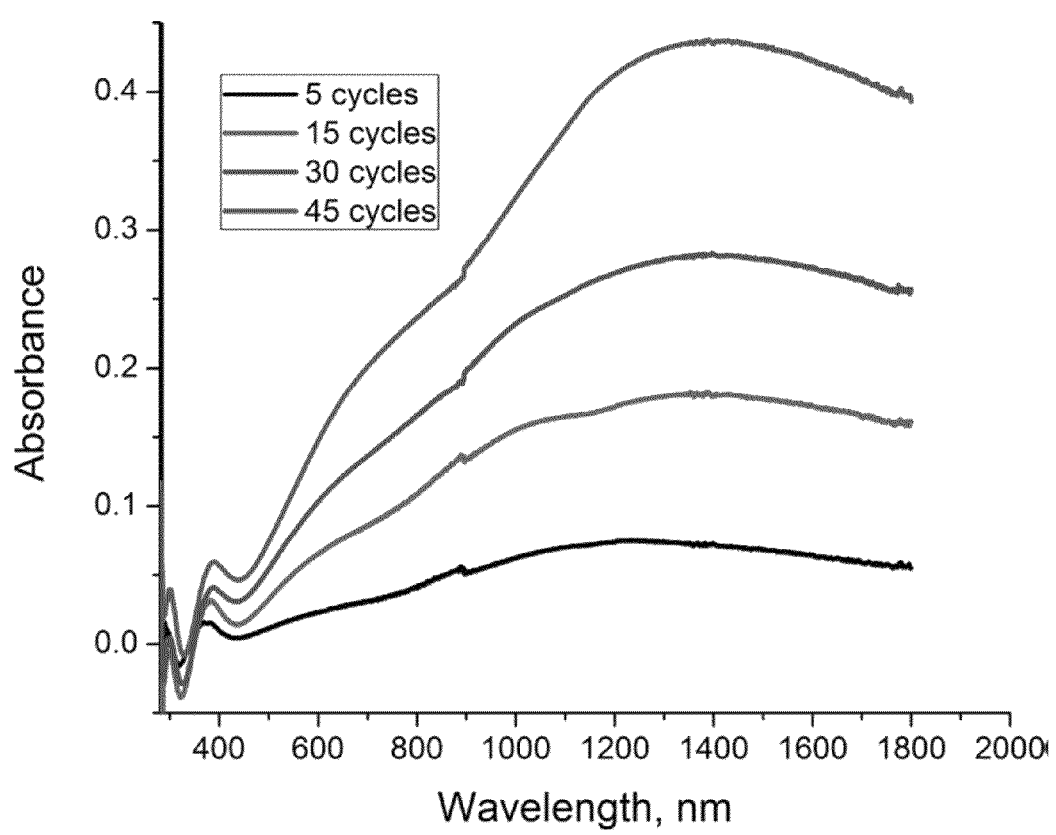
FIG. 10 shows UV-vis-NIR spectra of the growing PEDOT layer.

The thickness of the electropolymerized PEDOT layer can easily be controlled by the deposition time, which in the case of CV is number of cycles. UV-vis-NIR spectra of the layers deposited by 5, 15, 30, and 45 cycles are shown in FIG. 10. Most of the absorbance appeared in the NIR region and grew consistently with the increasing thickness.

Figure 11A:
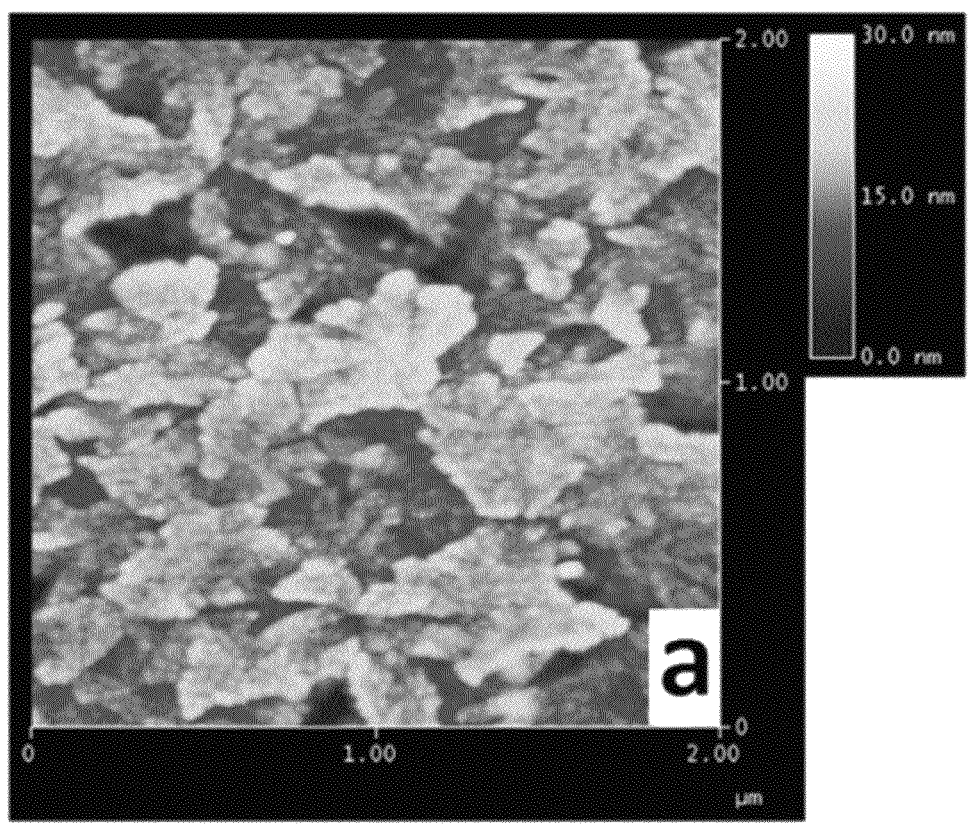
FIG. 11 shows evolution of electrodeposited PEDOT layer morphology, layer deposited by (a) 0, (b) 5, (c) 15, (d) 30, and (e) 45 CV cycles; and (f) 3D view of 15 cycles.
Figure 11B:
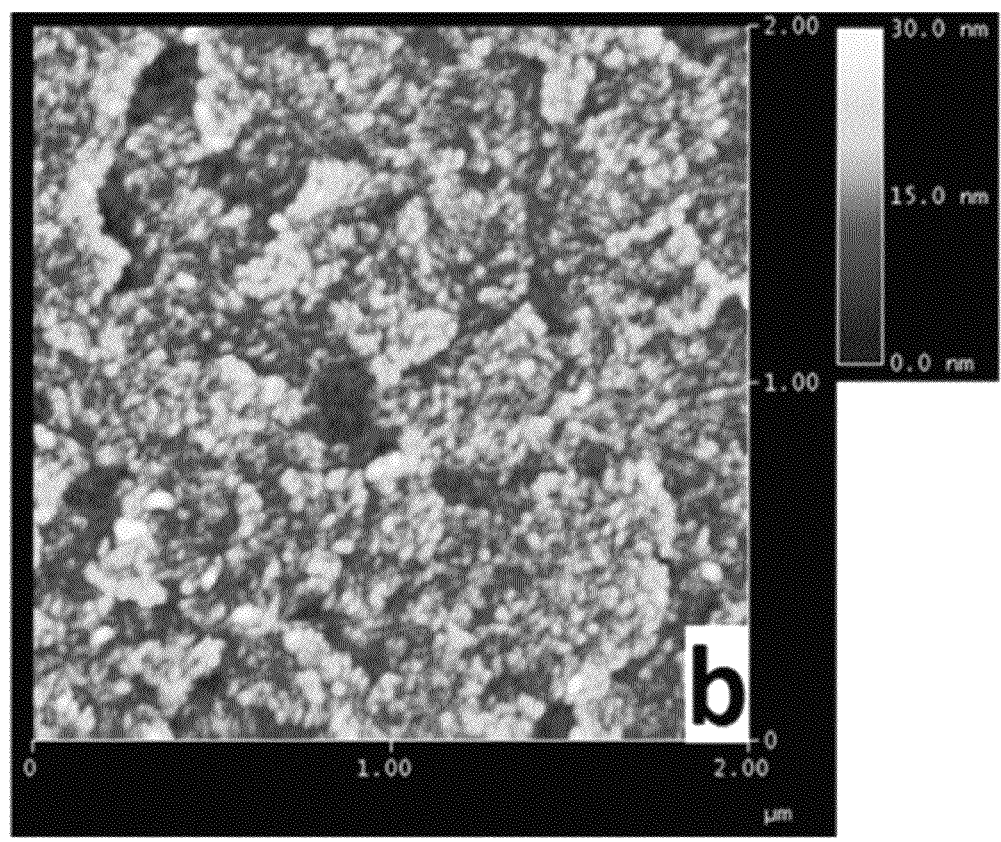
Figure 11C:
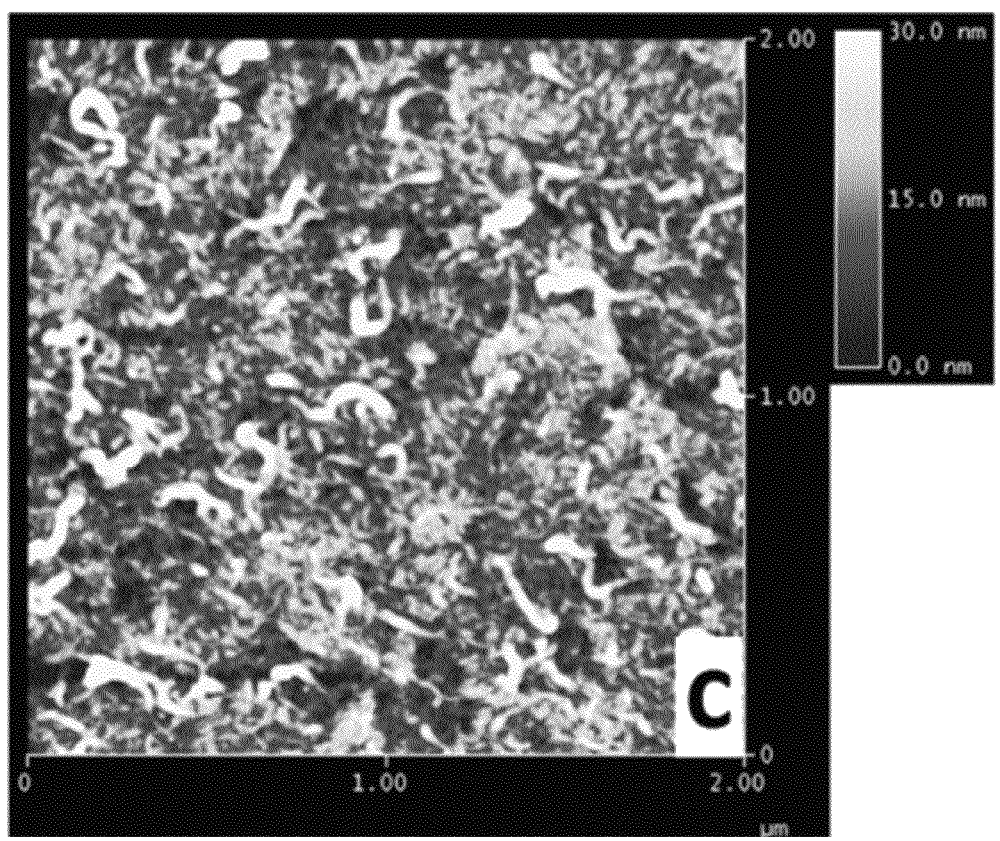
Figure 11D:
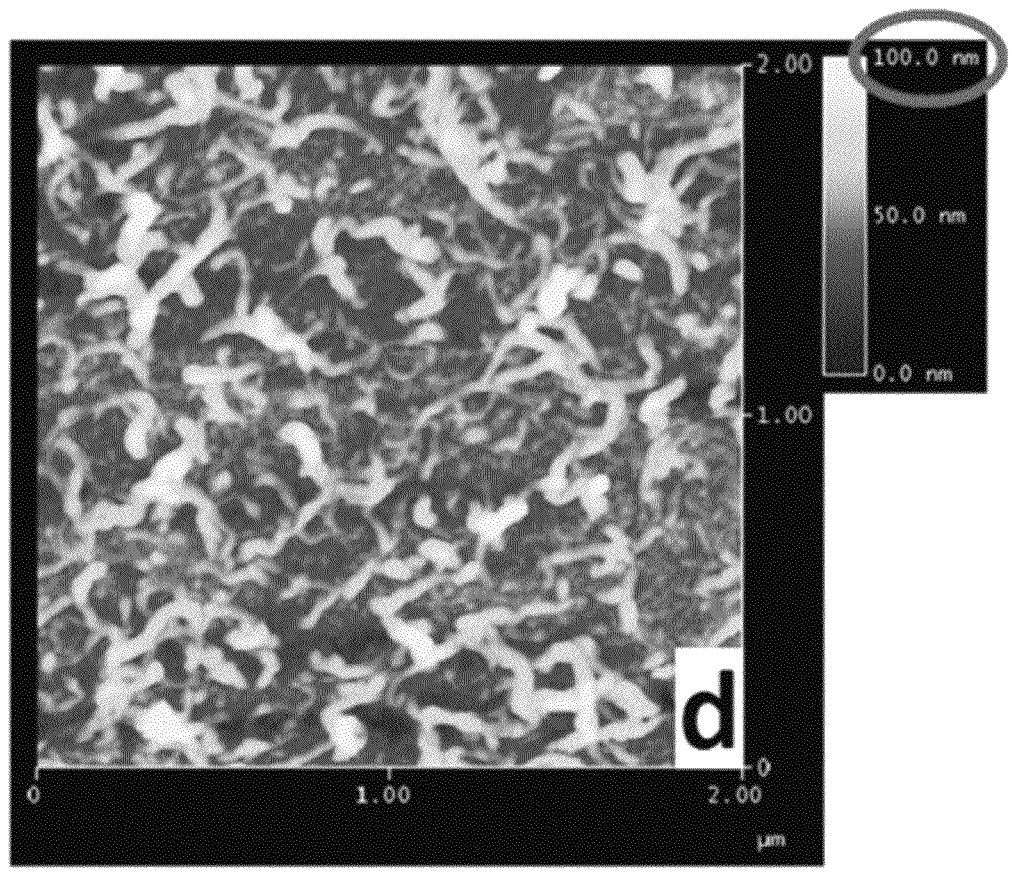
Figure 11E:
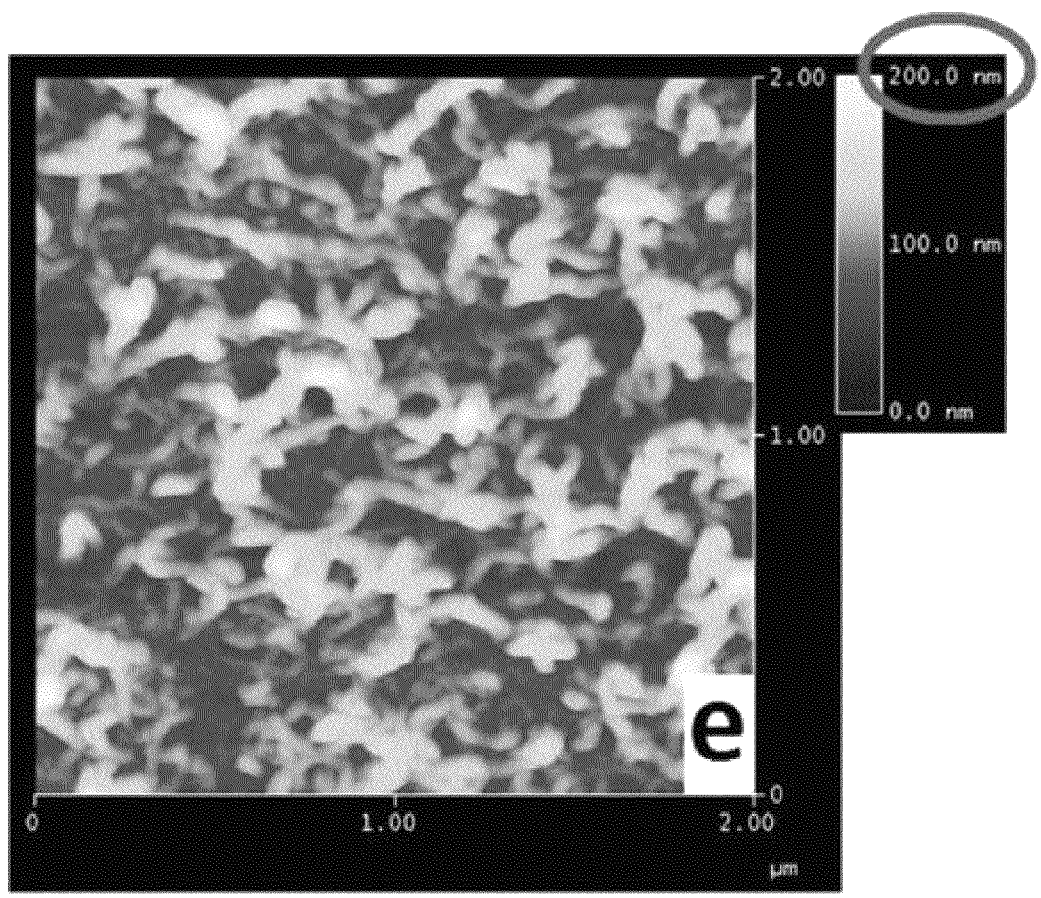
Figure 11F:
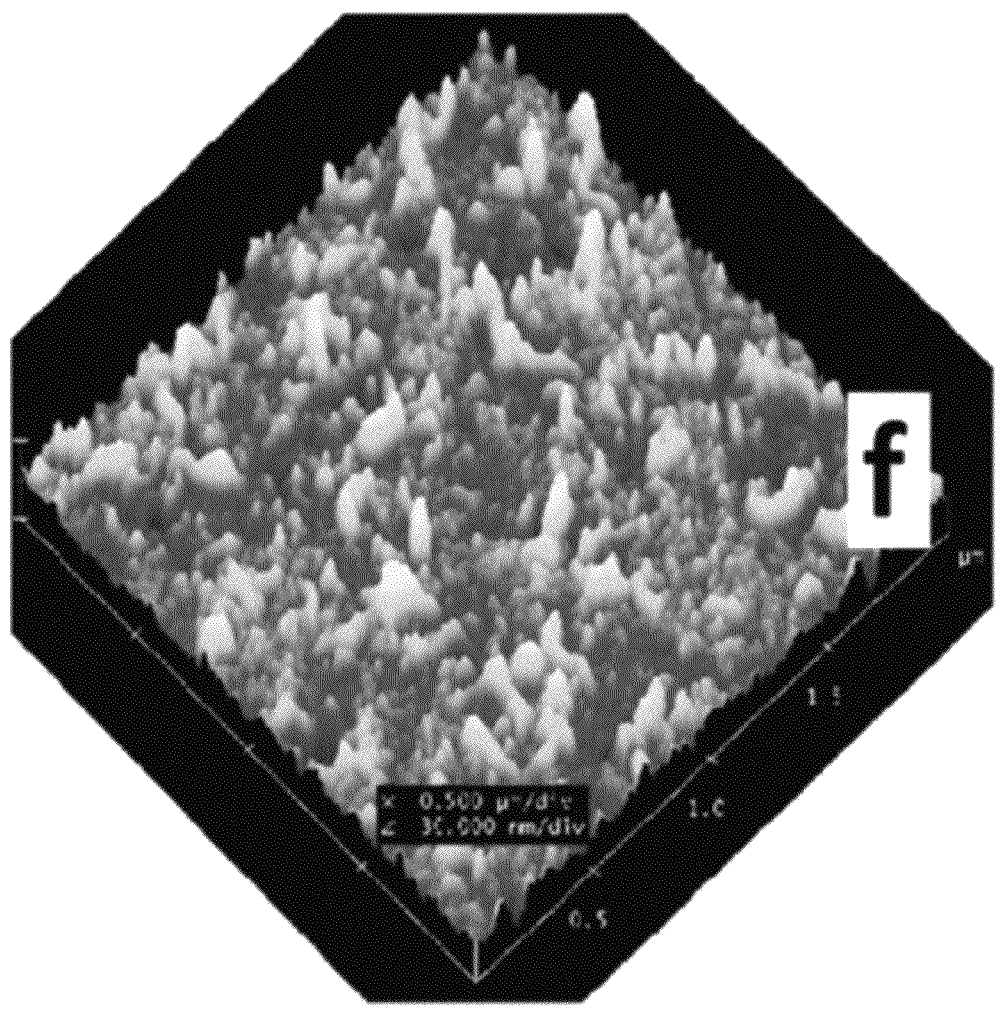
Figure 12A:
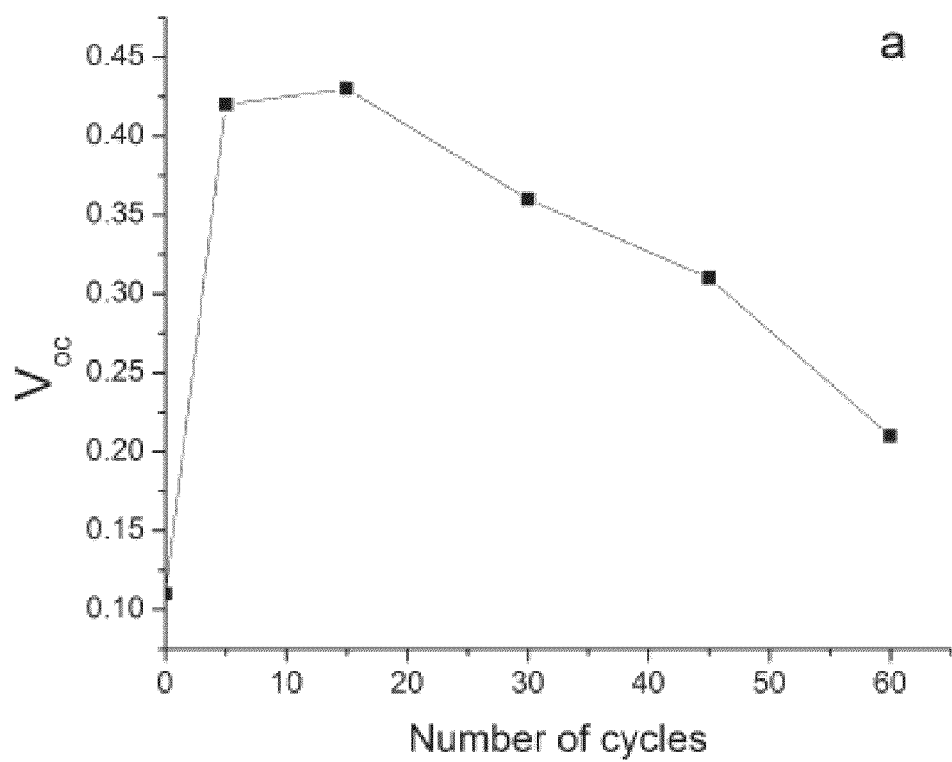
FIG. 12 shows performance of OPVd as a function of electrodeposited PEDOT layer thickness: (a) open-circuit voltage; (b) short-circuit current; (c) fill factor; and (d) overall efficiency.
Figure 12B:
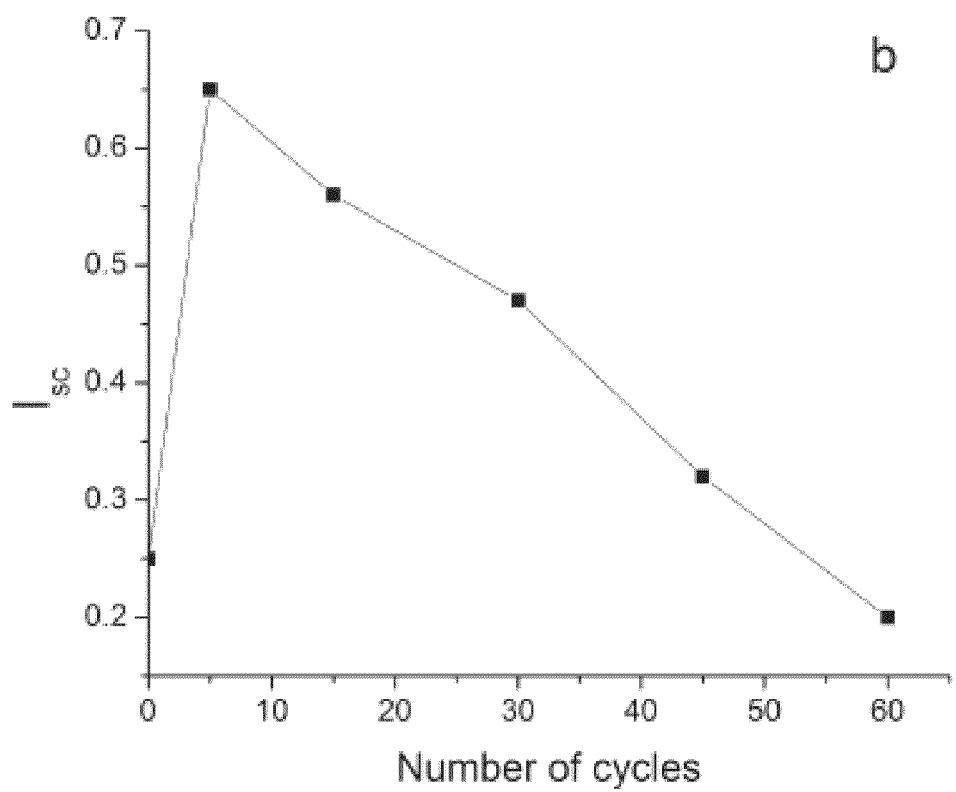
Figure 12C:
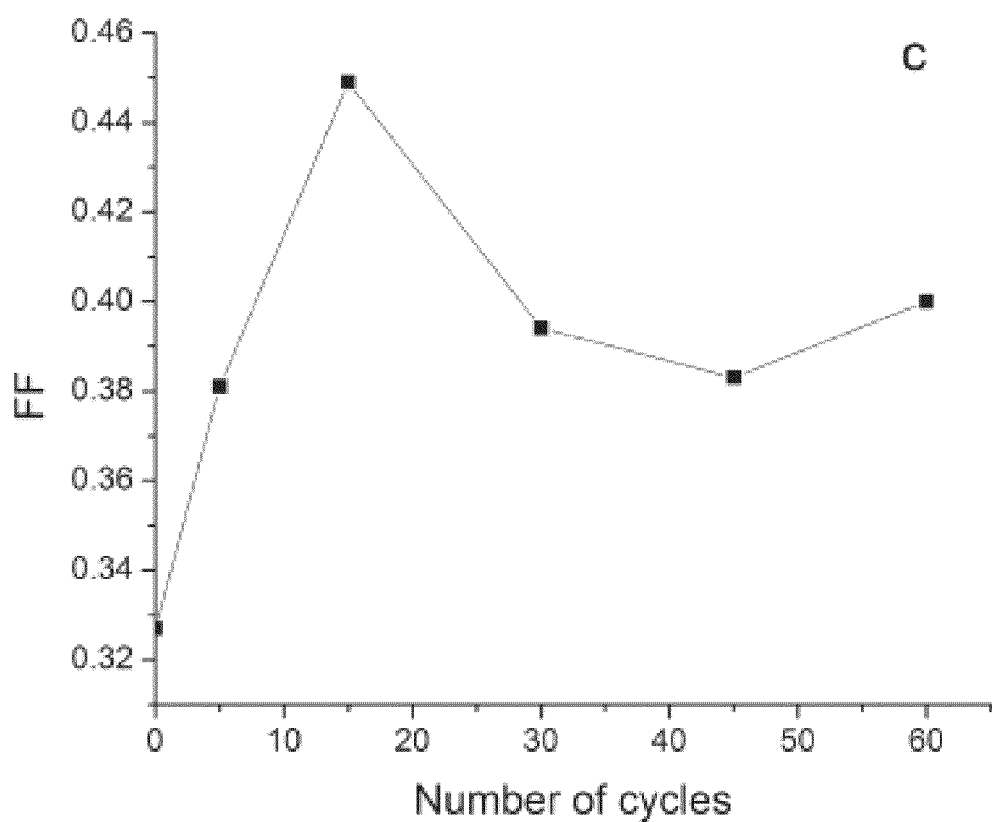
Figure 12D:
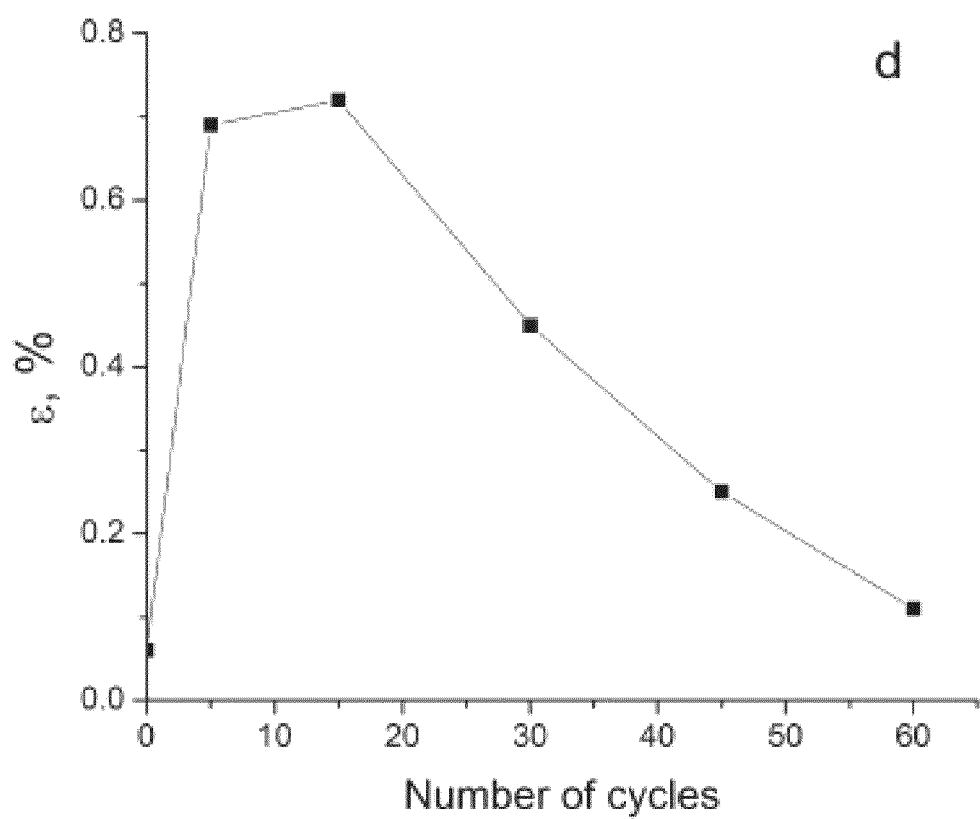

Morphology of both photoactive and hole extraction layers have critical effects on OPVd performance. Ideally, the interfacial area between the two layers should be maximized. At the same time the hole extraction layer should thoroughly cover the ITO surface. So, the layer should be dense inside and rough outside. However, roughness should be controlled in such a way that the photoactive layer deposited on top coats the hole extraction layer completely to avoid electrical pinning and, as a result, decreased open circuit voltage (Voc). Electrochemically polymerized PEDOT grows bottom-up and can potentially lead to this structure. PEDOT layers of different thicknesses were examined by AFM (see FIG. 11). Conspicuously, the observed morphologies were fibrillar which is not typical for electrochemically deposited PEDOT and probably a result of the mixed toluene/acetonitrile electrolyte solution usage. Such a nanostructure is of great interest because it not only has high surface area but also might improve hole mobility. Pristine ITO had flakelike morphology with a roughness of (10 nm (see FIG. 11a). After 5 CV cycles a thin layer of PEDOT was deposited (see FIG. 11b). This is a stage of nucleation and early growth. The layer consisted of small (about 20 nm) elongated particles. They covered the ITO surface densely and uniformly. The layer was so thin that contour of ITO flakes could still be seen. After 15 cycles tiny PEDOT fibers appeared (see FIG. 11c). They were randomly oriented increasing the roughness and porosity of the layer. At the same time, bigger fibers started to grow mostly upward. More of them appeared after 30 cycles (see FIG. 11d). The size distribution was wide, ranging from 20 to 50 nm. The final layer obtained after 45 cycles consisted of even bigger fibers, up to 100 nm in diameter, and roughness of (100 nm (see FIG. 11f). It can be concluded that size of the fibers and porosity increases consistently with growing thickness leading to higher surface area. It is important that there is still a dense PEDOT layer underneath.

TABLE A-1

Effect of the Electrodeposited PEDOT Thickness on the Performance of OPVd

| PEDOT thickness | $V_{oc}$, V | $I_{sc}$, mA | $V_{max}$, V | $I_{max}$, mA | FF | ϵ, % |
|---|---|---|---|---|---|---|
| 0 cycles | 0.11 | 0.25 | 0.06 | 0.15 | 0.327 | 0.06 |
| 5 cycles | 0.42 | 0.65 | 0.26 | 0.4 | 0.381 | 0.69 |
| 15 cycles | 0.43 | 0.56 | 0.3 | 0.36 | 0.449 | 0.72 |
| 30 cycles | 0.36 | 0.47 | 0.23 | 0.29 | 0.394 | 0.45 |
| 45 cycles | 0.31 | 0.32 | 0.19 | 0.2 | 0.383 | 0.25 |
| 60 cycles | 0.21 | 0.2 | 0.14 | 0.12 | 0.4 | 0.11 |

PEDOT layers of different thicknesses were incorporated as a hole extraction layer in photovoltaic devices. A standard P3HTPCBM bulk heterojunction photoactive layer was spin-coated from dichlorobenzene solution. The average parameters of the cells are shown in FIG. 12 and summarized in Table A-1. The control cell without a PEDOT layer (0 cycles) showed poor performance. Low Voc of 0.11 V and shape of I-V curves in dark clearly indicate significant electrical shortage. Apparently rough ITO flakelike surface causes pinning. Deposition of a thin dense PEDOT layer by 5 CV cycles prevented this shortage. As a result, Voc increased to 0.42 V, Isc went up to 0.40 mA, and overall efficiency reached 0.69%. A thicker layer deposited by 15 cycles showed even better performance, mainly because of the improved fill factor. The fill factor of 0.45 was measured, which is quite high for unannealed cells. Importantly, the layer protects well from shortage; I-V curves recorded in dark showed infinitely low current up to 0.4 V. With further increase in the thickness the performance dropped consecutively. As was seen in AFM, thick layers consisted of large fibers oriented randomly on the surface, increasing the roughness greatly and causing direct contact between PEDOT and Al electrode in some places. As a result, thicker layers have more pinning and poorer performance. Voc decreased down to 0.2 V for the layer deposited by 60 cycles. However, the fill factor did not decrease significantly and stayed on the level of 0.4. Apparently, superior characteristics of the layer deposited by 15 cycles come from unique morphology. PEDOT forms dense particles inside and tiny fibers outside so that the ITO surface is thoroughly coated and at the same time the PEDOT layer has high surface area for better contact with P3HT-PCBM photoactive layer. Despite high surface area the roughness stays on the level of (10 nm, preventing electrical pinning.

Figure 13A:
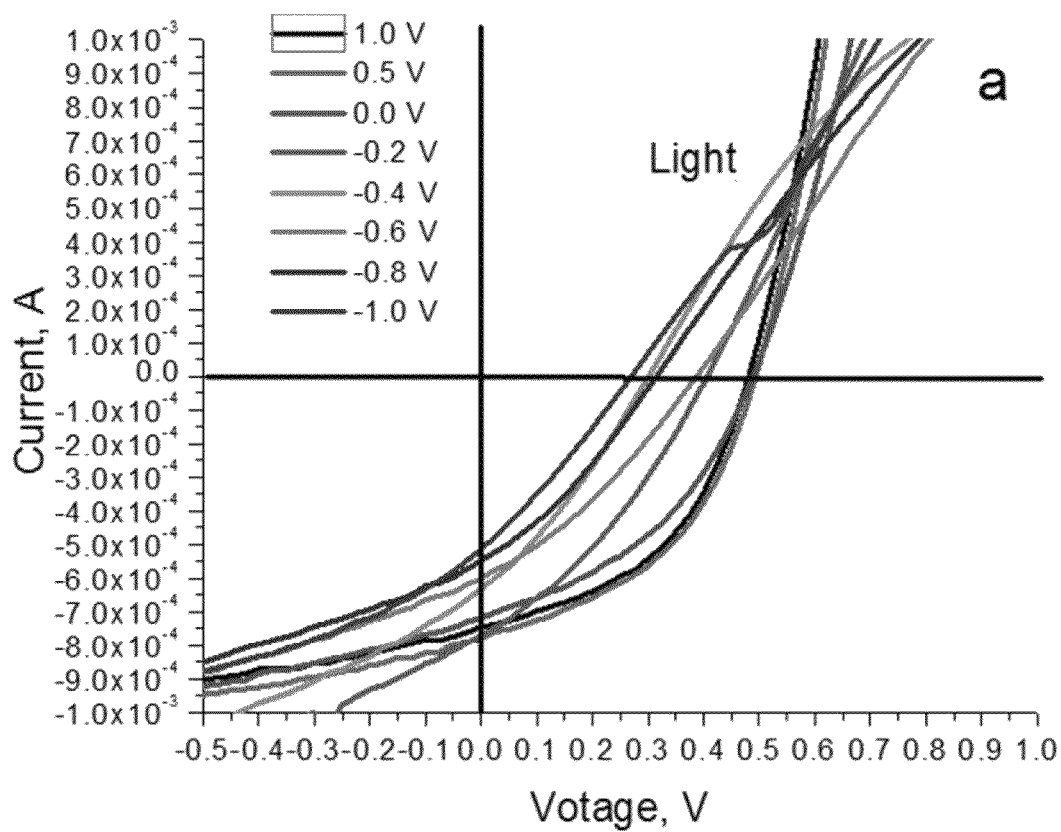
FIG. 13 are curves of photovoltaic cells with electrodeposited PEDOT layer recorded (a) under illumination and (b) in dark. PEDOT layer was treated at different potentials in 0.1 M TBAP.
Figure 13B:
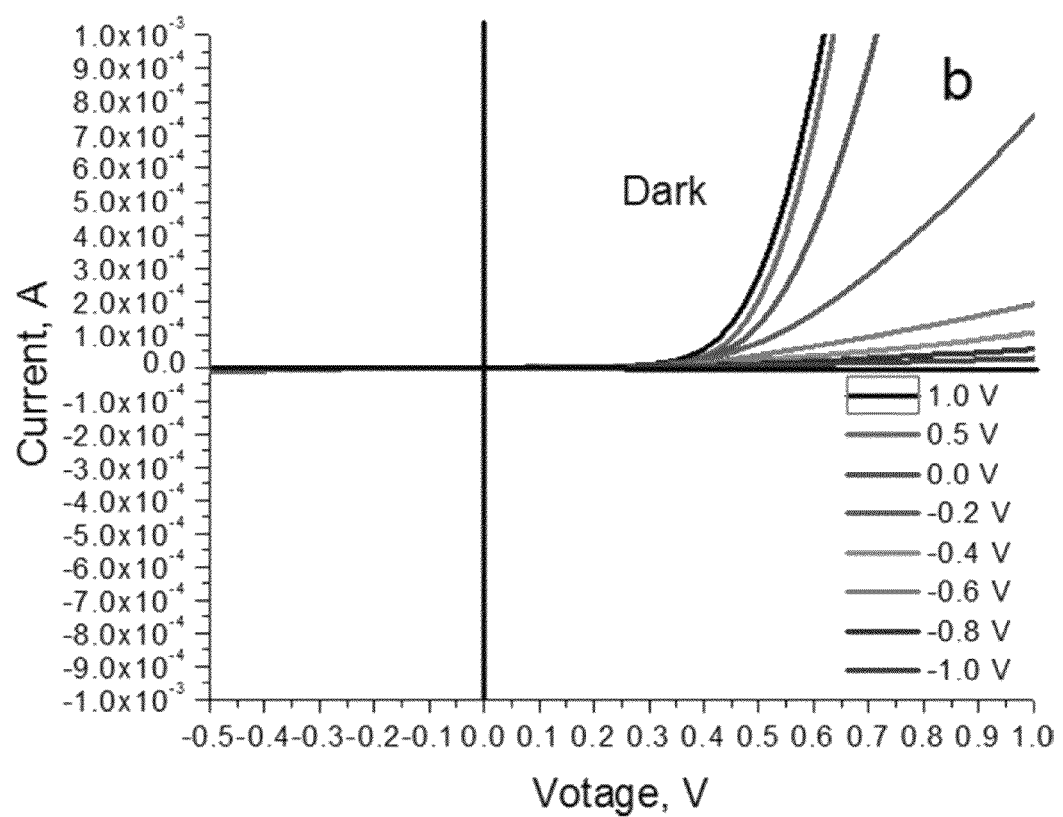

The doping level of PEDOT has a direct effect on both the electronic conductivity and the hole mobility. Electrochemistry is a simple and powerful way to control oxidation state and hence the doping level of PEDOT. By subjecting the layer to certain potentials, highly conductive metallic, bipolaron, polaron, neutral undoped, and even n-doped states can be achieved. As was shown earlier, a gradient dedoping happens in the −0.2 to −1.0 V range. Unfortunately, it is impossible to distinguish the transition between polaron and bipolaron states with either UV-vis-NIR or FTIR. However, there is a straight relation between the absorbance above 800 nm and the number of the charge carriers. PEDOT layers deposited by 15 cycles were post-treated by applying various potentials and were incorporated in photovoltaic cell. The reduced layers undergo oxidation in air. Oxidation kinetics are fast, and the equilibrium is reached within a couple hours for thin films. For this reason, reduced PEDOT layers were stored in Ar for no more than 12 h before being coated with P3HT-PCBM. Typical I-V curves for each potential are presented in FIG. 13, and all results are summarized in Table A-2. The layers subjected to a positive potential showed good performance. Cells with PEDOT layers fully oxidized at 1.0 or 0.5 V had slightly higher efficiencies than treated at 0.0 V, mainly because of higher fill factors. Starting from −0.2 V dedoping begins and all parameters were decreased, especially Voc and fill factor. It is interesting that a significant drop was observed even at early stage of dedoping when transition to polaron-bipolaron state happened. Therefore, fully oxidized PEDOT layers in metallic state are preferable for photovoltaic application. Overall power conversion efficiency was found to be proportional to conductivity of the cell, which is slope of the I-V curve recorded in dark above diode on-voltage (see FIG. 13b). A higher doping level increases both the electronic conductivity and the hole mobility. Obviously, in the fully oxidized state, the PEDOT layer has the maximum amount of charge carriers, resulting in better hole transporting properties and thus improved performance of solar cell.

TABLE A-2

Effect of Post-treatment Potential on the Performance of OPVd

| potential, V | $V_{oc}$, V | $I_{sc}$, mA | $V_{max}$, V | $I_{max}$, mA | FF | ϵ, % |
|---|---|---|---|---|---|---|
| 1.0 | 0.46 | 0.75 | 0.32 | 0.51 | 0.473 | 1.09 |
| 0.5 | 0.48 | 0.77 | 0.33 | 0.51 | 0.455 | 1.12 |
| 0.0 | 0.49 | 0.73 | 0.31 | 0.48 | 0.416 | 1.49 |
| −0.2 | 0.41 | 0.76 | 0.23 | 0.46 | 0.340 | 1.00 |
| −0.4 | 0.31 | 0.65 | 0.16 | 0.35 | 0.278 | 0.37 |
| −0.6 | 0.37 | 0.60 | 0.21 | 0.35 | 0.331 | 0.49 |
| −0.8 | 0.30 | 0.55 | 0.16 | 0.34 | 0.33 | 0.36 |
| −1.0 | 0.26 | 0.52 | 0.13 | 0.28 | 0.269 | 0.24 |

Figure 14:
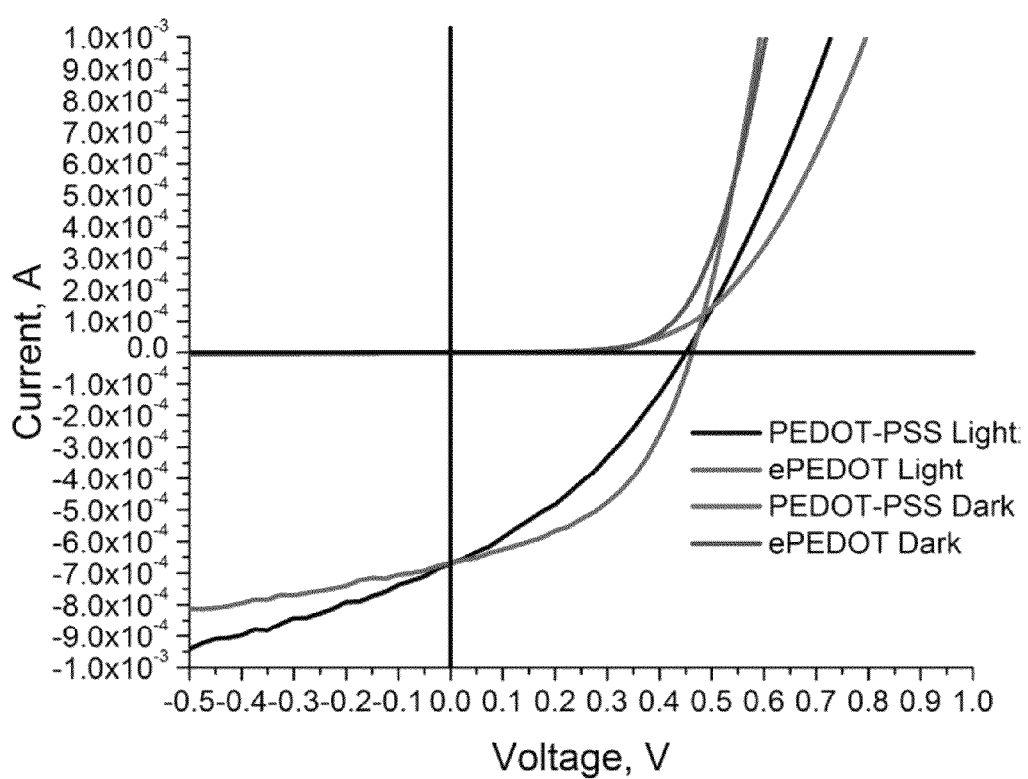
FIG. 14 are I-V curves of photovoltaic cells with spin-coated PEDOT-PSS and electrochemically deposited PEDOT.

PEDOT-PSS spin-coated from aqueous solution is a traditional hole extraction layer in OPVd. It is pertinent to compare it to electrochemically deposited PEDOT. The layer deposited by 15 cycles was taken as the most efficient. The thickness of PEDOT-PSS can be controlled by changing the speed of spincoating. It was found out that the layer spin-coated at 1500 rpm had the same absorbance in the NIR region as PEDOT layer deposited electrochemically by running 15 cycles, so both layers had equal thickness (strictly speaking, the amount of PEDOT per square area as density is different). Also, for the proper comparison, several cells were prepared and stored under the same conditions; all the cells were coated with P3HT-PCBM and tested at the same time. Typical I-V curves are shown in FIG. 14. Both cells showed the same Voc=0.45 V and Isc=0.68 mA. Importantly, the fill factor and thus efficiency were much improved in the case of electrochemically deposited PEDOT. For PEDOT-PSS layers the fill factor was calculated as 0.361±30 ($\sigma_{0.95}$) while for electrochemically deposited PEDOT the value was 0.466±34 ($\sigma_{0.95}$), which is 30% higher. Apparently, the reason is the higher hole mobility of pure electrodeposited PEDOT. Insulating PSS brings resistivity to the composite slowing the transport. When comparing formulations of PEDOT-PSS composites as hole extraction layers in OPVd with a P3HT-PCBM intrinsic layer, higher fill factor was achieved for more conductive compositions enriched with PEDOT. Another advantage and possible reason for better performance of electrochemically grown PEDOT is better adhesion and electrical contact with the ITO electrode. Generally speaking, electrochemically deposited PEDOT layers decrease the series resistance of the cell which has a direct effect on fill factor.

Annealing of electrodeposited PEDOT layer was found to have little effect. Slight decrease in Voc and fill factor was observed for cells annealed above 160° C.

It is well-known that the annealing of P3HT-PCBM intrinsic layer has drastic effect on the performance of the OPVd. In the present study all the work was done on nonannealed cells.

The reason is that the annealing process is sensitive to conditions applied, and sometimes results are not reproducible. Low efficiency of about 1% measured in the study is common for nonannealed cells. Annealing conditions are widely discussed in the literature, and the efficiency can be increased up to 5%. As an example, the annealing of the cell at 100° C. for 15 min after Al evaporation doubled the efficiency mainly by significant improvement in the current. Open-circuit voltage (Voc) of 0.50 V, short-circuit current (Isc) of 9.7 mA/cm2, fill factor (FF) of 0.46, and overall efficiency (∈) of 2.2% were calculated. Further gain in the efficiency can be raised from the better annealing conditions, optimization of the P3HT-PCBM layer thickness, and purity of materials/cell fabrication technique.

PEDOT layers of different thicknesses were successfully deposited on ITO surfaces by cyclic voltammetry. The morphology of the layer was observed to change with the growing thickness. PEDOT formed a dense layer of elongated particles at the early deposition stage, which later developed into fibers. The size of the fibers and the porosity of the surface increased for thicker layers. PEDOT was incorporated into photovoltaic devices as a hole extraction layer. The best performance was achieved for moderate thickness when PEDOT formed tiny fibers about 20 nm in diameter, resulting in a high surface area and better contact with intrinsic P3HT-PCBM layer. Electrodeposited PEDOT was compared to a traditional spin-coated PEDOT-PSS layer of equivalent thickness. Significant improvement of fill factor (30%) was observed which was attributed to higher hole mobility of pure PEDOT and possibly better electrical contacts.

Redox state of the polymer was controlled by applying certain post-treatment potential and was monitored by UV-vis-NIR and FTIR-GA spectroscopy. The doping level was found to have a significant effect. The best performance was observed for fully oxidized PEDOT due to a larger number of charge carriers.

An electrochemical approach eliminates solubility problems and allows deposition of a pure PEDOT layer. As a result, higher conductivity provides superior hole transporting properties over traditional PEDOT-PSS. In addition, electrochemistry is a powerful technique to control thickness, morphology, and redox state of the layer. Electrochemical PEDOT deposition can be beneficial economically in large-scale production since it combines polymerization and deposition into one step. The starting material is an inexpensive monomer which is efficiently converted into a functional polymer layer.

Illustrative Embodiment B—Electrochemical codeposition of poly(thieno[3,2-b]thiophene) and fullerene to construct a bulk heterojunction organic photovoltaic device (OPVd)

In this embodiment, a bulk heterojunction OPVd was prepared fully electrochemically from mixed toluene/acetonitrile solvent. PEDOT was deposited first as hole extraction layer. PTT and $C_{60}$ were codeposited on top acting as the photoactive layer. High fullerene content was achieved by using trace amount of fullerene epoxide. Composition of the layer was altered by changing potential range and gradient deposition was performed.

Experimental. Indium tin oxide (ITO) coated glass slides, $R_s$=5-15 ohms, 7×50×0.7 mm, were ordered from Delta Tech., Inc. Custom-made ITO glasses for solar cell fabrication, $R_s$=15 ohms, 25×25×0.7 mm, were purchased from Luminescence Technology Corp. 3,4-Ethylenedioxythiophene (EDOT), thieno[3,2-b]thiophene (TT), fullerene ($C_{60}$), tertabutylammonium perchlorate (TBAP), anhydrous toluene, anhydrous acetonitrile were purchased from Sigma-Aldrich and used as received. meta-Chloroperoxybenzoic acid (75%), technical grade, was received from Aldrich and purified by washing in pH 7.5 phosphate buffer. Millipore deionized (DI) water was used in the experiments.

Fullerene epoxide was prepared by oxidation of fullerene with meta-chloroperoxybenzoic acid. A solution of m-chloroperoxybenzoic acid (135 mg, 0.79 mmol) in toluene (15 mL) was added with stirring to a heated solution of fullerene (20 mg, 0.026 mmol) in toluene (15 mL) at 80° C. The mixture was stirred for 1 h at 80° C. After being cooled the brown solution was evaporated to dryness under vacuum. The resulting brown solid was washed with two 4-mL portions of methanol, filtered and washed again with methanol.

The electrochemical deposition and characterization were done using a model 660D workstation (CH Instruments, Inc., TX). Morphological studies were performed by Nanoscope IIIa Atomic Force Microscope (AFM) (Veeco, Inc., CA). UV-Vis-NIR spectra were recorded with a UV-3101PC spectrophotometer (Shimadzu Scientific Instruments, Inc., MD). The solar cell testing was done using Keithley 2400 source meter (Keithley Instruments, Inc., OH) and standard AM 1.5 solar simulator, 100 mW/cm$^2$ (Newport, Inc., CA); aluminum cathode was evaporated in an Angstrom Engineering vacuum deposition system at pressure below 2·10$^{-6}$ Torr.

Before the deposition, ITO working electrodes were cleaned by sonicafication for 30 min in 20% aqueous ethanolamine solution followed by intensive rinsing in DI water. All electrochemical experiments were done using a three-electrode configuration. PEDOT hole extraction layer was polymerized from 5.0 mM EDOT monomer solution in toluene/acetonitrile (4:1 by volume) in the presence of 0.1 M TBAP supporting electrolyte. The deposition was typically done by running 30 cycles at 100 mV/s sweeping rate from 0.0 to +1.1 V vs Ag/AgNO$_3$ reference electrode (+0.47 V vs SHE) keeping a distance of 1.0 cm between the working and platinum wire counter electrodes. After that the electrodes were washed in acetonitrile and dried in nitrogen gas stream. PEDOT coated ITO slides were stored in air.

The second step was the codeposition of poly(thieno[3,2-b]thiophene) (PTT) and fullerene on top of the PEDOT layer. Complex electrolyte solution consisted of 5.0 mM TT, 0.30 mM $C_{60}$, 0.02 mM $C_{60}$O and 0.1 M TBAP in the same toluene/acetonitrile solvent was used. The solution was sonicated for 1 hour to ensure fullerene was completely dissolved. Codeposition was done by cyclic voltammetry at 100 mV/s sweeping rate. The lower potential was in the range of −1.2 to −1.4 V while the higher potential was kept in the +1.2 to +1.4 V range. Selection of the potentials governed composition of the codeposited layer while number of cycles its thickness. After deposition the electrode was subjected to 0.0 V until current dropped to negligibly low value. Thus prepared PTT-$C_{60}$/PEDOT/ITO electrode was washed several times in acetonitrile to remove the electrolyte salt and the monomer residues. The samples were dried and stored in air.

Figures 15A, 15B:
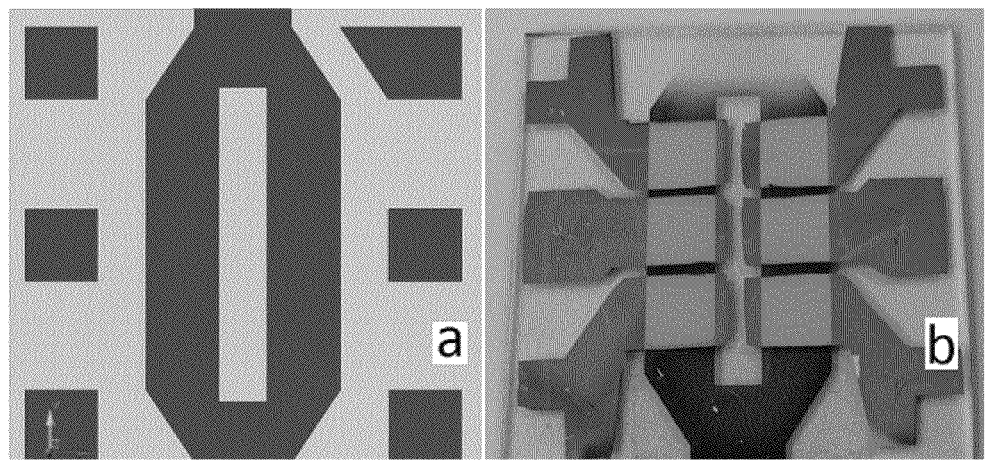
FIG. 15 shows (a) schematic representation of the ITO coated glass slide used for the OPVd fabrication, and (b) photographic image of the final OPVd.

The technique described above was used for the OPVd fabrication. The layers were deposited on the custom designed ITO coated glass. The ITO slides were intensively wiped with cotton swab to remove small particles adhered to ITO surface. After that the slides were sonicated in Kleensonic solution (Ted Pella, Inc.) for at least 30 min before being rinsed in DI water. ITO cleaning step is critical in solar cell fabrication and was controlled by optical microscope. Design of the ITO slide and final OPVd are shown in FIG. 15. For better accuracy of measurement there were 6 individual cells on each slide. Al cathode (60 nm) was vacuum evaporated through the shadow mask at 1 nm/s rate.

Results. The solar cell consists of 3 components: first the hole transporting PEDOT and then PTT-$C_{60}$ mixture codeposited on top of it. There are number of requirements for the fabrication process. It is critical that the PTT deposition does not interfere with the fullerene deposition as well as that both have no destructive effect on PEDOT layer underneath. Also, PTT should be in its reduced neutral state while PEDOT in oxidized. These conditions are necessary for the performance of the solar cell. In addition, the goals are to control composition of the layers, achieve bicontinuous PTT-$C_{60}$ network and create good electrical contacts between the layers and the electrodes. So, electrochemical codeposition of the layers is quite a delicate process. The complexity was first split to simpler depositions for better control and characterization before moving to the final device fabrication.

Figure 16A:
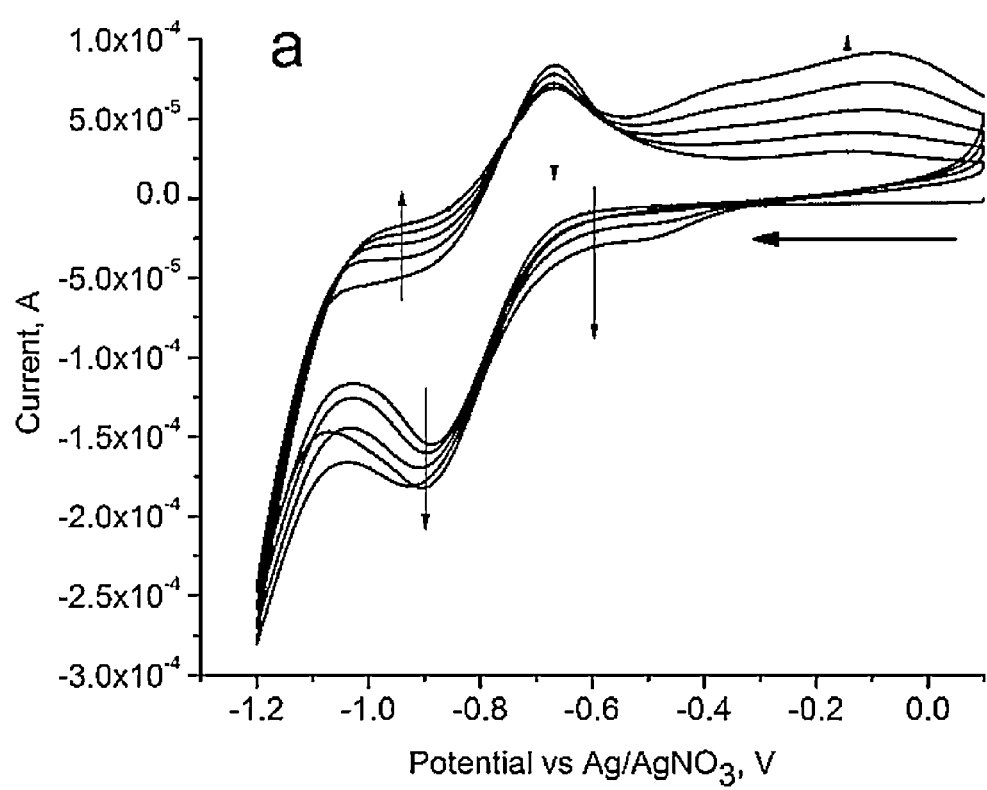
FIG. 16 shows: (a) CV of fullerene electrodeposition from 0.30 mM $C_{60}$, 0.02 mM $C_{60}O$ solution; (b) CV of PTT electrodeposition from 5.0 mM TT; and (c) CV of PTT-$C_{60}$ codeposition from 0.30 mM $C_{60}$, 0.02 mM $C_{60}O$, 5.0 mM TT solution. Electrolyte 0.1 M TBAP in toluene/acetonitrile (4:1, volume). Scan rate 100 mV/s.

Deposition of fullerene. The electrochemical deposition of fullerene films from solution has high practical importance due to numerous applications of fullerene in electronics. Although fullerene can be dissolved in aromatic solvents such as 1-chloronaphthalene, 1,2-dichlorobenzene or toluene the electrodeposition represents a challenge. Upon reduction fullerene molecule takes up to four electrons. However, these charged species stay in the solution and no film forms. Addition of fullerene epoxide to the fullerene solution induces deposition of layer on electrode surface. It was shown that the radical mechanism involves formation of covalent bonds between the fullerene molecules, so the layer is attributed to insoluble polyfullerene. Thin fullerene layers were deposited by CV. Typically the potential was scanned from +0.2 to −1.2 V starting at +0.2 V (FIG. 16a). For the first cycle cathodic peak at −0.9 V and corresponding anodic peak at −0.65 V were observed. The peaks correspond to the $C_{60}/C_{60}^-$ transition in the solution. The cathodic peak increased with consecutive cycling while the anodic decreased. At the same time the anodic current around −0.9 V increased. In addition, new pair of peaks appeared: cathodic at −0.5 V and anodic at −0.1 V. Such a complex behavior is explained by electrodeposition of the fullerene layer. The electrochemical behavior of solid fullerene films is quite different from solution. So, appearance of the new peaks corresponds to redox activity of the layer which overlaps with solution activity.

Figure 17:
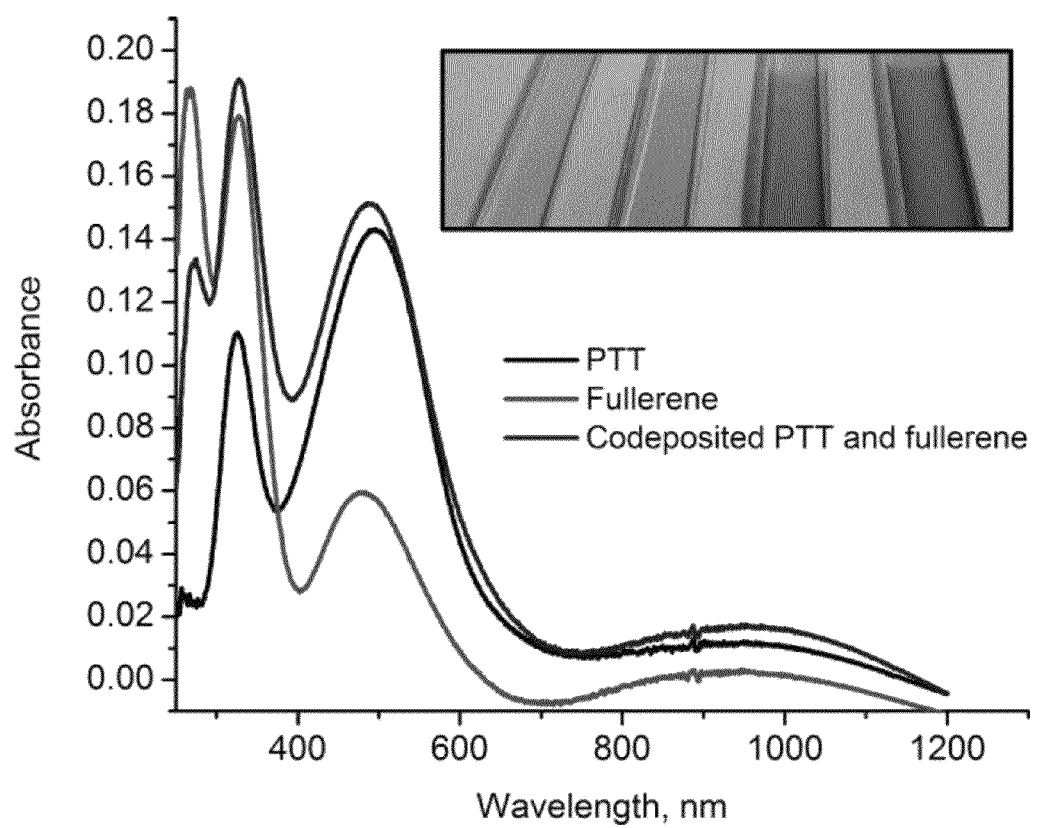
FIG. 17 shows UV-Vis-NIR spectra of $C_{60}$, PTT and PTT-$C_{60}$ layers. All deposited on ITO by running 5 cycles. Insert: photographic image of the layers, from left to right: bare ITO, $C_{60}$, PTT, PTT-$C_{60}$.

The fullerene layer was deposited on transparent ITO glass electrode so that the UV-Vis spectrum could be recorded (FIG. 17). In addition to a sharp absorbance at 330 nm which is characteristic for fullerene in solution, three other peaks at 265, 480 nm and 950 nm appeared. Broad absorbance in 400-600 nm range was attributed to formation of fullerene clusters deposited from salt free fullerene solution by applying 100-200 V DC. A well-defined peak at 480 nm together with absorbance at 950 nm apparently relates to a conjugated polymeric nature of the fullerene layer.

Figure 18A:
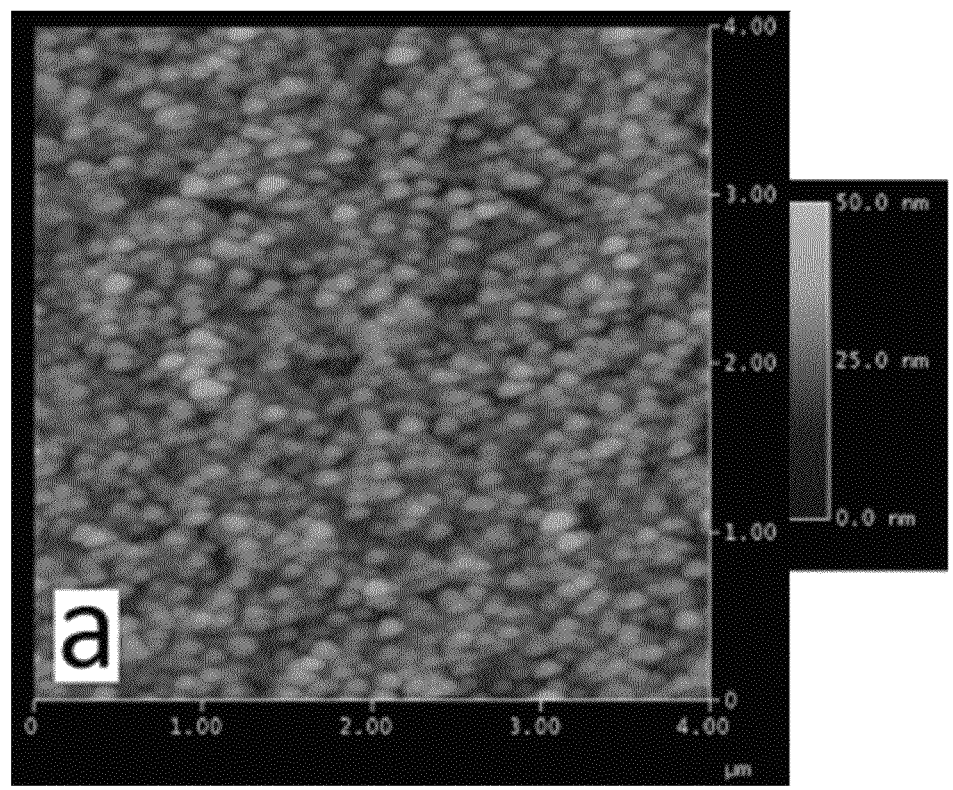
FIG. 18 shows AFM image of the deposited: (a) $C_{60}$; (b) PTT; (c) PTT-$C_{60}$ layer; and (d) PTT-$C_{60}$ layer in friction mode. Height scale is the same for the images (a)-(c).

Electrodeposition resulted in shiny yellow film well adhered to ITO surface (FIG. 17 insert). AFM image of the layer deposited by running 5 cycles is shown in FIG. 18a. The layer was uniform with the roughness of ±20 nm. As can be seen size distribution of the particles was narrow, the average diameter was 100 nm. With a growing thickness, the layer became rougher and the particles became larger, so that after 15 cycles the diameter was measured as 200 nm.

Figure 16B:
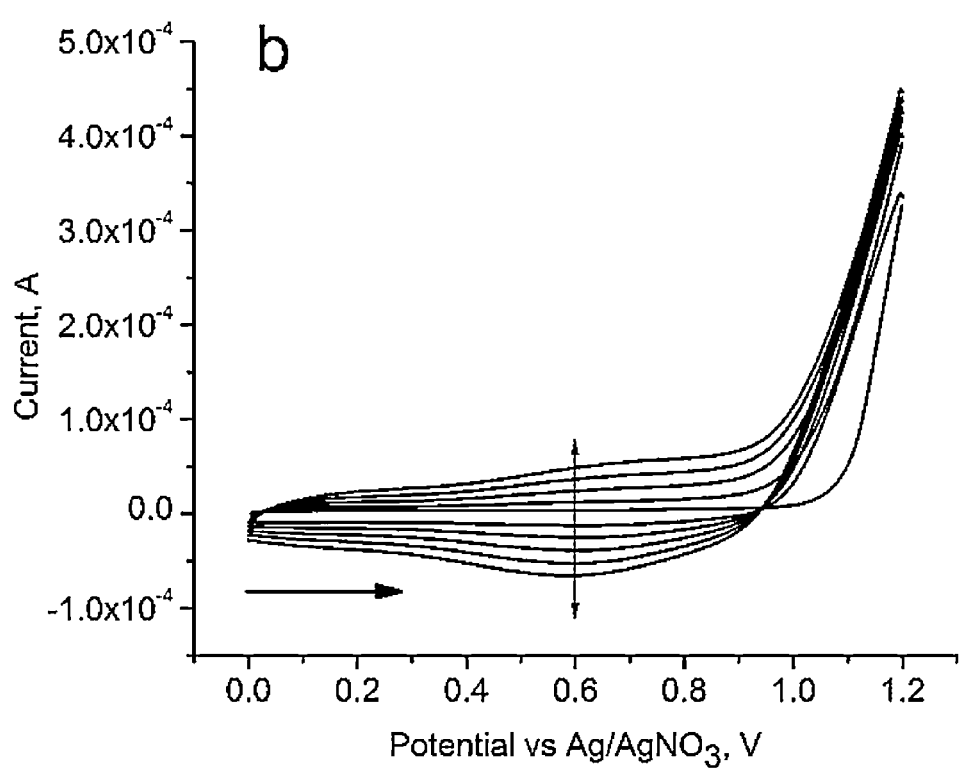

Deposition of poly(thieno[3,2-b]thiophene). Thieno[3,2-b]thiophene molecule is comprised of two thiophene rings fused together. Cooperative delocalization of π-electrons significantly lowers polymerization potential compared to an unsubstituted thiophene. Also, the symmetrical structure of the monomer ensures regioregularity of the polymer. So, electrochemical polymerization of TT should lead to the polymer with less defects in the backbone and extended conjugation length. The polymerization was shown to happen at the potential above +1.1 V (FIG. 16b). A considerable difference in peak currents at +1.1 V between the first and the second cycles indicates that early nucleation stage brought induction period to the polymerization, which is common for conjugated polymers. For the following cycles the current grew consecutively in the whole range as the growing PTT layer contributed to the redox activity. Broad cathodic peak at +0.6 V corresponds to the transition of the polymer from the reduced to the doped oxidized state. The anodic counterpart did not show a peak due to the relatively fast scan rate. The final potential was set to 0.0 V so that the as deposited layer was in its fully reduced state.

UV-Vis spectrum of the PTT film deposited by running 5 cycles is shown in FIG. 17. Two peaks at 495 and 325 nm together with broad weak absorbance around 950 nm were observed. The first is characteristic for polythiophenes and corresponds to π-π* excitation. It is natural that PTT spectrum is similar to fullerene since there is long conjugation of double bonds in both structures. The difference comes from absence of 265 nm peak and slight shift of other peaks.

Figure 18B:
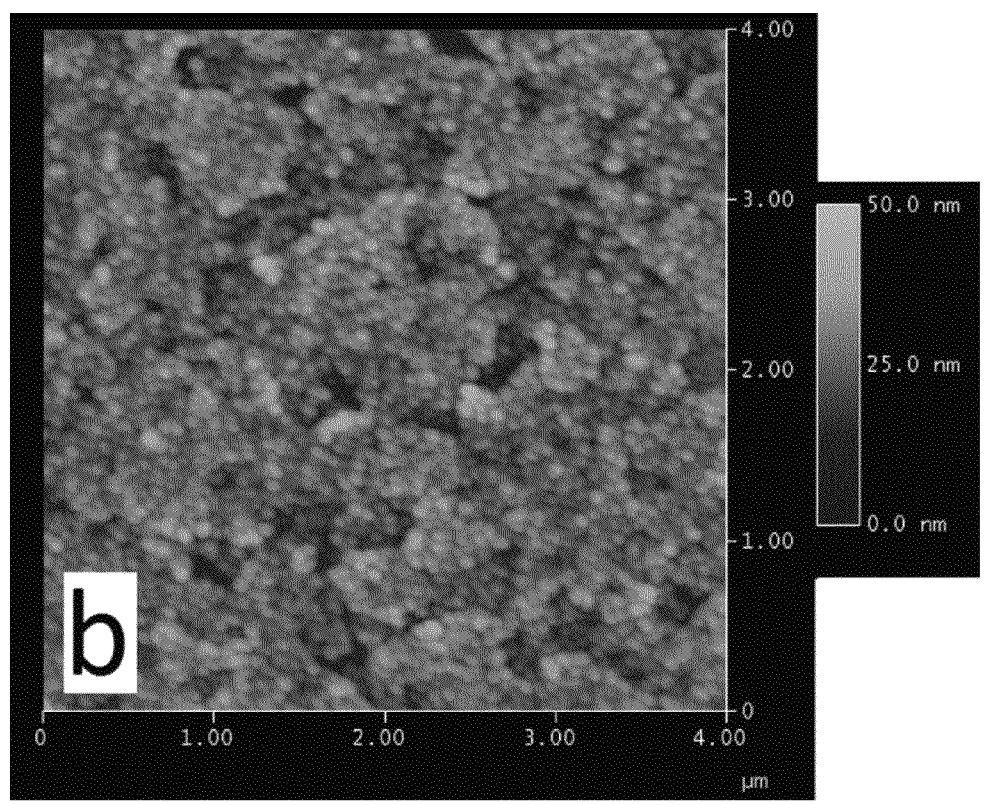

The deposited PTT layer had red color and coated the ITO surface thoroughly (FIG. 17 insert). AFM image is shown in FIG. 18b. PTT formed a uniform layer of round-shaped particles about 50 nm in diameter. The layer was dense with a relatively low roughness of ±20 nm.

Figure 16C:
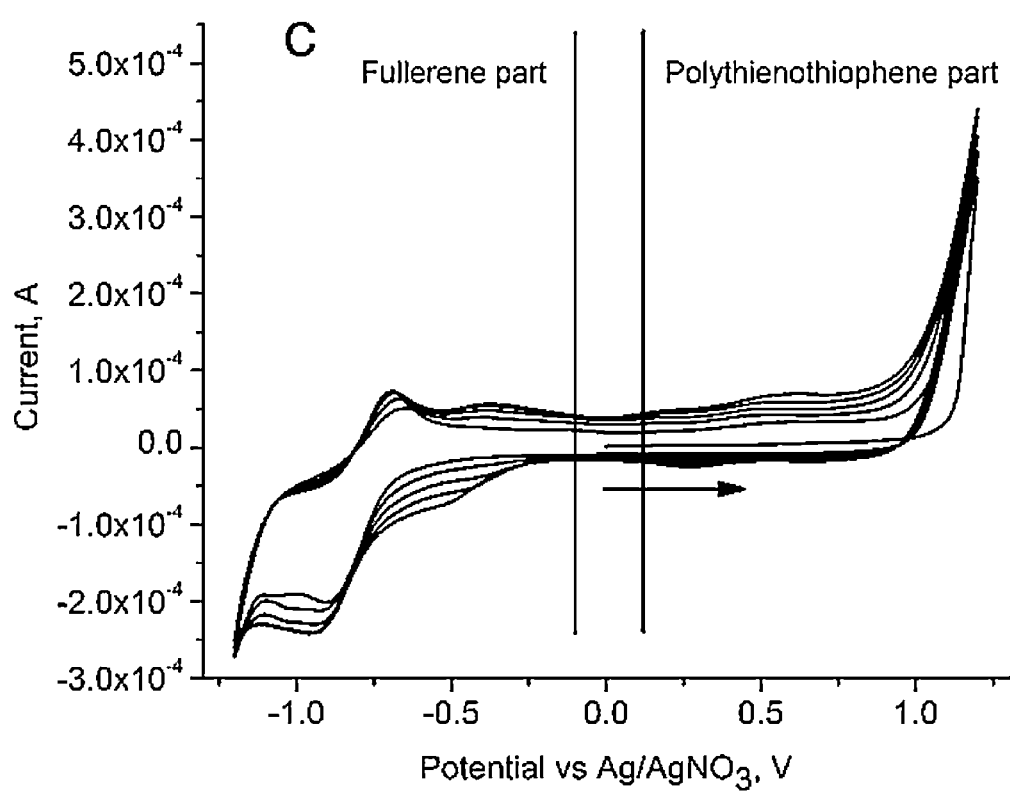

Codeposition of fullerene and poly(thieno[3,2-b]thiophene) on ITO. Codeposition was done by combining the two techniques described above keeping concentrations and all the other conditions the same. 5 cycles from −1.2 to +1.2 V were run starting at 0.0 towards positive potential (FIG. 16c). It is clear that voltammogram can be divided into two parts corresponding to individual depositions. Fullerene layer is inert at positive potentials while the negative potential used for the fullerene deposition is not low enough to induce n-doping of the PTT layer. So, the codeposition voltammogram is nothing else but sum of voltammograms shown in FIGS. 16a and 16b. It is important that despite PTT was in its reduced non-conductive state at negative potentials, the deposition of fullerene could still be possible. This is an indirect proof that fullerene formed a continuous network and sustained conductivity of the layer. There was no destructive electrochemical interference and both components were successfully codeposited.

UV-Vis spectrum of the layer deposited by running 5 cycles is shown in FIG. 17. The spectrum represents addition of one component to another. Peaks at 265, 330, 490 nm as well as absorbance at 950 nm were recorded. Unlike for fullerene, the ratio of the first two peaks was not 1:1. Higher absorbance at 330 nm indicated PTT contribution. Also, the peak at 490 nm was located between the 480 and 495 nm peaks observed for pure fullerene and PTT. However, absorbance of the codeposited layer was less than algebraic sum of the pure components deposited by running the same 5 cycles. Apparently there is some mutual inhibition without any unwanted degradation.

Figure 18C:
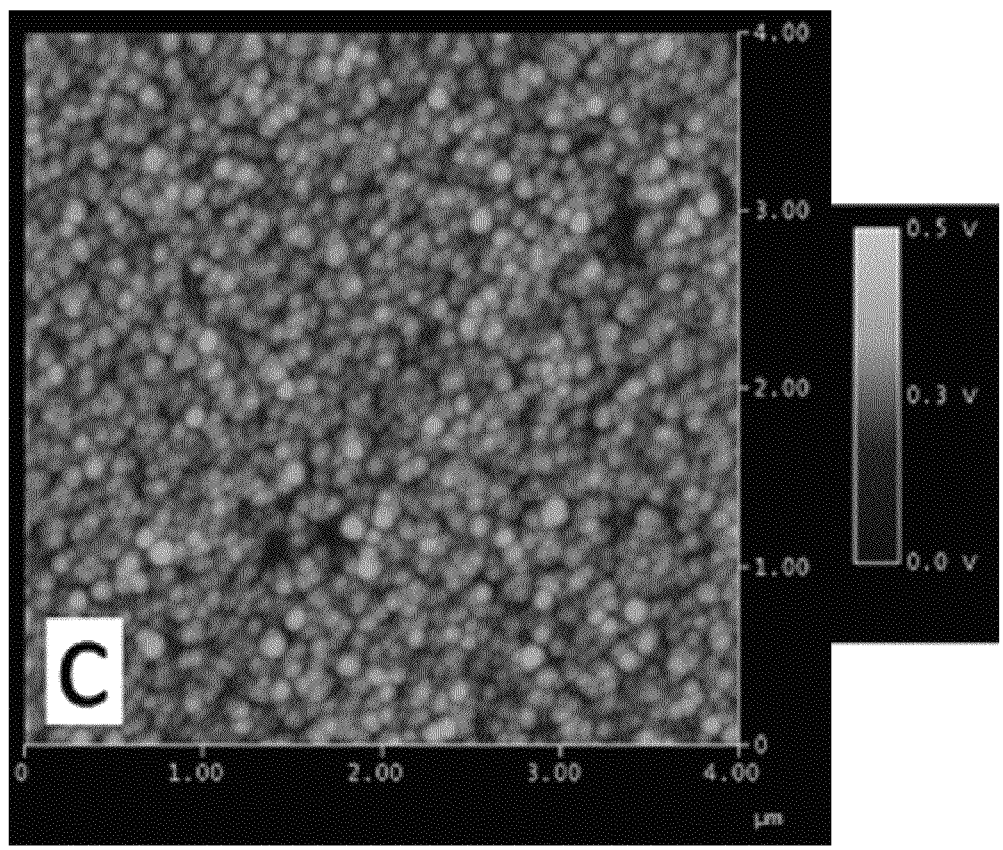
Figure 18D:
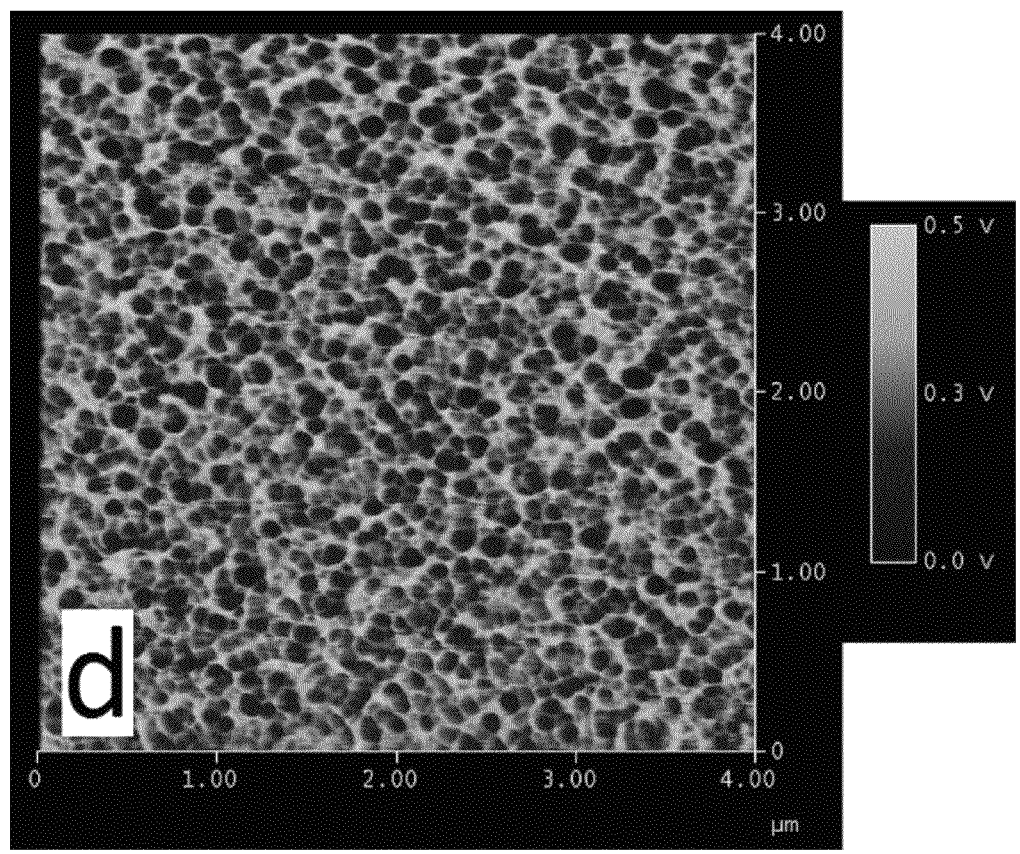

Morphology of the codeposited layer was also consistent with the AFM results discussed above: particles ranging from 50 to 100 nm in diameter were formed (FIG. 18c). Phase separation was studied in the friction mode (FIG. 18d). Fullerene as harder material represents dark areas, while PTT bright. There is homogeneous distribution of the two components. More importantly, they form interpenetrating bicontinuous network which is desired for efficient charge transport in the OPVd.

Electrochemistry is a powerful tool to control not just the amounts of the deposited materials but also the composition.

Figure 19A:
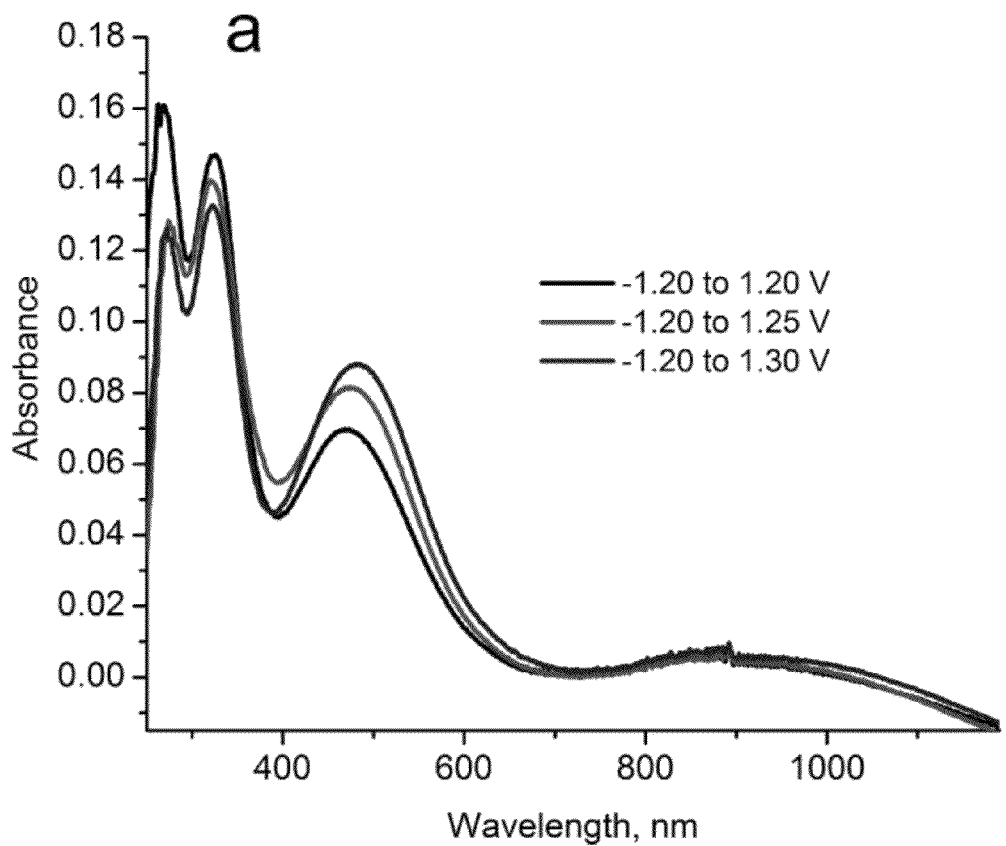
FIG. 19 shows UV-Vis-NIR spectra of the PTT-$C_{60}$ layers deposited at various potential ranges: (a) Shift to higher positive potential for enriched PTT content; and (b) shift to lower negative potential for enriched fullerene content.
Figure 19B:
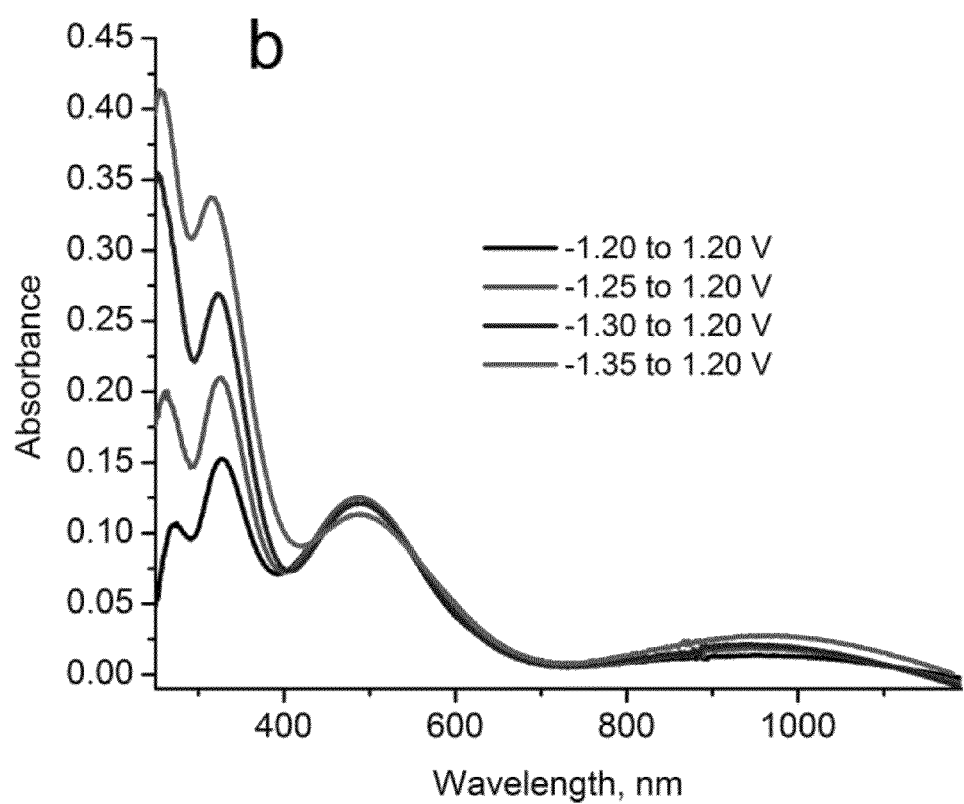

The composition can be altered either by changing the concentration of the monomers in the solution or the settings of the electrochemical technique such as the deposition time and the applied potential. PTT and fullerene were codeposited by CV and it was found that the composition was sensitive to the potential range. When potential was cycled up to higher positive value more PTT was deposited (FIG. 19a). So, as a result of upper potential change from +1.20 V to +1.30 V $\pi$-$\pi$* peak grew significantly with a bathochromic shift. In addition, a slight suppression of the fullerene deposition was observed as the peak at 265 nm decreased. On the other hand, cycling to the lower negative potential increased the fullerene content (FIG. 19b). A shift of the lower potential from −1.2 down to −1.35 V caused drastic increase in the UV absorbance with a growing input of the characteristic fullerene peak. Potential limits were found as a more effective way to control the composition comparing to the monomer concentration. Doubling of the TT concentration did not provoke significant increase in PTT content. The used 0.30 mM fullerene concentration was already close to the solubility limit due to the low solubility of the fullerene.

Figure 20:
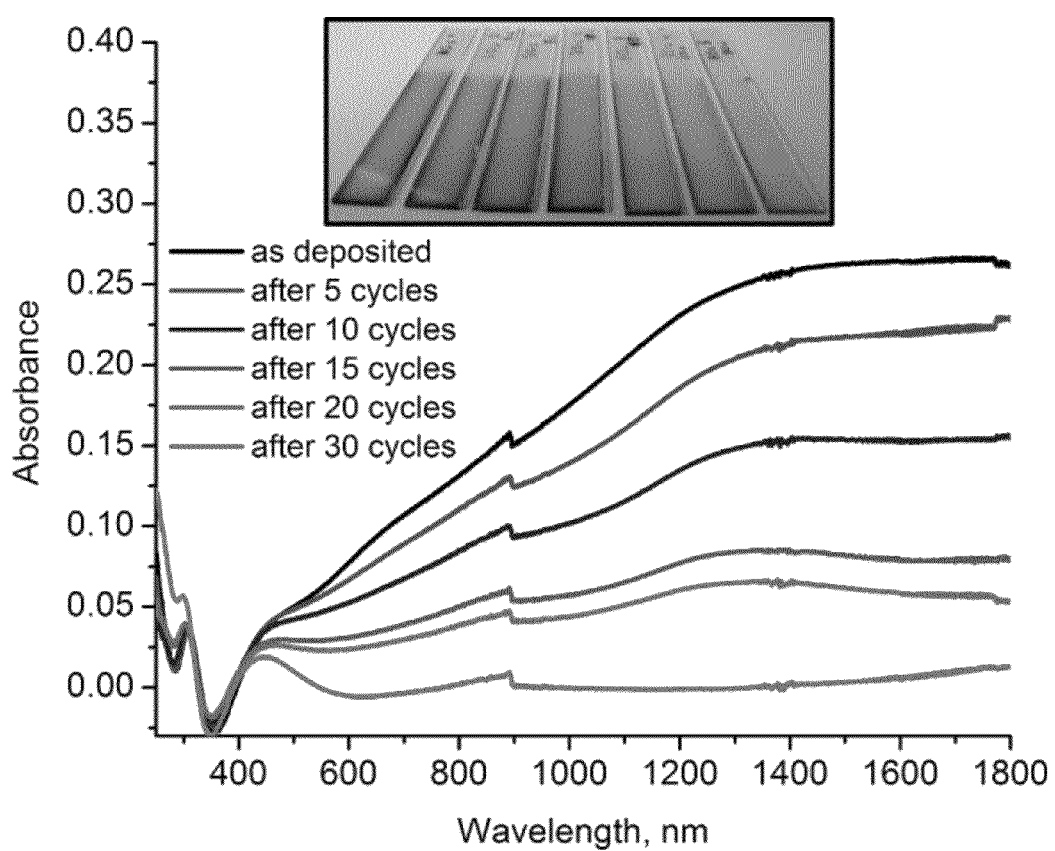
FIG. 20 shows UV-Vis-NIR spectra of the PEDOT layer after cycling in 0.1 M TBAP solution from −1.3 to +1.3 V at 100 mV/s scan rate. Insert: photographic image of the corresponding slides.
Figures 21A, 21B, 21C, 21D, 21E, 21F:
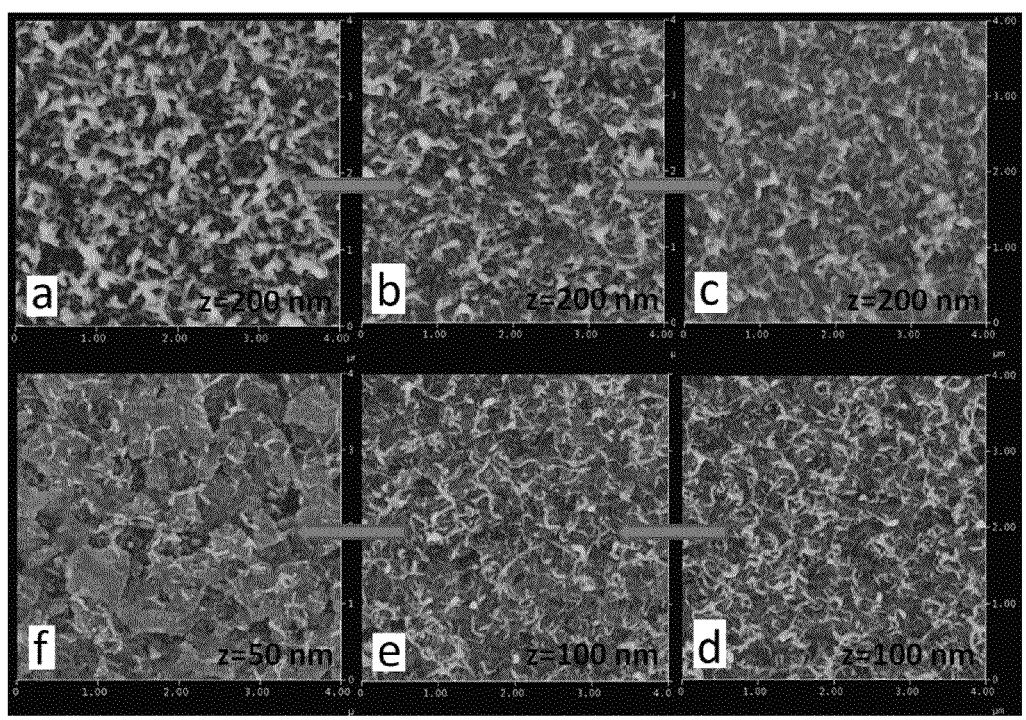
FIG. 21 shows AFM images of (a) the initial PEDOT layer and the layers after: (b) 5; (c) 10; (d) 15; (e) 20; and (f) 30 cycles in 0.1 M TBAP solution from −1.3 to 1.3 V at 100 mV/s scan rate.

Codeposition of fullerene and poly(thieno[3,2-b]thiophene) on PEDOT. Hole extraction and transporting layer such as PEDOT is highly desired for solar cell fabrication. So, before the PTT-fullerene codeposition, the PEDOT layer was polymerized on the ITO surface by running 30 cycles from 0.0 to 1.1 V. Details of the technique are disclosed previously herein. Stability of the PEDOT layer under PTT-$C_{60}$ codeposition conditions is an additional requirement for OPVd fabrication. It was mimicked by cycling potential between −1.3 and +1.3 V in 0.1 M TBAP solution without monomers. The evolution of the UV-Vis-NIR spectrum of the PEDOT layer is shown in FIG. 20. Absorbance in whole Vis-NIR range was greatly diminished and decreased to zero within 30 cycles. However, the character of the spectra did not change significantly. Evidently, dissolution of the layer happens as a result of the polymer backbone cleavage. So, it can be concluded that there is no destructive degradation of the PEDOT layer and, for example, the layer after 10 cycles can still be used. The deposited PEDOT layer had fibrillar morphology (FIG. 21). As a result of the dissolution, the average diameter of the nanofibers decreased from 100 to 30 nm. The process is opposite to the deposition described earlier. It confirms that the PEDOT layer is denser inside and rougher outside with increasing size of the nanofibers.

Figure 22:
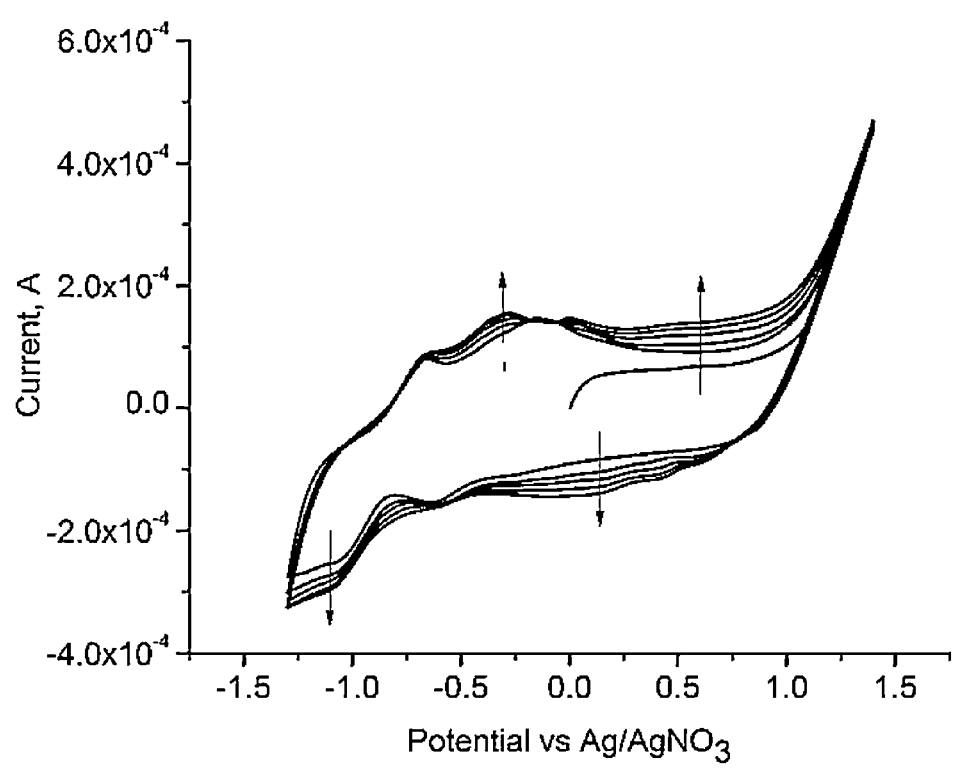
FIG. 22 shows CV of PTT-$C_{60}$ codeposition on top of the PEDOT layer recorded at 100 mV/s scan rate. 0.30 mM $C_{60}$, 0.02 mM $C_{60}O$, 5.0 mM TT in 0.1 M TBAP solution in toluene/acetonitrile.

Cyclic voltammogram of the PTT-$C_{60}$ codeposition onto PEDOT is shown in FIG. 22. It has complex characteristics and combined all the peaks due to fullerene and PTT deposition. In addition there was a broad current from −0.5 to +0.5 V corresponding to the electroactivity of the PEDOT layer. With cycling both anodic and cathodic currents increased indicating the codeposition.

Fabrication of the OPVd. In addition to the hole transporting function PEDOT layer was found to improve the adhesion of PTT-$C_{60}$ to ITO. This is expected as PEDOT carries positive charge and the ITO surface is negatively charged. For the solar cell preparation PTT-$C_{60}$ layer was deposited by so called double-gradient deposition on top of PEDOT. Lower potential limit was decreased stepwise from −1.20 V to −1.30 V while higher from +1.40 to +1.30 V. Six steps were applied, three cycles each, so that the total number of cycles was 18. The idea was to increase PTT content in the inner layer and fullerene in the outer to facilitate charge transport.

Figure 23:
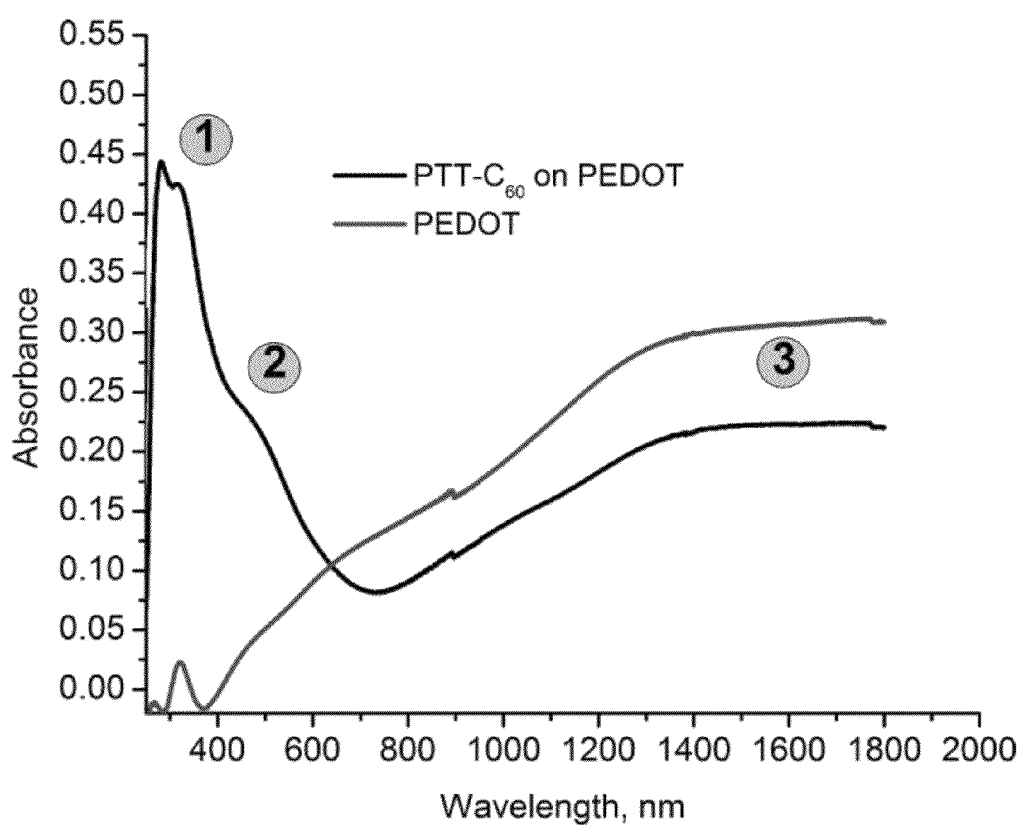
FIG. 23 shows UV-Vis-NIR spectra of the PEDOT layer before and after PTT-$C_{60}$ codeposition on top of it. The numbers represent characteristic absorbance: 1-fullerene, 2-PTT, 3-PEDOT.

As deposited PEDOT layer (30 cycles) showed absorbance in NIR region going up to 0.30 (FIG. 23). After PTT-$C_{60}$ deposition the layer retained most of it. It is interesting that in the control experiment discussed above, the layer was almost completely dissolved after the same 18 cycles. Apparently, PTT-$C_{60}$ mixture deposited on early stages protects PEDOT layer underneath from a fast degradation. Three regions of absorbance characteristics for the individual components can be seen: NIR for PEDOT, around 500 nm for PTT and UV for fullerene. It is important that the shapes of the spectra, the absorbance values and the ratios of the intensities were found to be similar to the standard P3HT-PCBM/PEDOT:PSS solar cells where the layers were deposited by a conventional spin-coating technique.

Figure 24A:
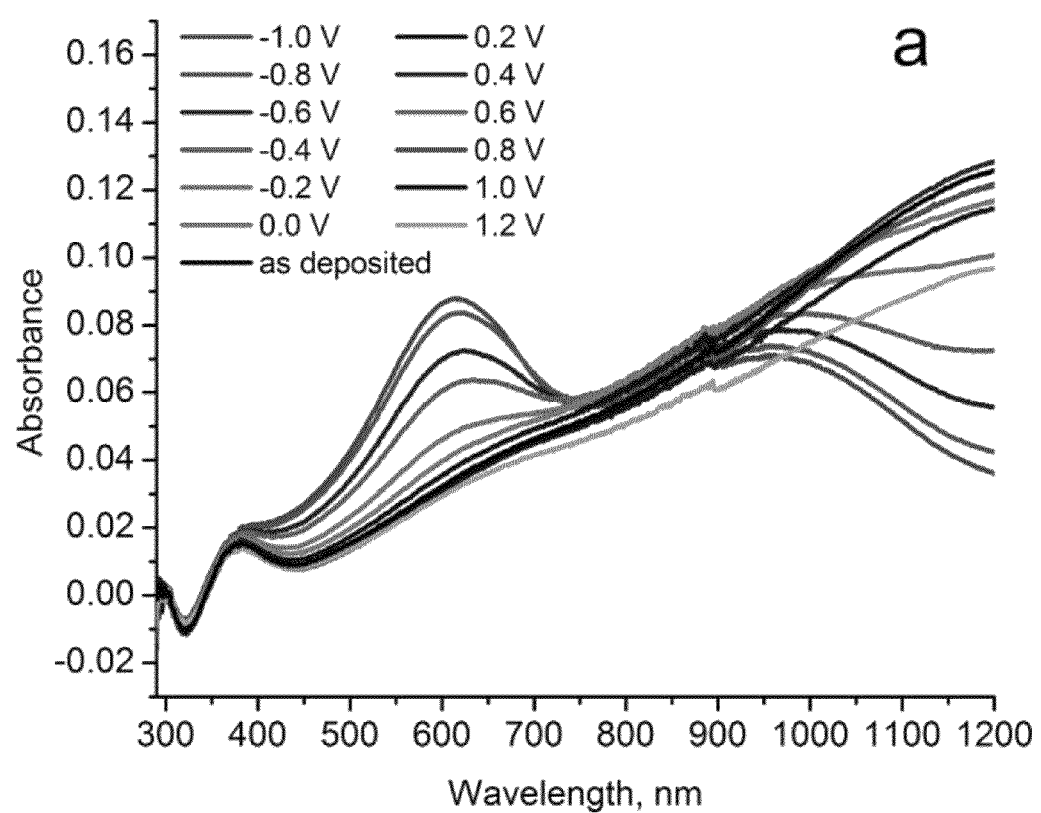
FIG. 24 shows electrochromic properties of (a) PEDOT and (b) PTT.
Figure 24B:
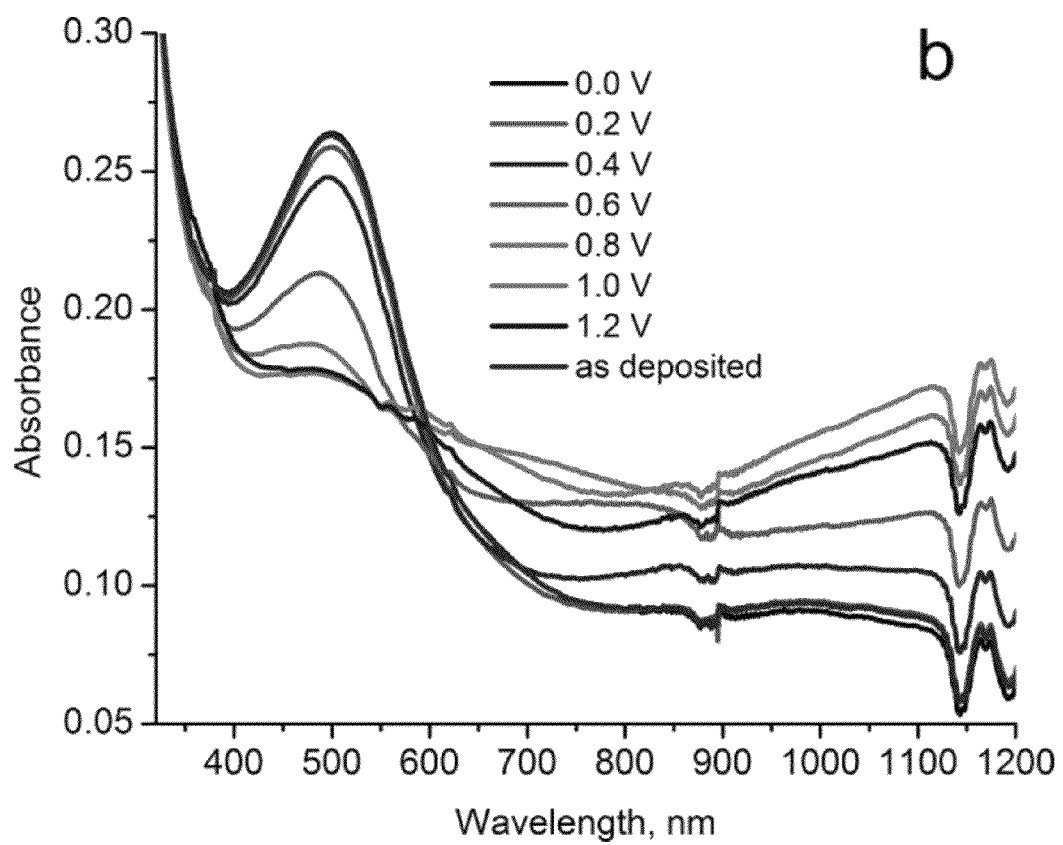

It is required for the OPVd operation that PTT is in its reduced undoped form while PEDOT in conductive oxidized. Electrochromic properties of both polymers were studied to check the criteria. As can be seen PEDOT was oxidized at potential above −0.2 V since the peak at 590 nm characteristic for undoped PEDOT completely disappeared (FIG. 24a). On the other hand, PTT was fully reduced at potential below +0.2 V (FIG. 24b). So, there is window from −0.2 to +0.2 V to successfully satisfy the criteria. That is why after PTT-$C_{60}$ deposition the electrode was subjected to 0.0 V until current dropped to zero.

Figure 25:
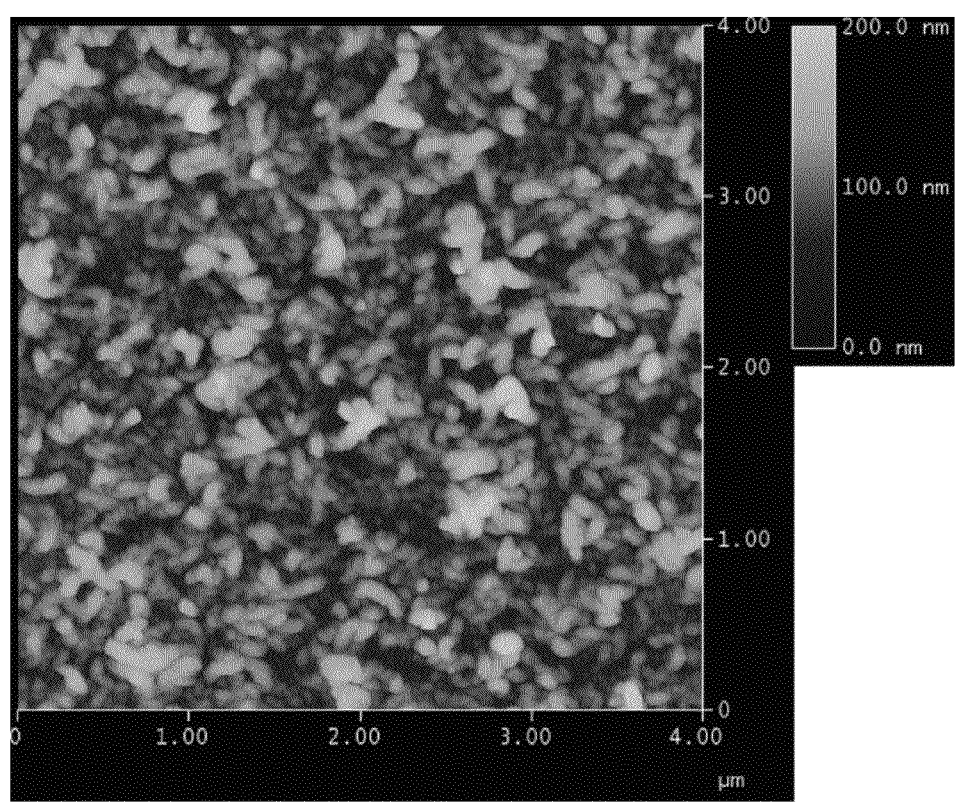
FIG. 25 shows an AFM image of PTT-$C_{60}$ codeposited on the PEDOT layer.

It is interesting that PTT and fullerene codeposited on top of PEDOT followed its fibrillar morphology (FIG. 25). Fibers were about 100 nm in diameter and grew upwards resulting in mushroom-like structure with a roughness of ±100 nm.

Figure 26:
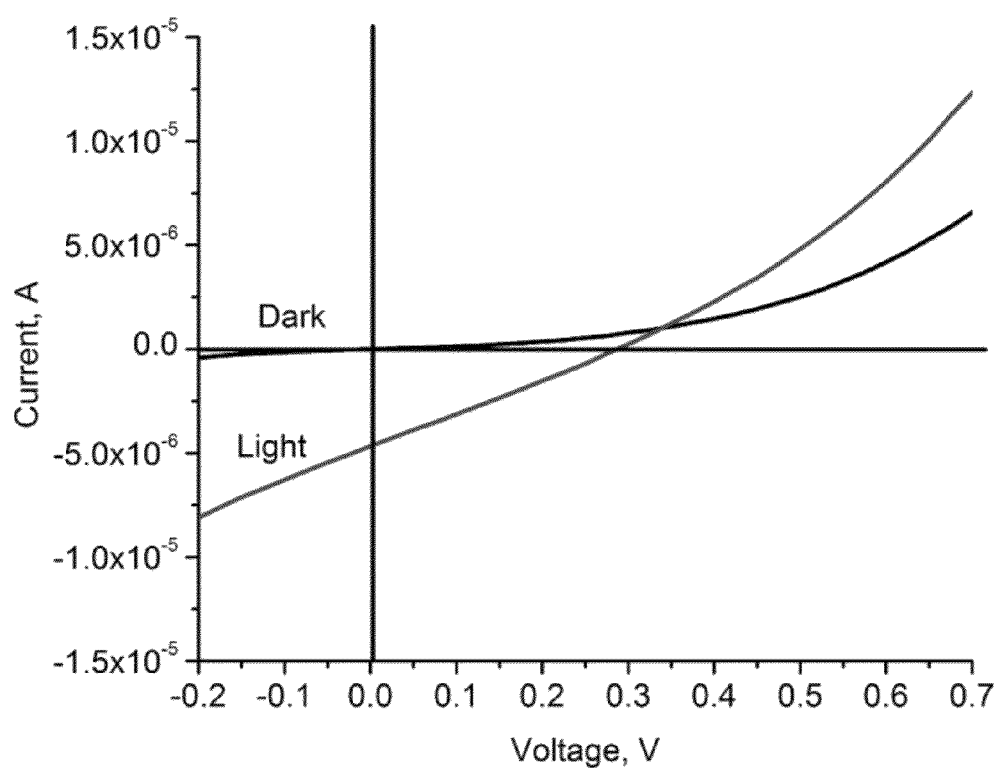
FIG. 26 shows I-V curves of the fabricated Al/PTT-$C_{60}$/PEDOT/ITO OPVd.

OPVd fabrication was accomplished by evaporating Al cathode on top. Typical I-V curve is shown in FIG. 26. $V_{oc}$ of 0.30 V and $I_{sc}$ of 35 $\mu$A/cm$^2$ were recorded. Relatively low $V_{oc}$ and some dark current at reverse bias point at electrical pinning. As a result fill factor decreased to 24%. The cell was further annealed at 100° C. however it did not affect the performance. The reason for the low photoresponse can be poor electrical contact between Al cathode and photoactive layer because of the rough morphology of the layer. Also, the deposition of PTT requires high potential which can lead to many side products and bring high distortion to the polymer backbone decreasing the conjugation length. Codeposition of polythiophene and fullerene was done by cycling the potential in boron trifluoride diethyl etherate (BFEE)/1-chloronaphthalene solution of the corresponding monomers. Fullerene deposition was inefficient in the absence of the $C_{60}O$ catalyst. UV-Vis spectra of as deposited layer showed insignificant peak at 335 nm which was apparently due to some fullerene entrapped in the polythiophene layer rather than polymerized. In addition, broad absorbance with a maximum at 425 nm attributed to $\pi$-$\pi$* excitation of polythiophene was observed. However, it is well known that polythiophene has characteristic absorbance at 490 nm and such a tremendous blue shift indicates poor conjugation typical for short oligomers. Together with rough morphology and lack of characterization measured $I_{sc}$ of 0.30 mA/cm$^2$, $V_{oc}$ of 0.81 V and overall efficiency of 0.30% are questionable.

Electrochemistry is a powerful tool to deposit conjugated polymer layers. Fullerene could be conjugated in the similar manner in the presence of fullerene epoxide. Electrodeposition of fullerene happened at the potential below −1.1 V. On the other hand PTT was polymerized above +1.1 V. The two polymerization processes were combined together resulting in the formation of the donor-aceptor bulk heterojunctions. The codeposition was evidenced by UV-Vis-NIR spectroscopy and AFM. The components formed interpenetrating bicontinuous network which is desired for the photovoltaic application. Moreover, the composition was altered by changing the potential limits. For the OPVd fabrication PEDOT was successfully introduced as a hole transporting layer. All the three constituents were codeposited without any destructive interference. By subjecting the final layer to 0.0 V PTT was fully reduced while PEDOT maintained conductive oxidized state. Despite all the required and desired criteria for the polymer solar cell fabrication were achieved photoresponse was low. $V_{oc}$ of 0.3 V and $I_{sc}$ of 35 µA/cm$^2$ were measured under the standard AM 1.5 simulator. Poor performance can be result of the rough fibrillar morphology or broken conjugation in the electrodeposited PTT. Nevertheless, the electrodeposition technique has certain potential in organic electronics.

Illustrative Embodiment C—Electrochemically prepared three-layer poly(3,4-ethylenedioxythiophene)/Poly(2,2'-bithiophene)/fullerene (PEDOT/PBT/C$_{60}$) polymer solar cell In this embodiment, the electrochemical approach to fabricate polymer solar cell consists of three consecutive depositions: polymerization of PEDOT hole transporting layer on ITO, polymerization of poly(2,2'-bithiophene) (PBT) donor layer on PEDOT, and finally electrodeposition of fullerene on PBT through n-doping of the polymer layers.

Experimental. Indium tin oxide (ITO) coated glass slides, $R_s$=5-15 ohms, 7×50×0.7 mm, were ordered from Delta Tech., Inc. Custom-made ITO glasses for solar cell fabrication, $R_s$=15 ohms, 25×25×0.7 mm, were purchased from Luminescence Technology Corp. 3,4-Ethylenedioxythiophene (EDOT), 2,2'-bithiophene (BT), fullerene (C$_{60}$), tetrabutylammonium perchlorate (TBAP), [6,6]-phenyl-C$_{61}$-butyric acid methyl ester (PCBM), regioregular poly(3-hexylthiophene) (rrP3HT), anhydrous acetonitrile, anhydrous toluene were purchased from Aldrich and used as received. meta-Chloroperoxybenzoic acid (75%), technical grade, was ordered from Aldrich and purified by washing in pH 7.5 phosphate buffer. Boron trifluoride diethyl etherate (BFEE) was distilled and stored in a freezer before use. Fullerene epoxide was prepared by oxidation of fullerene with purified meta-chloroperoxybenzoic acid. Millipore deionized (DI) water was used in the experiments.

The electrochemical deposition and characterization were done using a model 660D workstation (CH Instruments, Inc., TX). Three-electrode configuration with either Ag/AgCl reference electrode (for PBT deposition) or Ag/AgNO$_3$ reference (for PEDOT and C$_{60}$ deposition) and Pt wire counter electrode was employed. UV-Vis-NIR spectra were recorded with a UV-3101 PC spectrophotometer (Shimadzu Scientific Instruments, Inc., MD). Morphological studies were performed by Nanoscope IIIa Atomic Force Microscope (AFM) (Veeco, Inc., CA). The solar cell testing was done using Keithley 2400 source meter (Keithley Instruments, Inc., OH) and standard AM 1.5 solar simulator, 100 mW/cm$^2$ (Newport, Inc., CA); aluminum cathode was evaporated in an Angstrom Engineering vacuum deposition system at pressure below $2 \cdot 10^{-6}$ Torr.

The ITO slides were cleaned by ultrasonification in aqueous Kleensonic solution, rinsed with water and dried in nitrogen stream. The PEDOT layer was deposited from 5.0 mM EDOT solution in toluene/acetonitrile (4:1, volume) in the presence of 0.1 M TBAP supporting electrolyte. The deposition was typically done by running 15 cycles from 0.0 to +1.1 V vs Ag/AgNO$_3$ (0.01 M, +0.47 V vs SHE). PBT was deposited on top of the PEDOT layer from 5.0 mM BT solution in BFEE. Prior to BT dissolution BFEE was bubbled with the nitrogen gas for 30 min to remove dissolved oxygen. The polymerization was done by CV running various numbers of cycles from 0.0 to +1.2 V vs Ag/AgCl (+0.197 V vs SHE) depending on the desired thickness. Fullerene was deposited as a third layer from 0.30 mM C$_{60}$ and 0.02 mM C$_{60}$O solution in toluene/acetonitrile by cycling the potential between 0.0 and −2.0 V vs Ag/AgNO$_3$. The final three-layer electrode was subjected to 0.0 V vs Ag/AgNO$_3$ until current dropped to zero. After the deposition of each layer the electrodes were washed in acetonitrile and dried in the nitrogen stream.

Figure 32A:
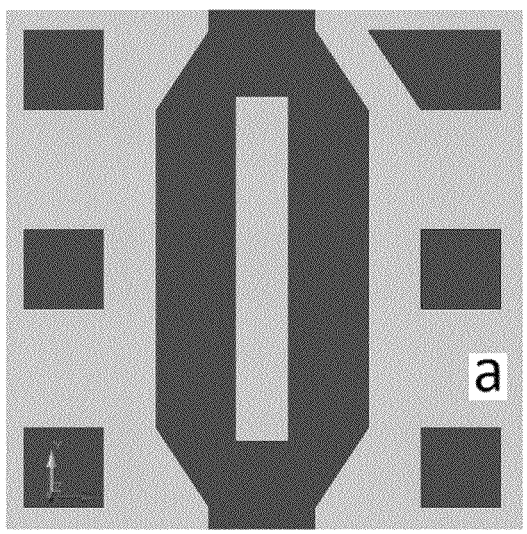
FIG. 32 shows (a) schematic image of the custom-made ITO coated glass slides used for the OPVd fabrication. Red areas represent ITO and (b) photographic image of the final OPVd.
Figure 32B:
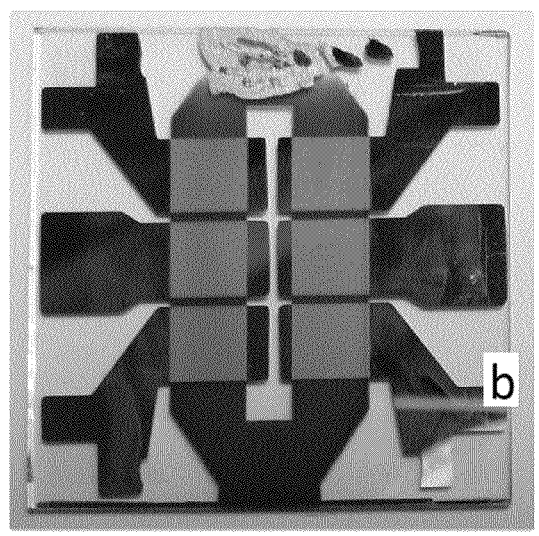

For the solar cell fabrication the layers were deposited on the custom-made ITO slide. Design of the slide and final OPVd are shown in FIG. 32a and 32b, respectively. There were 6 individual cells (S=0.15 cm$^2$) on each slide for accurate measurement. Al cathode (60 nm) was evaporated through the shadow mask at 1 nm/s rate.

Figure 27A:
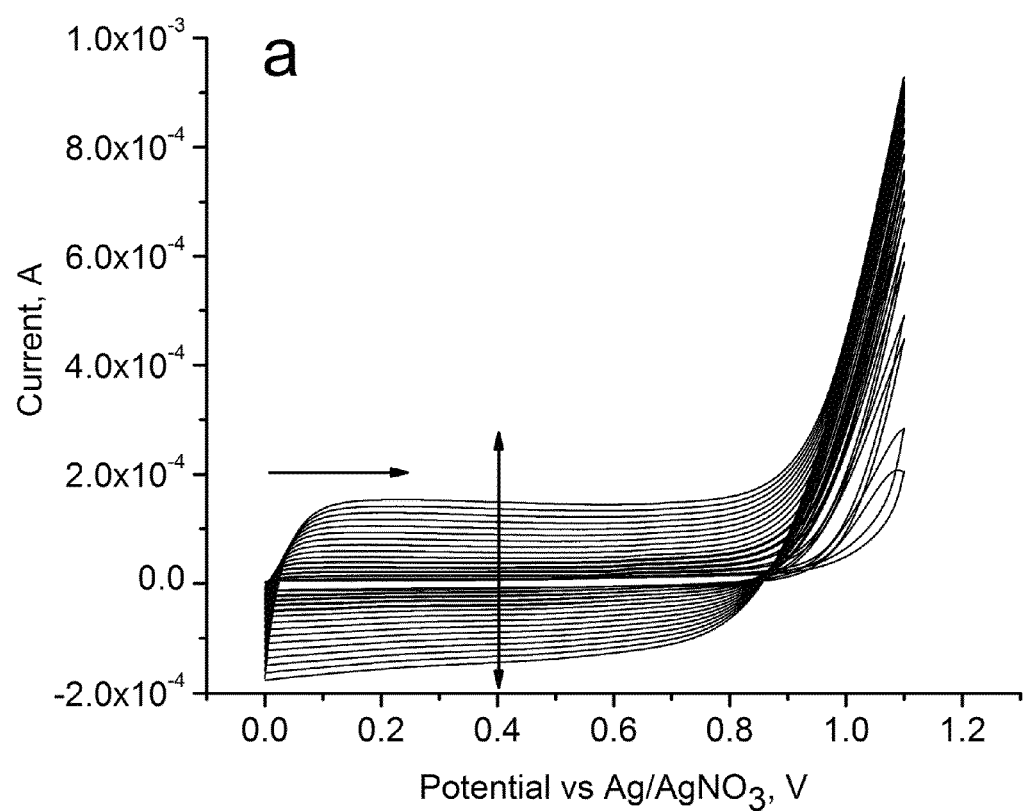
FIG. 27 shows electrochemical deposition of the layers by CV: (a) PEDOT by 15 cycles, [EDOT]=5.0 mM, [TBAP]=0.1 M in toluene/acetonitrile; (b) PBT on 15cPEDOT by 15 cycles, [BT]=5.0 mM in BFEE; (c) $C_{60}$ on 15cPEDOT/15cPBT by 5 cycles, [$C_{60}$]=0.30 mM, [$C_{60}O$]=0.02 mM, [TBAP]=0.1 M in toluene/acetonitrile; (d) $C_{60}$ on 15cPBT by 5 cycles, [$C_{60}$]=0.30 mM, [$C_{60}O$]=0.02 mM, [TBAP]=0.1 M in toluene/acetonitrile. All the scans were run at 100 mV/s sweeping rate.

Results. Electrodeposition of the PEDOT layers from toluene/acetonitrile solution is disclosed previously herein. In the present embodiment, the layer was deposited by running 15 cycles (FIG. 27a). The polymerization happened above +0.9 V with a consecutive increase in peak current at +1.1 V. Current below +0.9 V, corresponding to electroactivity of PEDOT, grew as well confirming deposition of the layer.

Figure 27B:
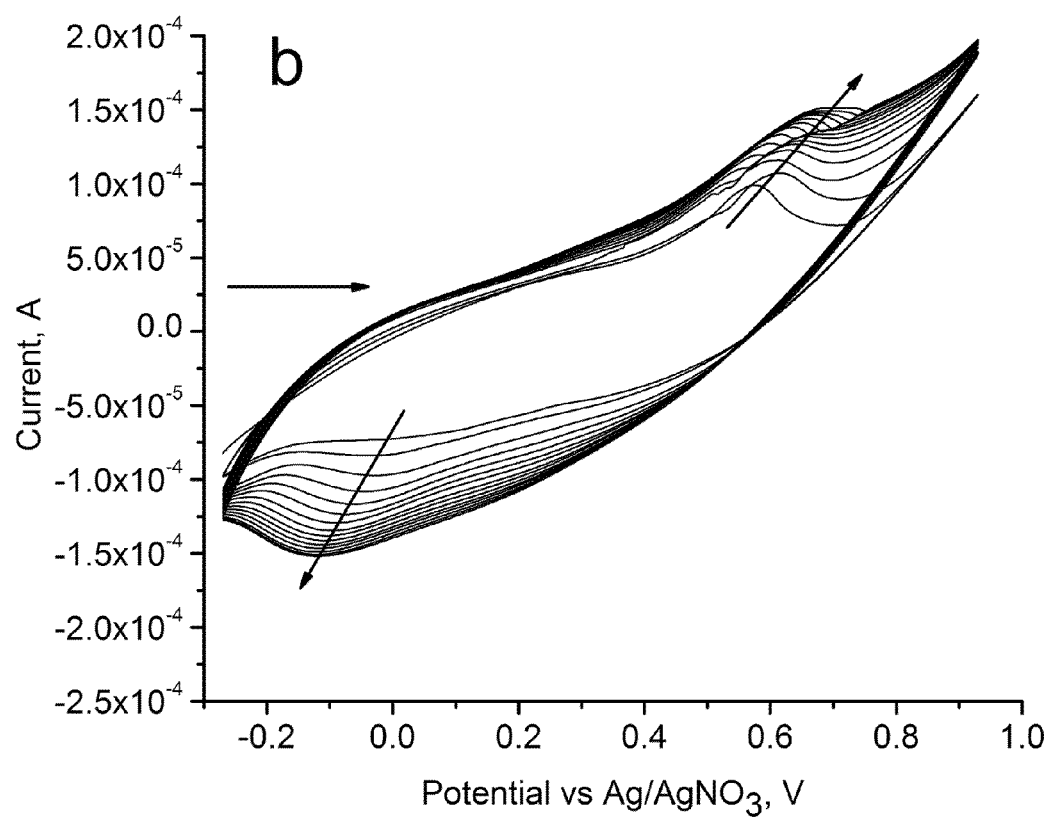

The polymerization potential of unsubstituted thiophene in acetonitrile is about +2.2 V vs SHE which is close to the degradation potential. It causes formation of many side products, cross-linking and shortened conjugation length which is detrimental for the charge transport in OPVd. The usage of BT decreases polymerization potential by a significant 0.7 V. At the same time, it was shown that BFEE as a Lewis acid has a catalytical activity towards polymerization of conjugated aromatic polymers by lowering aromatic resonance energy. Indeed, as can be seen from FIG. 27b, PBT could be polymerized by scanning up to +0.9 V (Ag/AgNO$_3$ reference is shown for convenient comparison), which is 0.2 V lower than for PEDOT. Such an extraordinary result is explained not only by the BFEE usage but also by the effect of toluene. It was found out in the present embodiment that the polymerization potential of EDOT and other thiophenes in the toluene/acetonitrile mixture is about 0.3 V higher than in pure acetonitrile or water. Perhaps, low polarity of toluene is responsible for the shift. Shape of the voltammogram was broad due to the electroactivity of the PEDOT layer. Also, there was a pair of peaks corresponding to redox transition (p-doping) of PBT: oxidation peak around +0.6 V and reduction around −0.1 V. The current grew for the both peaks with a shift from +0.57 to +0.69 V for the former and from −0.02 to −0.12 V for the later. As a result, uniform red layer of PBT was deposited onto PEDOT.

Figure 27C:
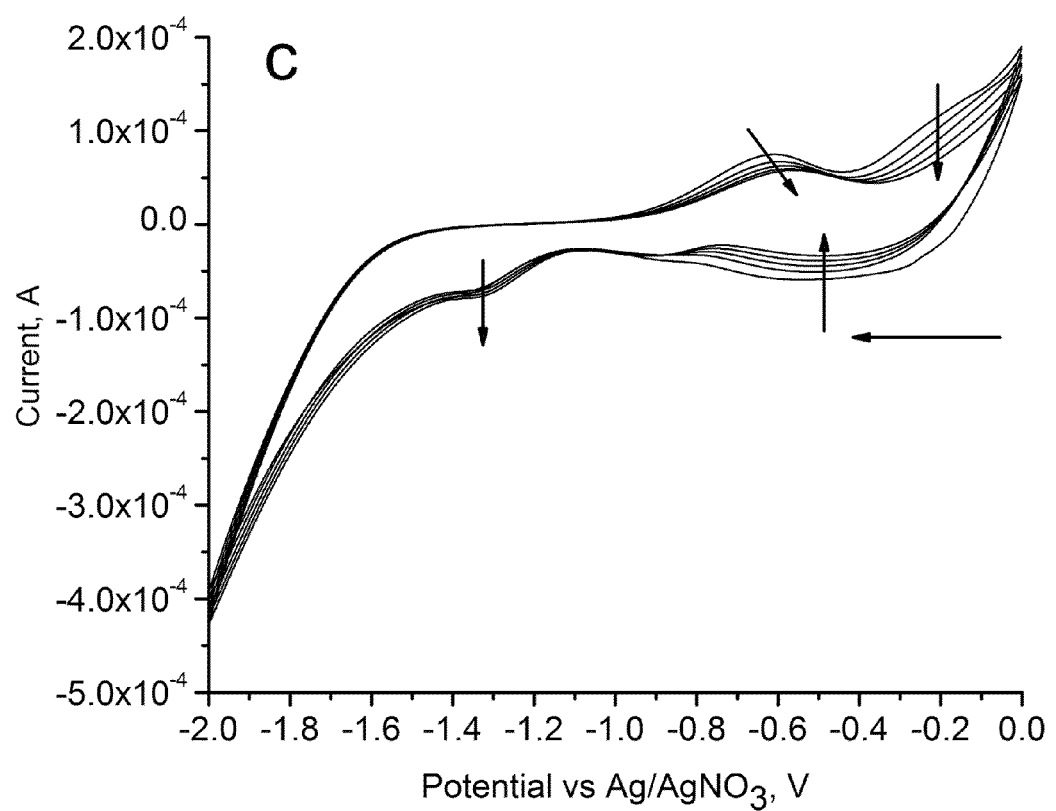
Figure 27D:
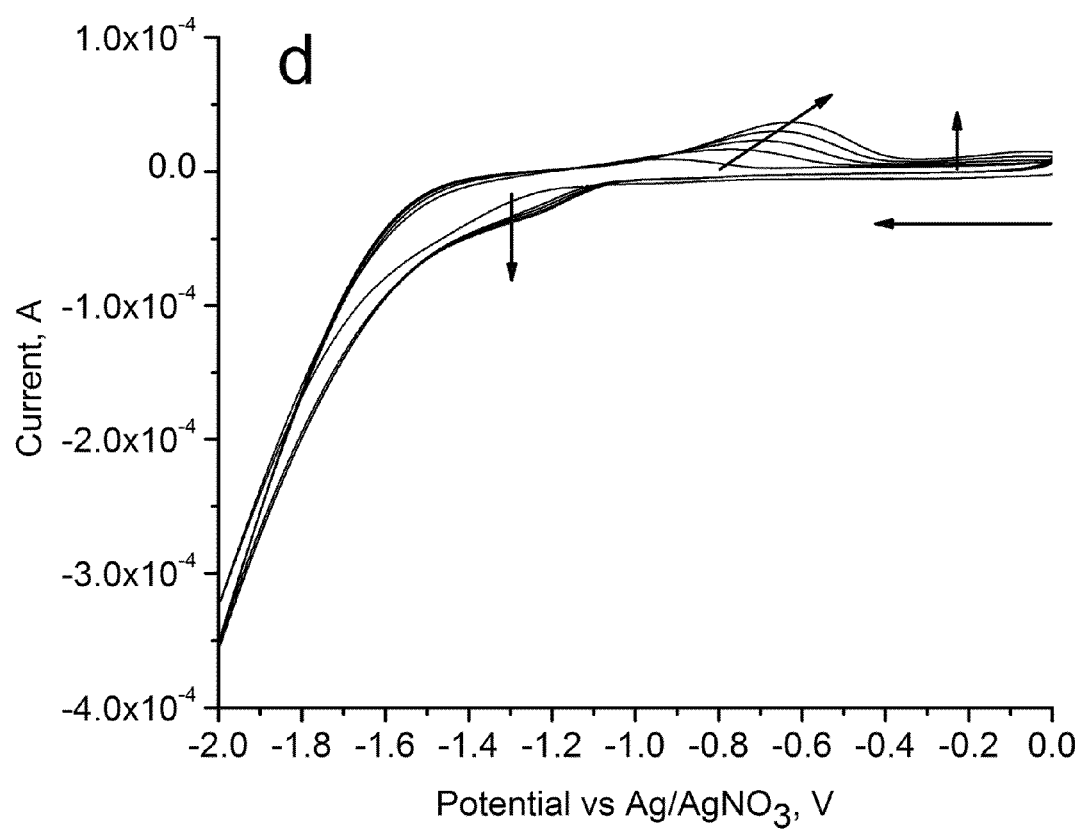
Figure 34:
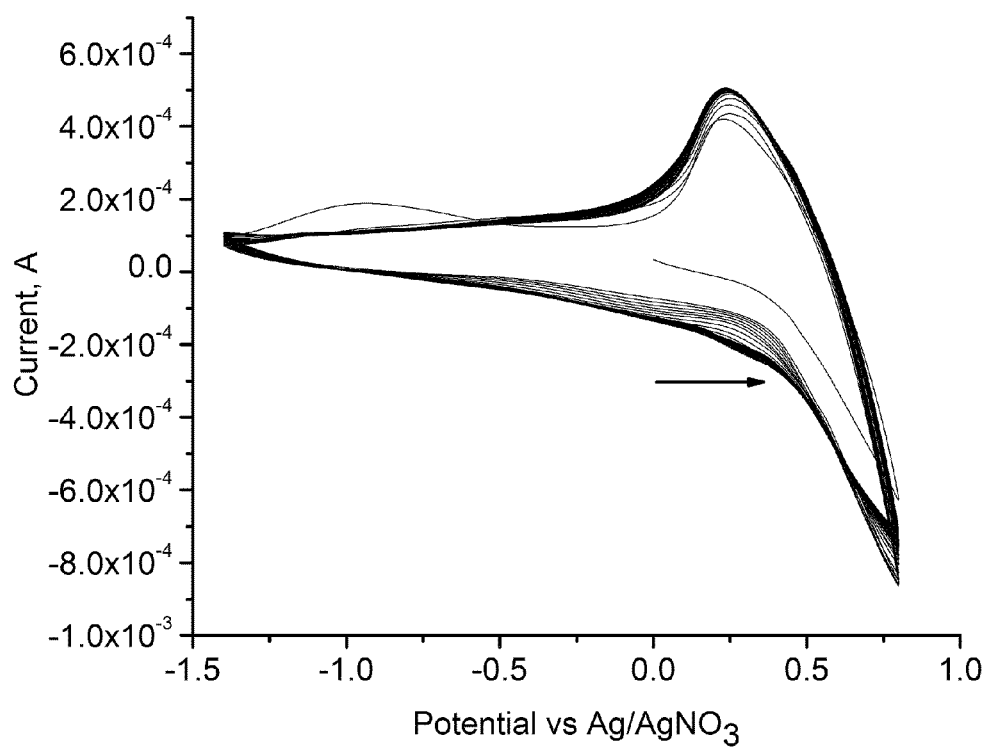
FIG. 34 shows CV of the 15c_PEDOT/15c_PBT layer in 0.30 mM $C_{60}$/0.02 mM $C_{60}O$ solution in toluene/acetonitrile, 100 mV/s scan rate.

The fullerene layers could be successfully deposited electrochemically in the presence of catalytical amounts of fullerene epoxide by applying negative reduction potential. The control deposition and the characterization of the fullerene film on ITO surface are known. However, the goal of the present embodiment was to deposit fullerene as a third layer on PEDOT/PBT. The layer of PEDOT/PBT a strong barrier since the polymers are undoped at negative potentials and do not conduct current. Cycling down to −1.4 V, which was effective for the C$_{60}$ deposition on ITO, did not result in formation of the fullerene layer on PEDOT/PBT (FIG. 34). The problem was solved by initiating n-doping of the polymers. The n-doping happened below −1.5 V (FIGS. 27c and 27d) and was associated with the increase in cathodic current and restoration of the conductivity. The small cathodic peak at −1.3 V apparently corresponds to the reduction of fullerene. The anodic peak around −0.6 V shifted to lower potential and is attributed to transition of the polymers from n-doped to undoped form. High anodic current from −0.4 to 0.0 V and broad cathodic peak at −0.45 V (FIG. 27c) correspond to reversible p-doping of PEDOT as they were not seen for the control fullerene deposition on ITO/PBT (FIG. 27d). Also, in the case of control deposition on ITO/PBT the anodic peak grew with a shift from −0.7 to −0.6 V which is quite different from the deposition on PEDOT/PBT. Probably the redox activity of the deposited fullerene layer also contributes to the peak in addition to larger current due to n-doped/undoped transition of the polymers. The unique voltammogram has a complex character due to the cumulative current from the electrochemical activity of all the three components.

Oxidation state of the polymers is important for the solar cell operation. PEDOT must be in the conductive oxidized state while PBT in the neutral reduced state; without this solar cell will not function. Such a condition was achieved by subjecting the final working electrode to 0.0 V until the current dropped to zero.

Figure 28:
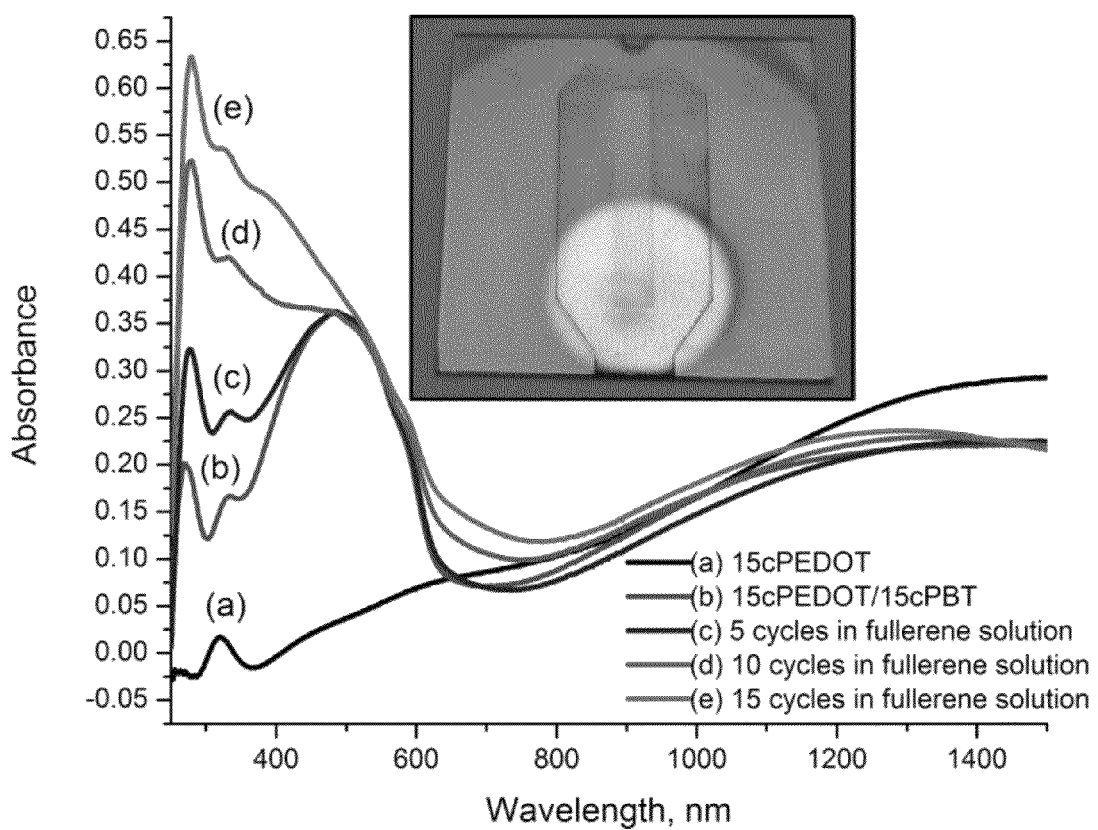
FIG. 28 shows UV-Vis-NIR spectra of the electrodeposited layers: (a) 15cPEDOT; (b) 15cPEDOT/15cPBT; (c)-(d) consecutive deposition of $C_{60}$ by running 5, 10 and 15 cycles. Insert is a photographic image of 15cPEDOT/15cPBT/15c$C_{60}$ film
Figure 33A:
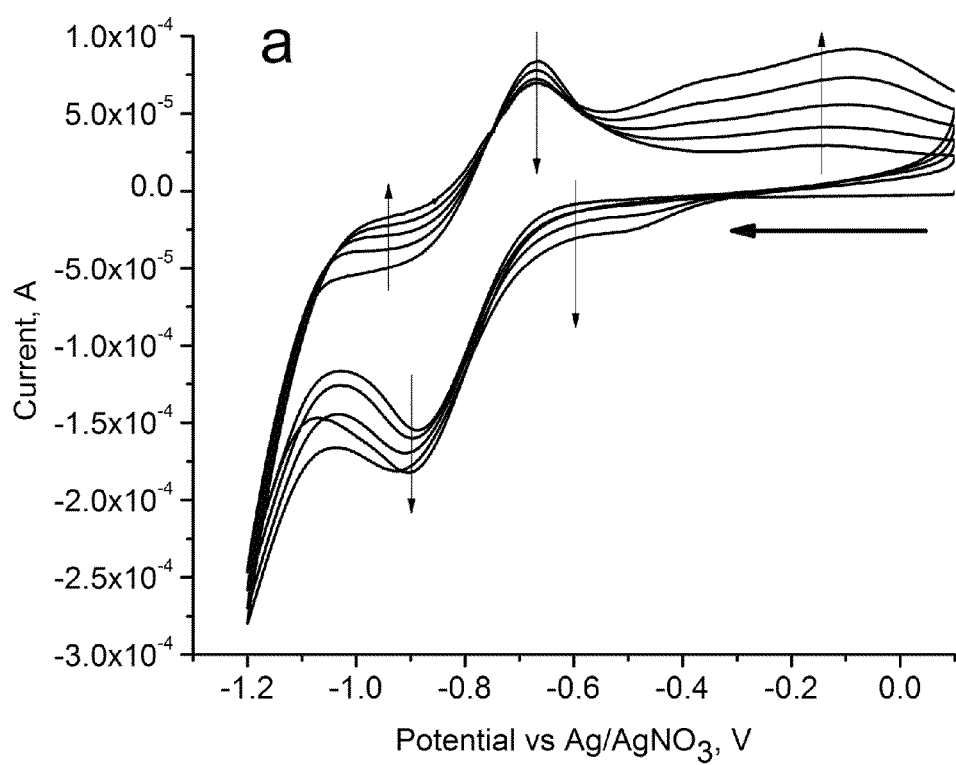
FIG. 33 shows the electrodeposition of fullerene on ITO: (a) CV of the deposition recorded at 100 mV/s scan rate, 5 cycles; (b) UV-Vis-NIR spectrum of the deposited layer; and (c) AFM image of the deposited layer.
Figure 33B:
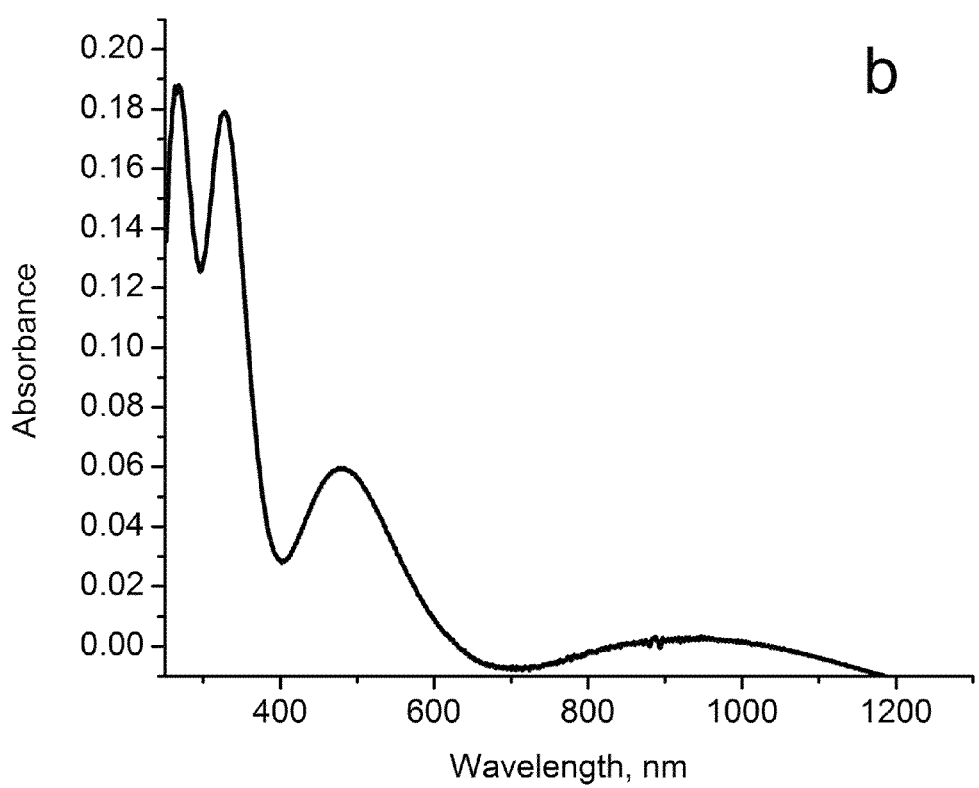
Figure 33C:
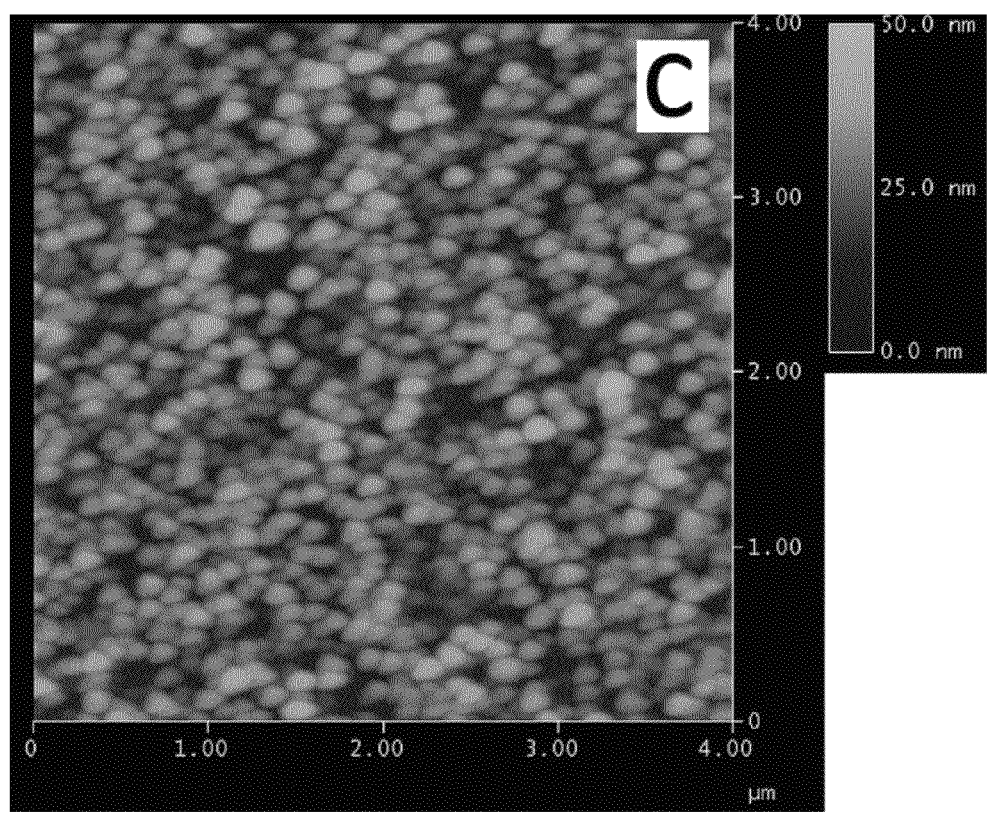

Electrodeposition of the layers was followed with UV-Vis-NIR spectroscopy (FIG. 28). As deposited, the PEDOT layer showed broad absorbance in the NIR region characteristic for doped oxidized form and a shoulder around 600 nm (FIG. 28a). After deposition of PBT, most of the absorbance in NIR region was retained and a new peak at 485 nm appeared. This peak is characteristic for polythiophene in reduced state and is attributed to $\pi$-$\pi$* excitation. Fullerene layer was deposited from 0.30 mM $C_{60}$/0.02 mM $C_{60}O$ solution in toluene/acetonitrile on ITO surface by running 5 cycles from 0.0 to −1.2 V (FIG. 33a). Cathodic peak at −0.9 V and anodic at −0.65 V correspond to reversible $C_{60}/C_{60}^-$ transition. Increase in other current is due to electroactivity of the deposited solid fullerene film. As a result even yellow layer was obtained. UV-Vis-NIR spectrum of the layer is shown in FIG. 33b. Four characteristic peaks were observed: 265 nm, 330 nm (same as for fullerene in solution), 480 nm (characteristic for solid fullerene films) and broad at 950 nm. AFM image of the layer is shown in the FIG. 33c. The layer is uniform and consists of 100 nm fullerene particles. UV-Vis-NIR spectrum of the pure fullerene film electrodeposited on ITO is shown in FIG. 33b. Two strong absorbance peaks at 265 and 330 nm together with weaker absorbance at 480 nm were observed. As a result of cycling in $C_{60}/C_{60}O$ solution absorbance in UV increased gradually (FIGS. 28c, 28d, and 28e). The growth of the two maxima at 270 and 330 nm is attributed to the deposition of the fullerene layer. At the same time the spectra did not change in the NIR region confirming coexistence of PEDOT, PBT and fullerene. The spectra of solid PBT and fullerene films are similar which is natural because both molecules have long conjugation of double bounds. However, the ratio of UV to Vis absorbance is much higher for fullerene. Importantly, UV-Vis-NIR spectroscopy clearly indicated that in the final three-layer structure PEDOT was in the doped state while PBT in reduced which is necessary for OPVd fabrication. Fullerene formed a shiny yellow layer and in general was evenly distributed over PBT (FIG. 28 insert).

Figure 29:
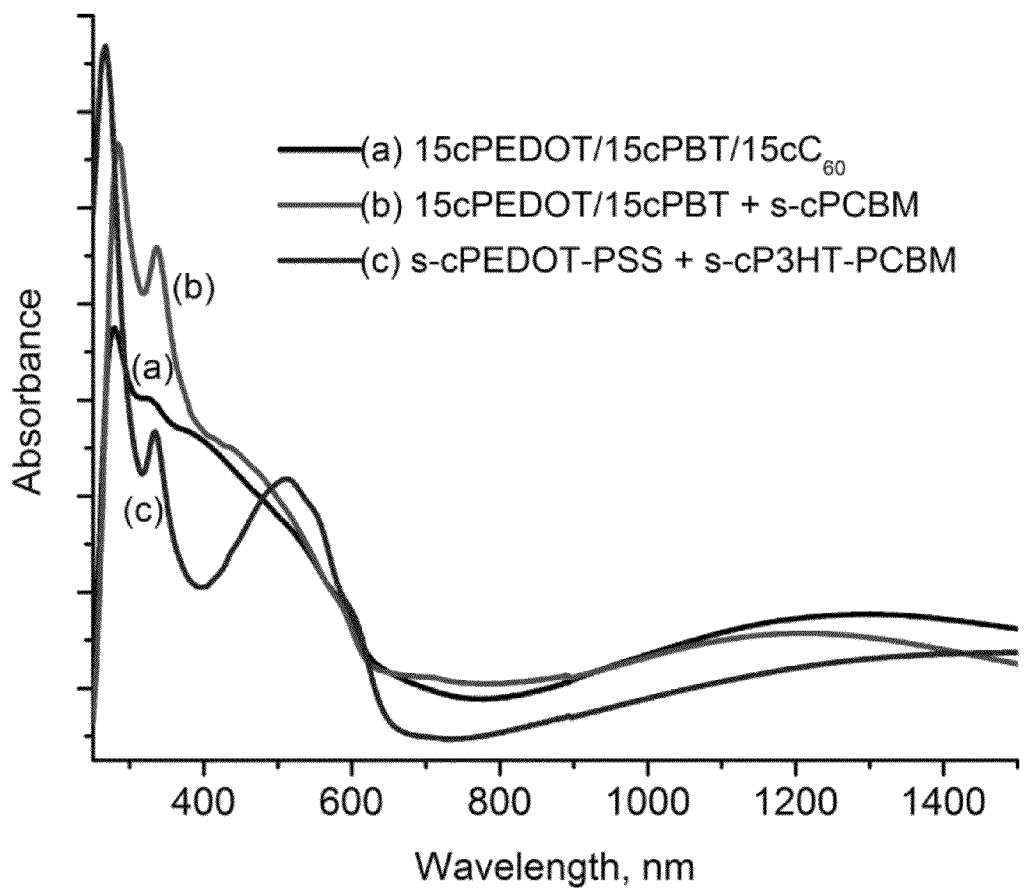
FIG. 29 shows UV-Vis-NIR spectra of: (a) electrodeposited 15cPEDOT/15cPBT/15c$C_{60}$; (b) electrodeposited 15cPEDOT/15cPBT and PCBM spin-coated at 1500 rpm; (c) spin-coated PEDOT-PSS and rrP3HT-PCBM
Figure 30A:
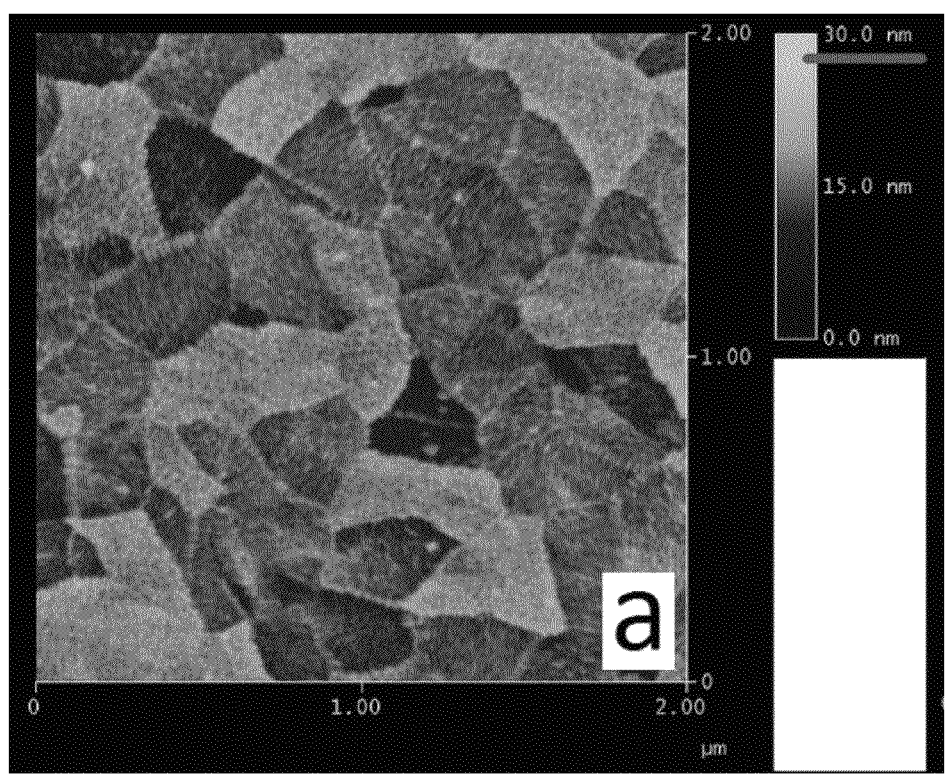
FIG. 30 shows AFM images of the: (a) Initial ITO surface; (b) 15cPEDOT; (c) 15cPEDOT/15cPBT; and (d) 15cPEDOT/15cPBT/15c$C_{60}$
Figure 30B:
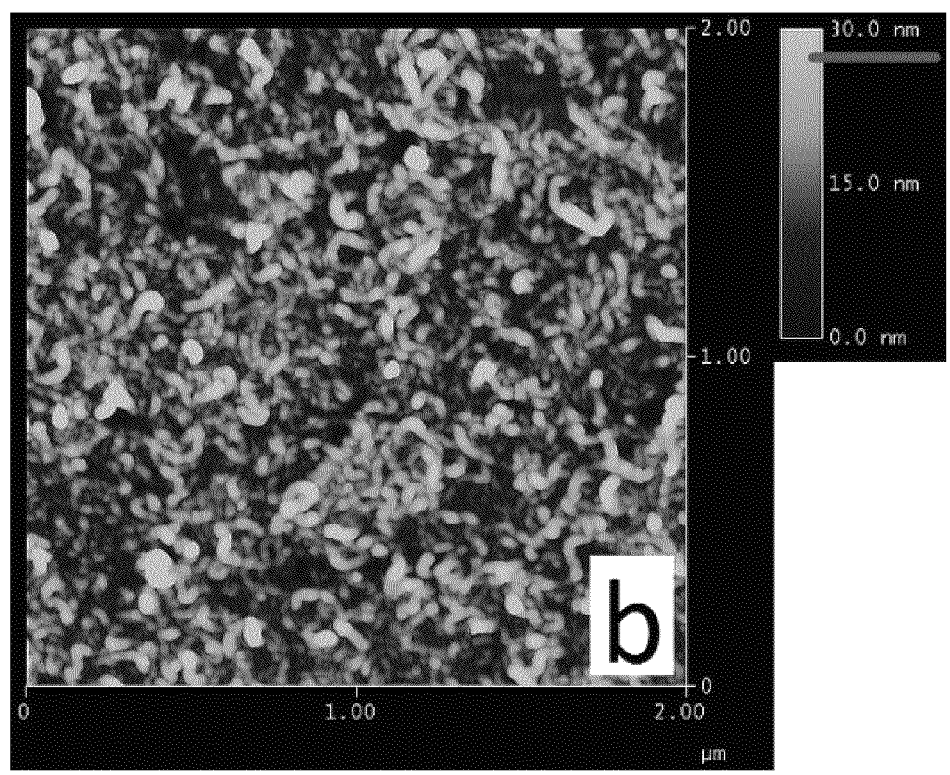
Figure 30C:
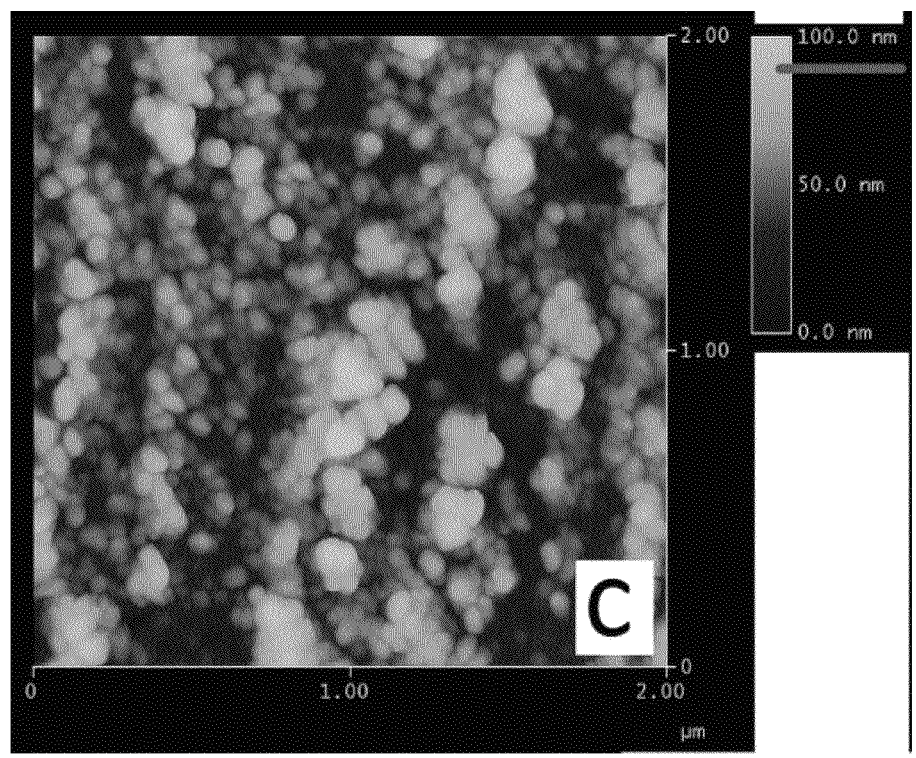
Figure 30D:
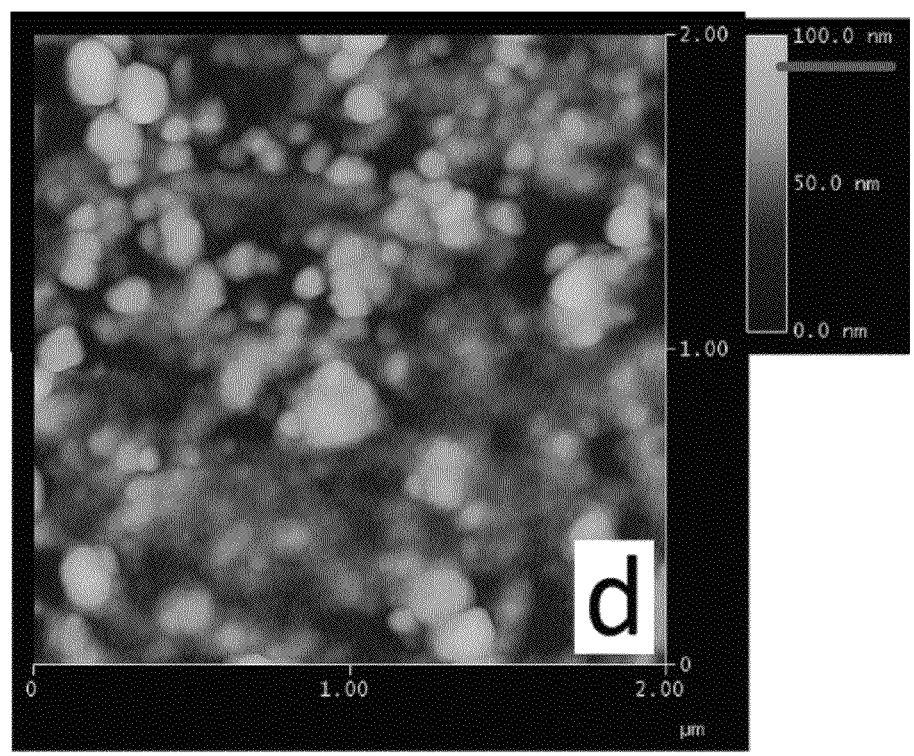

It is interesting to compare the spectrum of the electrodeposited three-layer film to those deposited by traditional spin-coating technique using commercial materials (FIG. 29). Spectrum of the electrochemically prepared film was almost identical to the film with spin-coated PCBM layer on the electrodeposited PBT layer (FIGS. 29a and 29b). The only difference was in the amount of fullerene. Conventional spin-coated PEDOT-PSS/rr-P3HT-PCBM film showed bathochromic shift of the polythiophene peak (due to hexyl-group) and higher intensity of the shorter UV absorbance maximum, but the overall was similar. So, by using exclusively electrochemistry, we were able to achieve not just qualitatively but quantitatively reasonable composition.

The evolution of the morphology with the consecutive deposition of the layers is shown in FIG. 30. Pristine ITO layer had flake-like structure with a low roughness of ±10 nm (FIG. 30a). The PEDOT layer polymerized from the mixed toluene/acetonitrile solution showed unique fibrillar morphology with diameter of the nanofibers less than 50 nm (FIG. 30b). Such a nanostructure of the hole transporting layer can be potentially useful in organic electronics The nanofibers have tendency to grow bottom-up leading to the brush-like architecture with a high surface area which can improve electrical contact with an upper layer. At the same time, the roughness stays on the moderate level of ±15 nm. As a result of PBT polymerization particles of the polymer with the size ranging from 50 to 200 nm appeared on the surface (FIG. 30c). The roughness increased to ±50 nm. The electrodeposition of fullerene smoothed the surface (FIG. 30d). However, AFM scans of different places showed that some of the areas were coated less than the others. FIG. 30c represents an average case.

Figure 31:
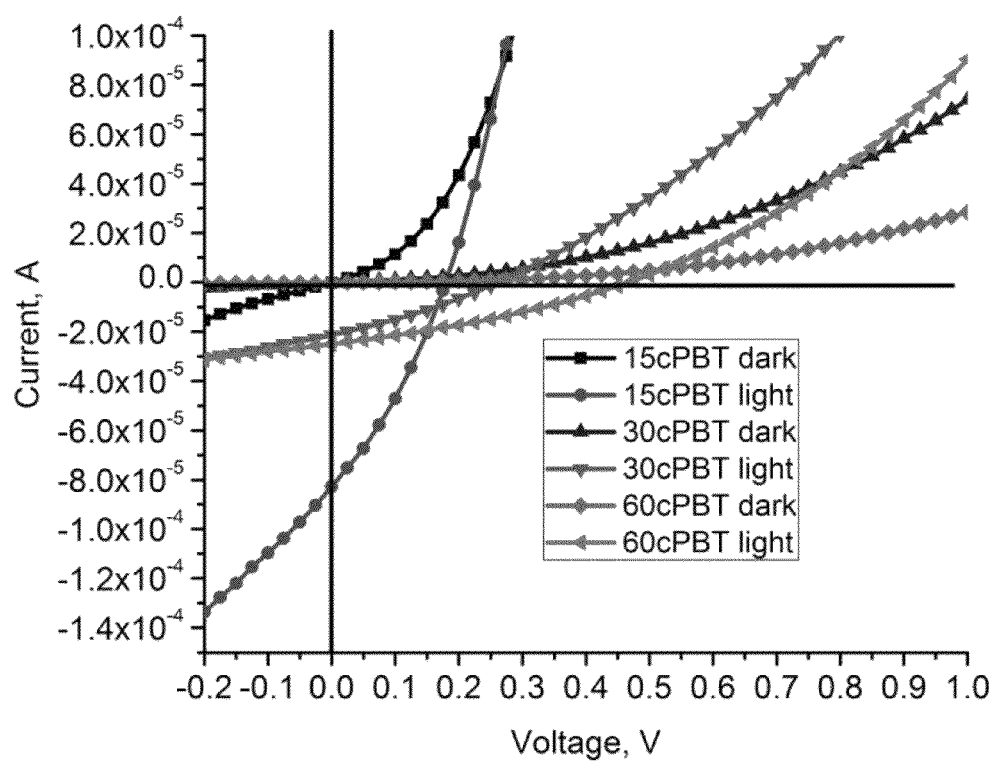
FIG. 31 shows I-V curves of the fabricated solar cells with different PBT thicknesses. 15cPEDOT/ncPBT/15c$C_{60}$, n=15, 30, 60.

Fabrication of the polymer solar cell was accomplished by the evaporation of the aluminum cathode. Three different thicknesses of the PBT layer, deposited by running 15, 30 and 60 cycles, were tested. Thicknesses of the PEDOT and fullerene layers were kept the same (15 cycles). Typical I-V curves of the corresponding solar cells are shown in FIG. 31 and the performance is summarized in Table C-1. The cell with the thin 15cPBT layer showed relatively high $J_{sc}$ of 0.55 mA/cm² and low $V_{oc}$ of 0.18 V. For the thicker PBT layers $V_{oc}$ was considerably improved reaching 0.47 V while $J_{sc}$ dropped to 0.14 mA/cm². In the case of the 15cPBT layer there was also a significant dark current at reverse bias indicating electrical pinning. Apparently, thick PBT layer properly covers PEDOT securing from short circuit, in other words increases shunt resistance. At the same time series resistance also increases lowering the current. The phenomenon is common for a bilayer OPVd.

TABLE C-1

Performance of the electrochemically prepared ITO/PEDOT/PBT/$C_{60}$/Al solar cells.

| PBT thickness, number of cycles | $V_{oc}$, V | $J_{sc}$, mA/cm² | $V_{max}$, V | $J_{max}$, mA/cm² | FF, % | ε, % |
|---|---|---|---|---|---|---|
| 15 | 0.18 | 0.55 | 0.10 | 0.31 | 31 | 0.031 |
| 30 | 0.26 | 0.14 | 0.14 | 0.08 | 31 | 0.011 |
| 60 | 0.47 | 0.17 | 0.27 | 0.09 | 30 | 0.024 |

$V_{oc}$—open circuit voltage,
$J_{sc}$—short circuit current,
$V_{max}$—maximum voltage,
$J_{max}$—maximum current,
FF—fill factor,
ε - overall efficiency under AM 1.5 simulator.

Figure 35A:
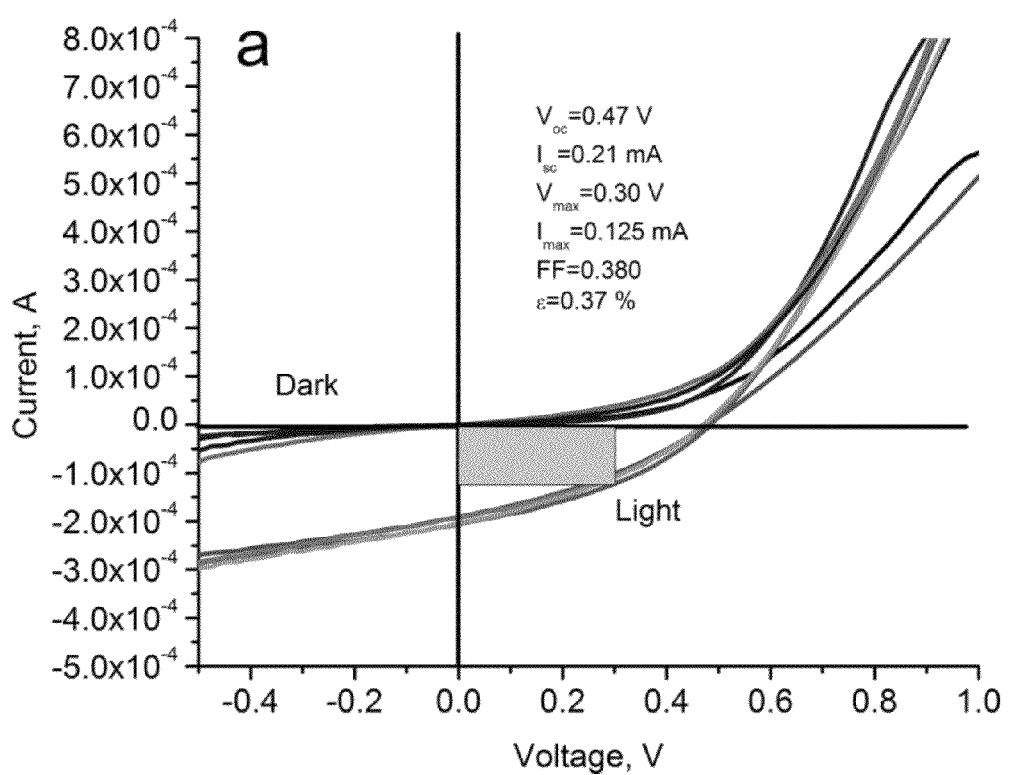
FIG. 35 shows (a) I-V curves of the solar cell prepared by spin-coating PCBM (1500 rpm) on 15cPEDOT/30cPBT and (b) AMF image of the surface after PCBM spin-coating.
Figure 35B:
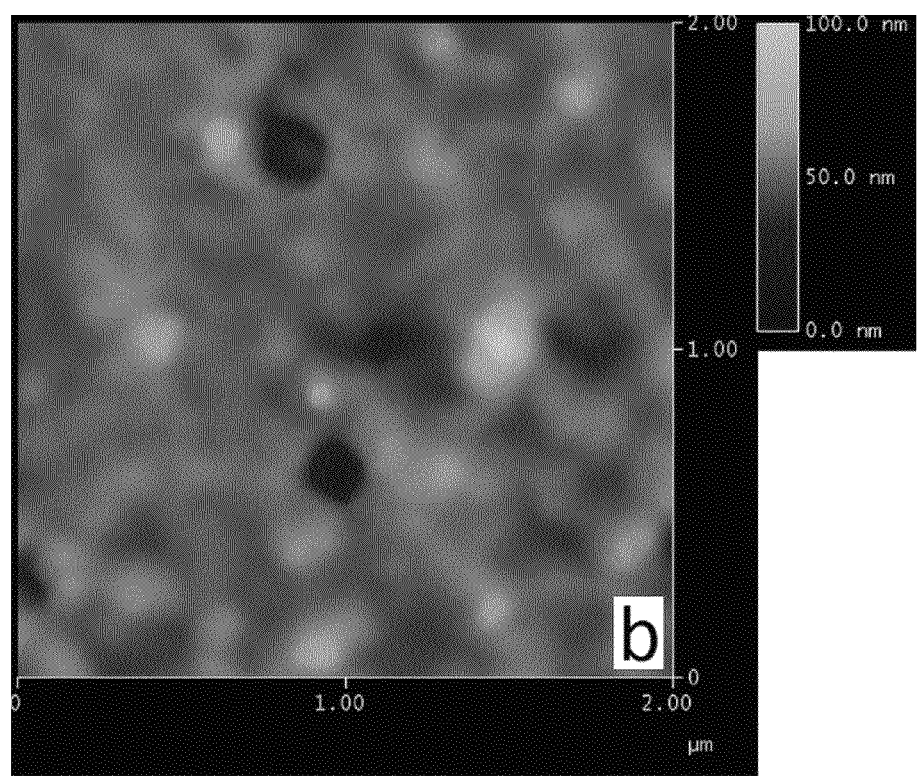

The solar cell with a standard PCBM layer spin-coated at 500 rpm on top of 30cPBT was made for a comparison. The actual I-V curves are shown in FIG. 35a. The performance was drastically improved: $V_{oc}$=0.47, $J_{sc}$=1.40 mA/cm², $V_{max}$=0.30 V, $J_{max}$=0.83 mA/cm², FF=38% and overall efficiency (∈) of 0.37% was measured. Spin-coated PCBM flattened the surface (FIG. 35b). As a result, open circuit voltage increased to the same value as for the thick 60cPBT layer with the electrodeposited fullerene. Evidently, relatively low efficiency of the all electrochemically prepared solar cells is explained by the high roughness as well as poor quality of the electrodeposited fullerene layer.

Conclusion. The electrochemical approach to fabricate the polymer solar cell has been developed. PEDOT, PBT and fullerene were successfully electrodeposited one on top of another to form three-layer PEDOT/PBT/$C_{60}$ OPVd. PEDOT showed unique nanofibrillar brush-like morphology with a high surface area. BT was electrochemically polymerized on top of conductive p-doped PEDOT resulting in the rough PBT layer. Fullerene was electrodeposited at as a third layer by restoring conductivity through n-doping of the polymers.

Composition of the film as well as oxidation states of the polymers was found to be close to the traditional spin-coated samples.

The above detailed description of the preferred embodiments, examples, and the appended figures are for illustrative purposes only and are not intended to limit the scope and spirit of the invention, and its equivalents, as defined by the appended claims. One skilled in the art will recognize that many variations can be made to the invention disclosed in this specification without departing from the scope and spirit of the invention.

What is claimed is:

1. An electrochemical method for producing a nanofibrilar poly(3,4-ethylenedioxythiophene) (PEDOT) layer of nanofibers of PEDOT on an ITO electrode, comprising the steps of:
    a) cleaning an ITO electrode consecutively with chloroform, isopropanol and deionized water;
    b) preparing an aqueous solution of surfactant in 0.5 M NaNO$_3$ electrolyte;
    c) solubilizing 3,4-ethylenedioxythiophene (EDOT) in the surfactant/NaNO$_3$ solution;
    d) polymerizing the EDOT from the prepared solution on the surface of the ITO electrode by applying anodic oxidative current; and
    e) washing the deposited PEDOT layer with deionized water and drying the PEDOT layer at 60° C.,
    wherein the surfactant forms cylindrical micelles, interconnected worm-like micelles or bilayers and the polymerized PEDOT layer has a nanofibrilar morphology.

2. The method according to claim 1, wherein the surfactant is anionic, cationic, zwitterionic, or nonionic.

3. The method according to claim 1, further comprising effecting the shape and the size of the surfactant micelles and hence the morphology of the PEDOT layer by changing the ionic strength of the aqueous solution.

4. The method according to claim 1, further comprising adjusting the rate of the EDOT polymerization and hence the morphology of the PEDOT layer by changing the current density passing through the solution.

5. The method according to claim 1, further comprising adjusting the rate of the EDOT polymerization and hence the morphology of the PEDOT layer by changing the oxidative potential of the ITO electrode.

6. The method according to claim 1, further comprising effecting the size and the shape of the surfactant micelles and hence the morphology of the PEDOT layer by adjusting the concentration of the monomer.

7. The method according to claim 1, wherein the ITO electrode is a coated glass slide.

8. An electrochemical method for producing a granular poly(3,4-ethylenedioxythiophene) (PEDOT) layer on an ITO electrode, comprising the steps of:
    a) cleaning an ITO electrode consecutively with chloroform, isopropanol and deionized water;
    b) preparing an aqueous solution of surfactant in 0.5 M NaNO$_3$ electrolyte;
    c) solubilizing 3,4-ethylenedioxythiophene (EDOT) in the surfactant/NaNO$_3$ solution;
    d) polymerizing the EDOT from the prepared solution on the surface of the ITO electrode by applying anodic oxidative current; and
    e) washing the deposited PEDOT layer with deionized water and drying the PEDOT layer at 60° C.,
    wherein the surfactant forms spherical micelles and the polymerized PEDOT layer has a granular morphology.

9. The method according to claim 8, wherein the surfactant is anionic, cationic, zwitterionic, or nonionic.

10. The method according to claim 8, further comprising adjusting the rate of the EDOT polymerization and hence the morphology of the PEDOT layer by changing the current density passing through the solution.

11. The method according to claim 8, further comprising adjusting the rate of the EDOT polymerization and hence the morphology of the PEDOT layer by changing the oxidative potential of the ITO electrode.

12. The method according to claim 8, wherein the ITO electrode is a coated glass slide.

* * * * *